(12) United States Patent
Speakman

(10) Patent No.: US 8,124,325 B2
(45) Date of Patent: Feb. 28, 2012

(54) METHODS AND APPARATUS FOR THE MANUFACTURE OF MICROSTRUCTURES

(75) Inventor: Stuart Philip Speakman, Essex (GB)

(73) Assignee: 3T Technologies Limited, Chelmsford, Essex (GB)

( * ) Notice: Subject to any disclaimer, the term of this patent is extended or adjusted under 35 U.S.C. 154(b) by 749 days.

(21) Appl. No.: 11/912,282

(22) PCT Filed: Apr. 21, 2006

(86) PCT No.: PCT/GB2006/001468
§ 371 (c)(1),
(2), (4) Date: Oct. 22, 2007

(87) PCT Pub. No.: WO2006/111766
PCT Pub. Date: Oct. 26, 2006

(65) Prior Publication Data
US 2010/0193912 A1    Aug. 5, 2010

(30) Foreign Application Priority Data

Apr. 21, 2005  (GB) .................................. 0508101.3
Jun. 13, 2005  (GB) .................................. 0511976.3

(51) Int. Cl.
*G03F 7/26* (2006.01)
(52) U.S. Cl. ........................................ 430/322; 430/256
(58) Field of Classification Search .................. 430/256, 430/322, 5
See application file for complete search history.

(56) References Cited

U.S. PATENT DOCUMENTS

| | | | |
|---|---|---|---|
| 5,209,815 A | 5/1993 | Fleming et al. | |
| 5,314,709 A | 5/1994 | Doany et al. | |
| 5,554,488 A | 9/1996 | Rioux | |
| 5,554,519 A | 9/1996 | Weber et al. | |
| 7,195,938 B2 | 3/2007 | Yaniv et al. | |

(Continued)

FOREIGN PATENT DOCUMENTS

EP     0 031 463 A2    7/1981
(Continued)

OTHER PUBLICATIONS

PCT International Search Report for PCT/GB2006/001468, mailed Nov. 16, 2006, 2 pages.

(Continued)

*Primary Examiner* — Kathleen Duda
*Assistant Examiner* — Caleen Sullivan
(74) *Attorney, Agent, or Firm* — Blakely, Sokoloff, Taylor & Zafman LLP.

(57) ABSTRACT

A method of manufacturing microstructures is disclosed, the method comprising a applying a mask to substrate; forming a pattern in the mask; processing the substrate according to the pattern; and mechanically removing the mask from the substrate. A polymer mask is disclosed for manufacturing micro scale structure, the polymer mask comprising a thin, preferably ultra thin flexible film. A method of manufacturing an integrated circuit is disclosed, the method comprising forming a plurality of isolated semiconductor devices on a common substrate; and connecting some of the devices. Apparatus for manufacturing microstructures is disclosed comprising: a mechanism for coating a mass substrate to create a structure; a mechanism for removing a mask from the substrate; and processing apparatus. A thin film transistor is disclosed comprising drain source and gate electrodes, the drain and source electrode being separated by a semiconductor, and the gate electrode being separated from the semiconductor by an insulator, comprising a bandgap alignment layer disposed between a semiconductor and the insulator.

23 Claims, 36 Drawing Sheets

U.S. PATENT DOCUMENTS

| | | | |
|---|---|---|---|
| 2002/0187430 A1 | 12/2002 | Watanabe | |
| 2003/0152691 A1 | 8/2003 | Baude et al. | |
| 2005/0202578 A1 | 9/2005 | Yaniv et al. | |
| 2006/0252163 A1* | 11/2006 | Yaniv et al. | 438/20 |

FOREIGN PATENT DOCUMENTS

| | | | |
|---|---|---|---|
| EP | 0 521 045 | | 1/1993 |
| GB | 2 258 343 | | 2/1993 |
| JP | 05136550 | * | 6/1993 |
| WO | WO 91/14797 | | 10/1991 |

OTHER PUBLICATIONS

GB Search Report for G 0508101.3, completed Jun. 9, 2005, 2 pages.

U.S. Appl. No. 60/343,642 entitled, "Alignment of CNT Material," filed Oct. 19, 2001, 20 pages.

U.S. Appl. No. 60/348,856, entitled, Activation Effect on Carbon Nanotubes, filed Jan. 15, 2002, 26 pages.

U.S. Appl. No. 60/369,794, entitled, "Alignment of CNT Material," filed Apr. 4, 2002, 20 pages.

* cited by examiner

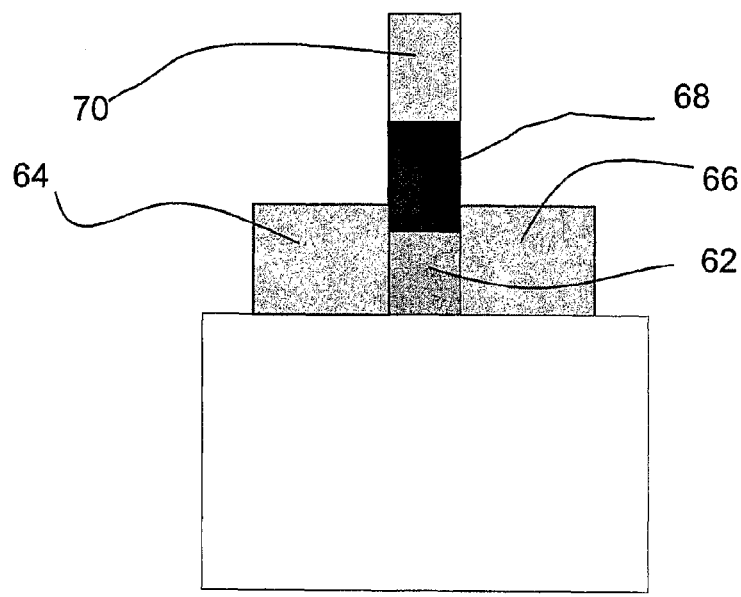
Fig. 7
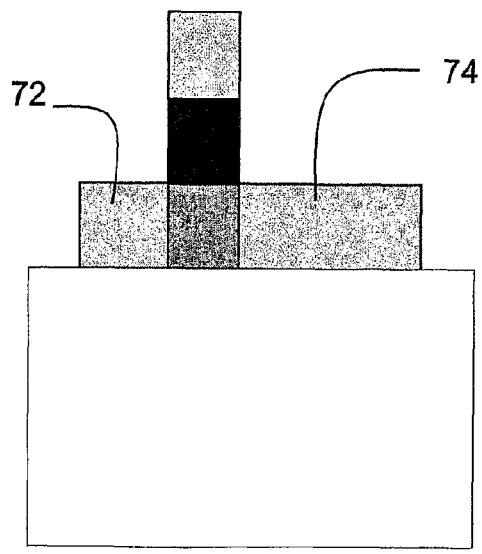 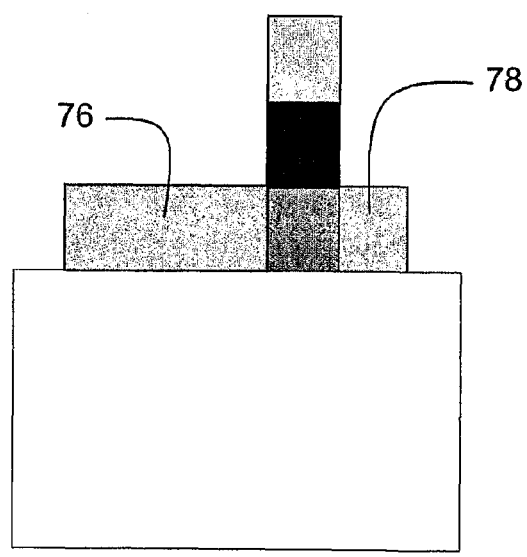
Fig. 8a          Fig. 8b

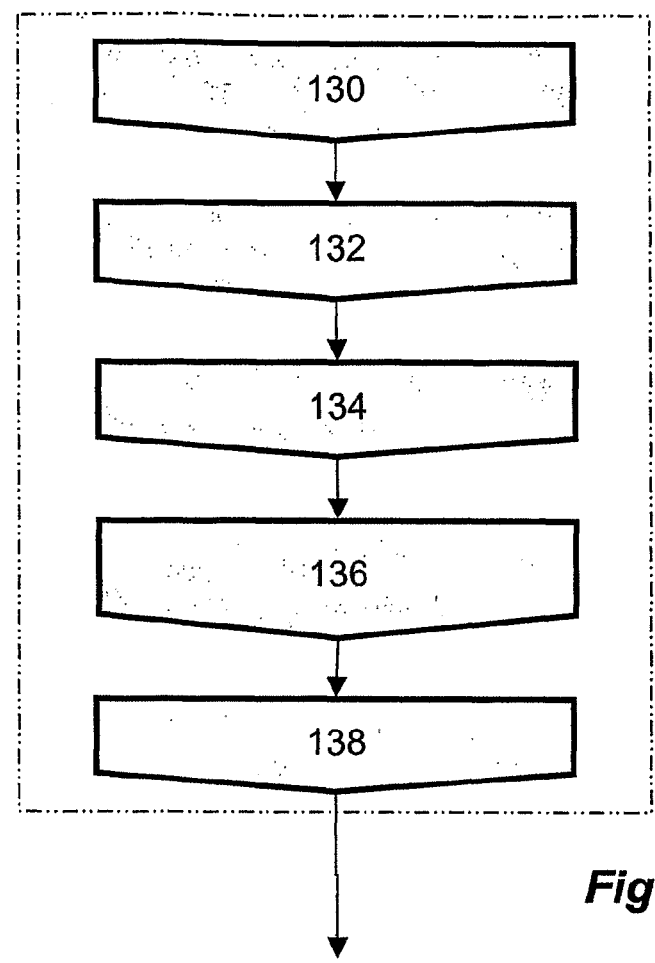
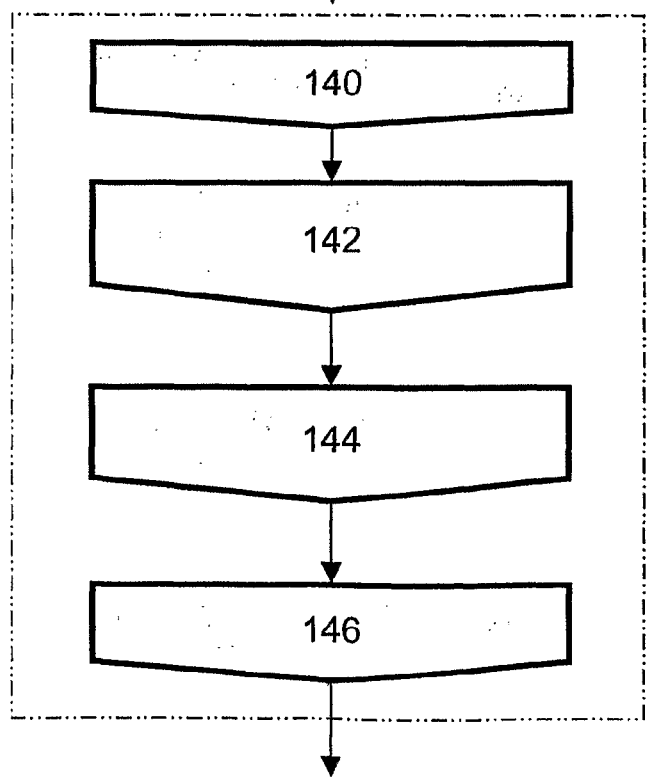
*Fig. 12*

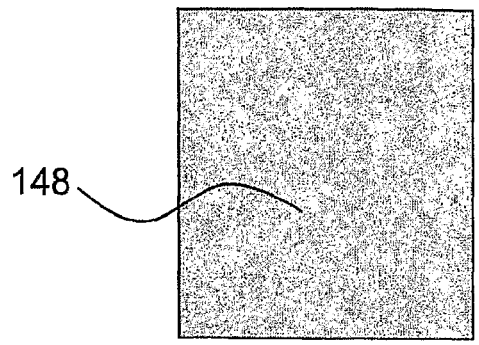
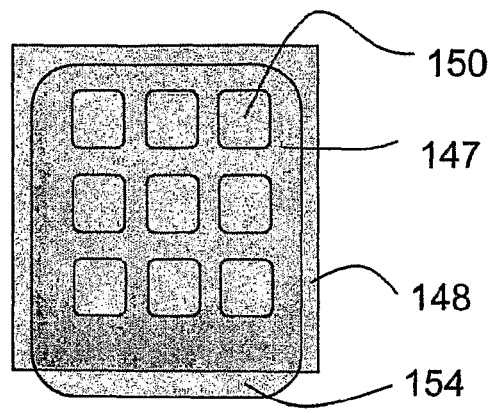
Fig. 13a    Fig. 13b
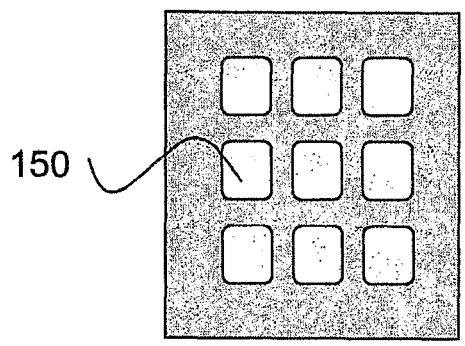
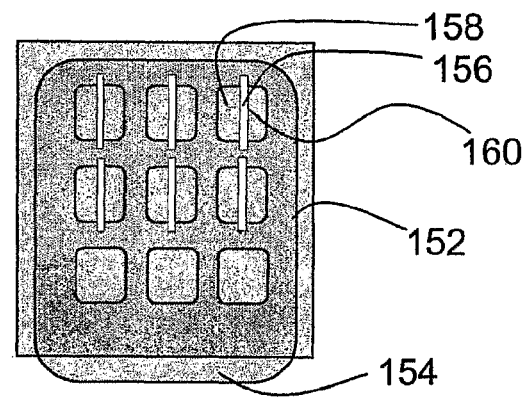
Fig. 13c    Fig. 13d
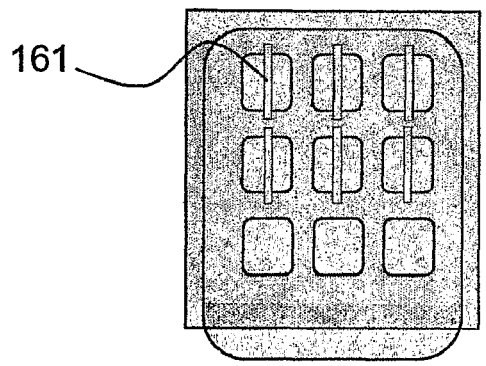
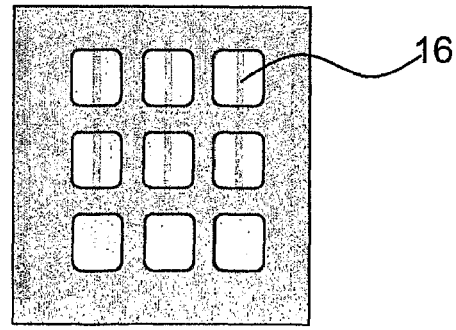
Fig. 13e    Fig. 13f

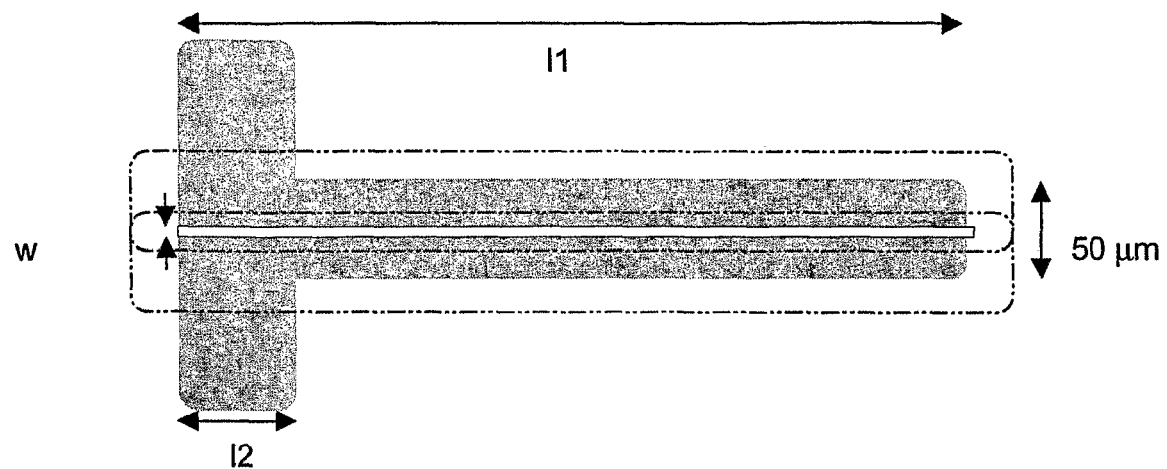
*Fig. 16a*
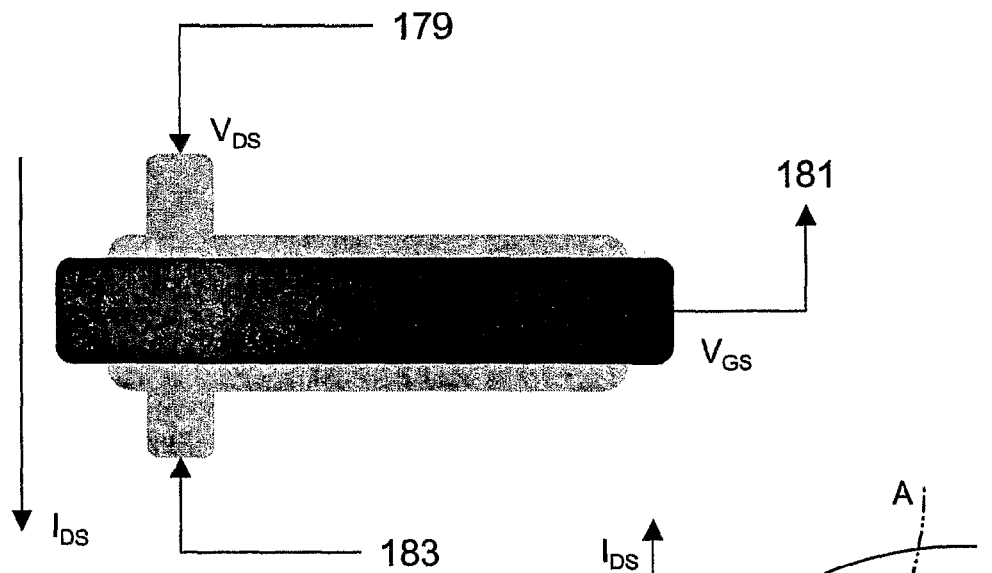
*Fig. 16b*
*Fig. 16c*

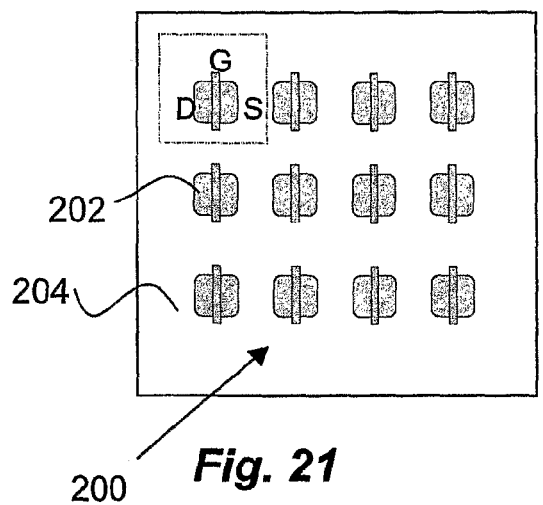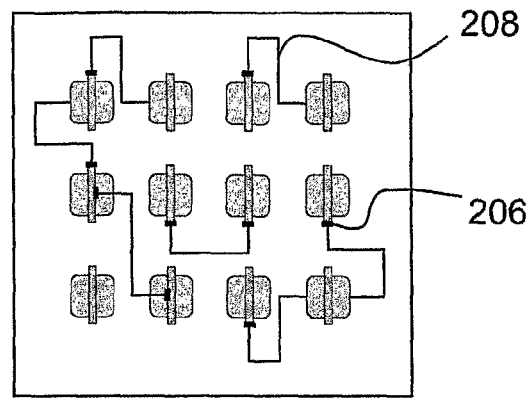
*Fig. 21*
*Fig. 22*
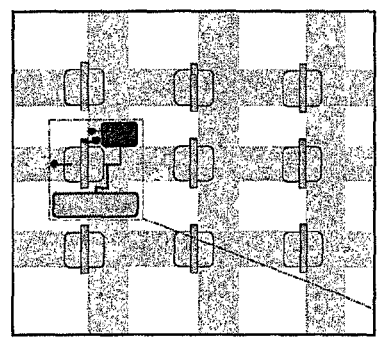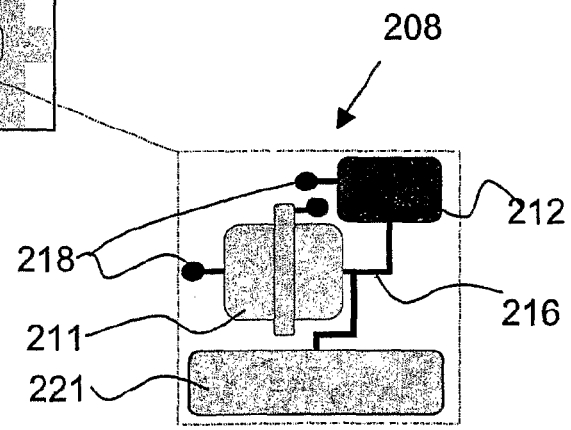
*Fig. 23a*
*Fig. 23b*

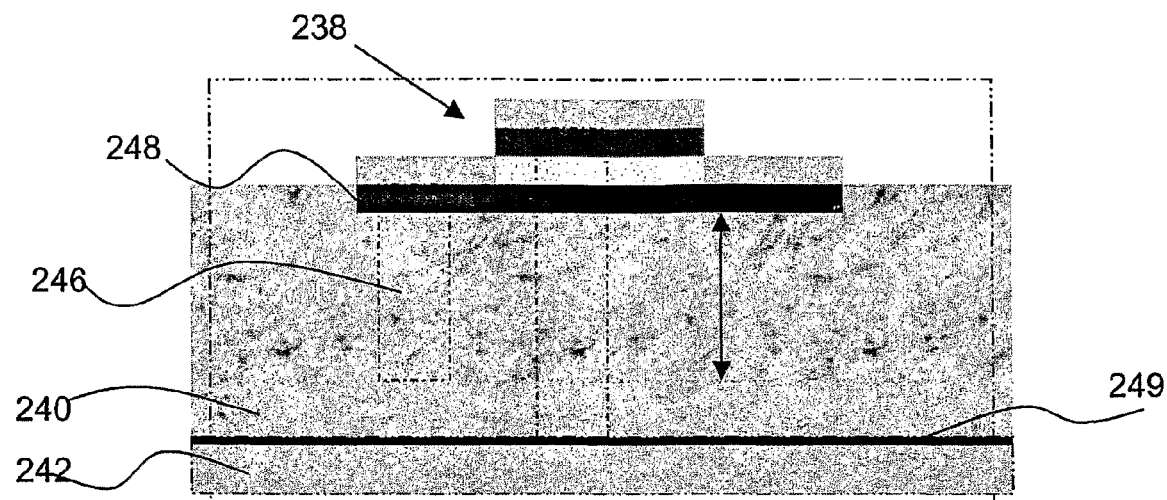
Fig. 28
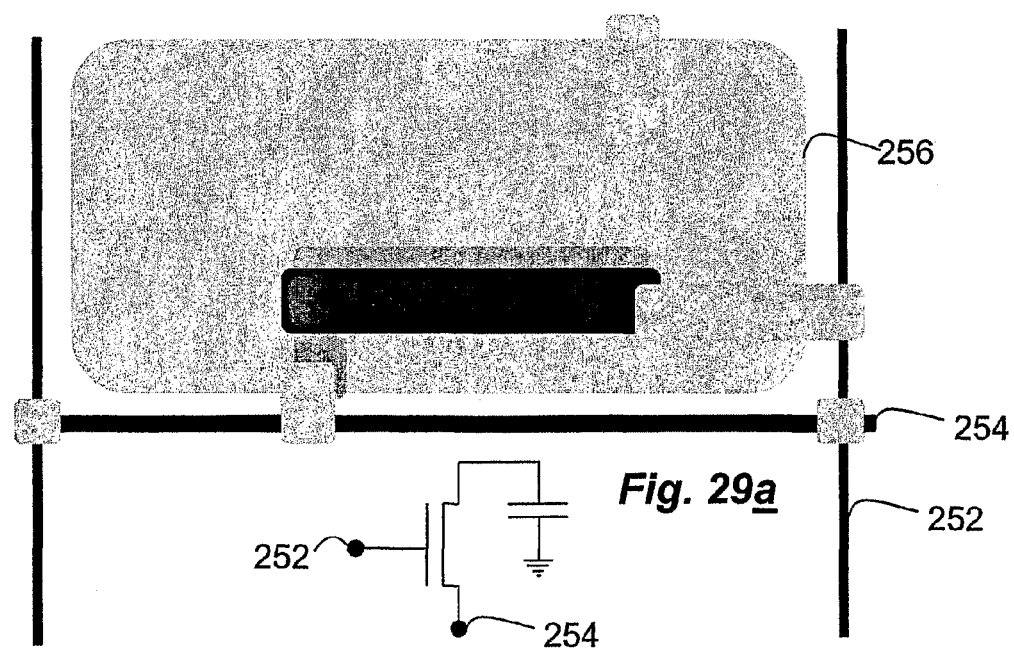
Fig. 29a
Fig. 29b

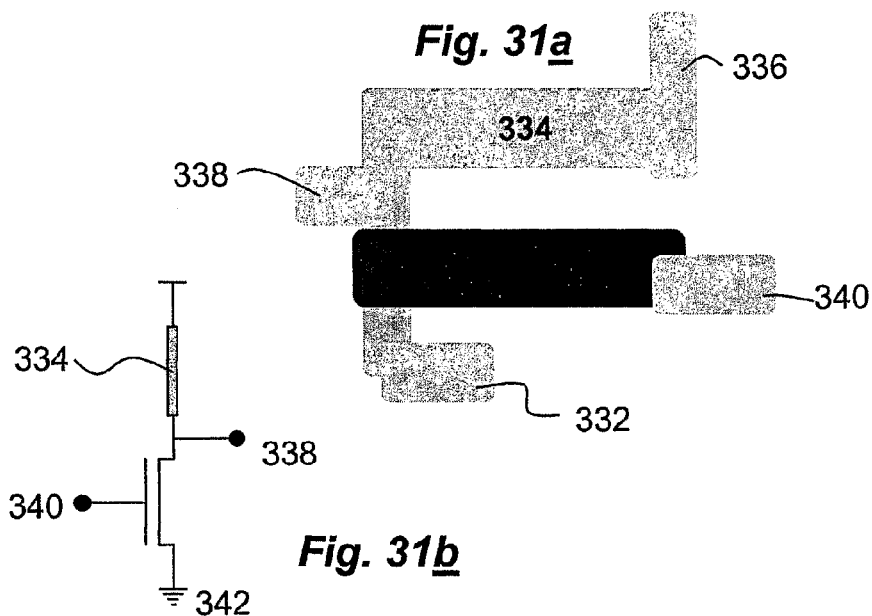
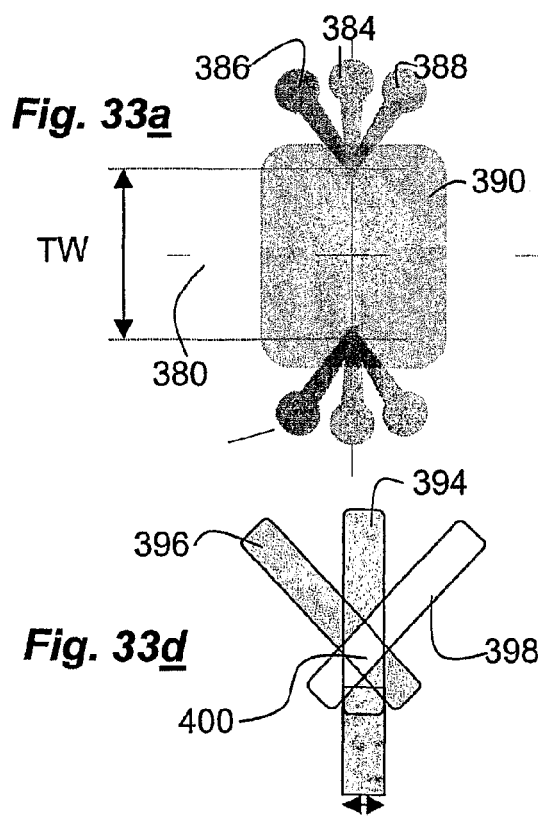
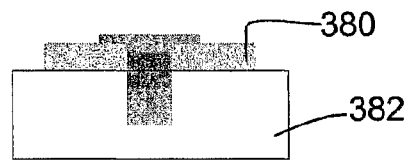
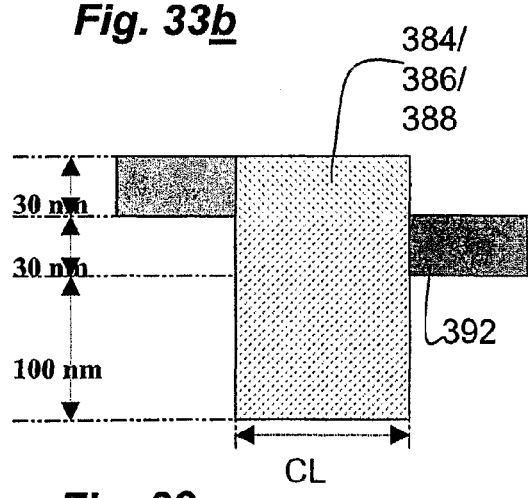

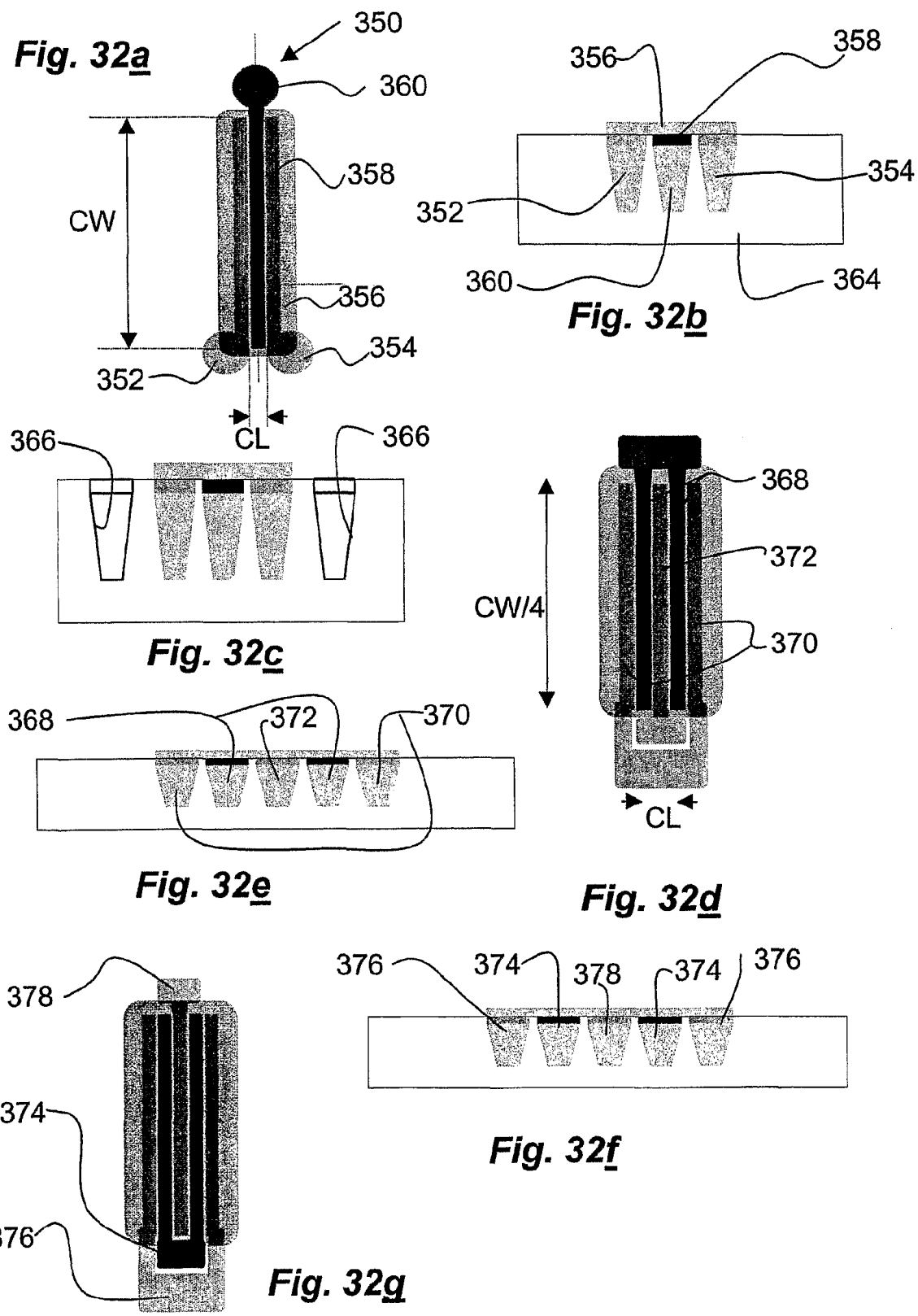

METHODS AND APPARATUS FOR THE MANUFACTURE OF MICROSTRUCTURES

CROSS-REFERENCE TO OTHER APPLICATIONS

This is a National Phase of International Application No. PCT/GB2006/001468, filed on Apr. 21, 2006, which claims priority from Great Britain Patent Application No. 0508101.3, filed on Apr. 21, 2005 and Great Britain Patent Application No. 0511976.3, filed on Jun. 13, 2005.

BACKGROUND OF THE INVENTION

This invention relates to methods and apparatus for the manufacture of microstructures. In particular, but not exclusively, this invention relates to the methods and apparatus for the manufacturer of semiconductor devices, and other microstructures, such methods involving the use of masking techniques. This invention also relates to novel microstructures, in particular, but not exclusively, novel semiconductor devices particularly those which may be manufactured by the use of masking techniques. This invention is of particular, although not exclusive, relevance to the field of thin film transistors, particularly transparent thin film transistors.

The manufacture of microstructures, particularly semiconductor devices, has transformed modern society. The highly flexible and useful products which may be made from these devices are now an integral part of modern life, and there is a continuing need to manufacture such devices more cost effectively, both to lower the cost of current products and to open up new markets.

Typically, at present, semiconductor based microstructures are manufactured by an etching process. A mask is applied to a multi-layered silicon structure, various chemical etching techniques are used to remove layers of the structure, preferentially layers which are not protected by the mask. Multiple masks may be used in the manufacture of more complex devices, with each mask being chemically removed from the silicon multilayer structure.

However, there are disadvantages with many current fabrication processes. In particular, it is difficult to manufacture low cost, relatively simple, microstructures cost effectively. This is because typical fabrication processes rely on economies of scale, with the result that it is more cost effective to manufacture devices with a degree of redundancy but that are suitable for many applications, than application-specific devices, which have, inherently, smaller markets. The need for economies of scale also means that it is difficult to mix and match manufacturing processes cost-effectively.

There is a need to introduce flexibility into the manufacturing process of such microstructure.

Present methods are particularly disadvantageous when it comes to the manufacture of flexible micro-structures, or the manufacture of micro-structures on a flexible substrate, such as in the manufacture of flexible displays. The films which make up the multi-layer structure may break or become degraded (with respect to operational lifetime and performance and storage life) if over-flexed.

SUMMARY OF THE INVENTION

According to a first aspect of this invention, there is provided a method of manufacturing microstructures comprising: applying a mask to a substrate; forming a pattern in the mask; processing the substrate according to the pattern; and mechanically removing the mask from the substrate.

The method may comprise applying a further mask or masks to the substrate. In particular, the method may comprise any or all of the following steps forming a pattern in the further mask or masks; processing the substrate according to the pattern; or mechanically removing the further mask or masks. The masking film may be mechanically removed from another masking film or from a substrate surface. Alternatively or additionally the masking film may be a multiple masking film stack that may be mechanically removed directly from the substrate surface as a complete stack.

Preferably at least one of the masks is removed from the substrate by peeling. Alternatively, or additionally, at least one of the masks may be removed by applying a force along a plane substantially parallel to the surface of the substrate. Alternatively or additionally, the method may comprise removing portions of at least one of the masks successively from the substrate. Preferably the method comprises starting removal at one side of the substrate, proceeding in a direction generally parallel to a surface of the substrate, and finishing at a far side of the substrate.

Preferably at least one of the masks comprises a thin flexible film. The substrate comprises a thin flexible film.

The method may comprise laminating at least one of the masks to the substrate. At least one of the masks may be in solid form before lamination. Alternatively or additionally, at least one of the masks may be in liquid or vapour form before lamination. Lamination is herein defined as to cover or overlay with a thin sheet of material. It is irrespective how the sheet of material is applied.

The method may comprise unwinding the substrate from a roll. The method may comprise unwinding at least one of the masks from a roll. The method may comprise winding the processed substrate onto a roll.

The pattern formed in the mask may be such that the mask remains essentially continuously connected after its formation. Preferably the pattern comprises an array.

Preferably the pattern is formed in the mask by a direct write process such as laser etching, conveniently dry laser etching the pattern into the mask. The laser wavelength is preferably between infra-red and deep ultra-violet. The laser may be one of an Excimer, a diode pumped YAG, a diode pumped solid state Nd:YVO4 or a Ti:sapphire laser.

The method may comprise removing debris from the pattern formation process. Preferably the debris is removed using suction for example by a; vacuum or using electrostatic attraction means for example suitably placed collection electrodes of a specific electrical potential and charge sign. Alternatively or additionally the debris may be removed by use of a second laser beam having different properties to the etching laser.

Preferably the method comprises etching the substrate. Such a method means that embedded features may be formed in the substrate, which may be automatically aligned with features formed on the substrate through use of a mask. This method also provides conformal mapping of the feature generated in the masking film so as to provide a substantially faithful reproduction of this feature directly into the substrate material.

The substrate may be etched as the pattern is formed in at least one of the masks.

Processing the substrate may comprise depositing material on the substrate or on a feature on the substrate or into a feature in the substrate to form a feature or a further feature. The method may comprise etching the feature.

Preferably the method comprises reducing curling or free edge lifting or buckling in the etched feature. The curling may be reduced through any or all of the following steps: capping the feature, depositing the feature on a thermally conductive film, selecting a feature having a molecular structure appropriate to the substrate material, depositing the feature on a series of vertically stacked ultra-thin films or termed quantum well stack. The thickness of each layer may be engineered to obtain specific electronic and photonic properties on an atomic scale; for example using high precision bandgap engineering.

Alternatively a multilayer stack could be used with differing resultant properties where the layer thickness is more wide ranging.

At least one of the masks may have a thickness of between 0.1 to 200 μm, conveniently 0.5 to 25 μm, preferably less than or substantially equal to 10 μm.

A profile may be etched into at least one of the masks as the pattern is formed. Preferably the profile is etched into a cross-sectional wall of the mask. Preferably the profile comprises an undercut. Concave, convex, vertical, inverse or re-entrant features may be formed. Preferably the profile so-produced is such that the profile is substantially screened from material added to or into the substrate during processing. Alternatively or additionally, the profile may be screened by other means.

At least one of the masks may comprise a plurality of layers. One such layer may be reflective, preferably a layer between an adhesive layer and the masking film. This means that the adhesive layer is etched by the reflected laser light making peel-off easier Preferably the method comprises applying a reflective layer to the substrate. Such a mask may be applied to the substrate such that the reflective layer is the closest layer of the mask to the substrate and/or on the opposite side of the substrate to the mask. The method may comprise controlling a profile of the mask using the reflective layer, preferably through controlling the angle of reflection. The mask may have a predetermined layer thickness. Preferably the layers are bonded by adhesive. This aspect of the invention is to be able to etch the rear surface of the masking film from a reflective surface that is on the other surface of the transparent (to a substantial portion of the laser wavelength) substrate material. In this instance the masking film or film stack may be applied to the upper (top) surface of the substrate material and a second masking film may be applied to the lower (bottom) surface of the substrate material forming a sandwich structure. The lower surface mask may be so manufactured as to provide on, or in, the surface of the masking film closest to the bottom surface of the substrate a surface feature that causes an incoming parallel beam of laser light to be reflected at a controlled angle substantially in the direction of the incoming laser light (focussed beam). This reflected light may be of sufficient energy density so as to travel back along through the substrate material at the angle defined by the reflecting surface structure where it interacts with the surface preferably the lower surface of the surface in contact with the substrate of the upper masking structure so as to cause a volume of the masking film to be disrupted preferably by bond scission and preferably to be expelled under a pressure gradient into the space created by the initial laser etching of a feature into the upper masking structure. This may create a controlled geometry undercut that would ease peelable removal of the masking film structure preferably even with substantially conformal coating deposits.

At least one of the masks may be made of a polymer, for example a polyethylene terathalate, a polypropylene, a polyethylene napthalate, a polyethersulphone, or a polyimide.

The substrate may be made of a glass, a plastic material, paper, or a metal foil.

The method may comprise treating or coating an outer surface of at least one of the masks with a substance or a treatment such as neutral argon plasma irradiation or physical conditioning or chemical conditioning such as conversion, termed nitriding, in nitrogen plasma to alter the wettability of the mask. Alternatively or additionally, the method may comprise treating or coating the inner surface of the at least one of the masks with a substance to alter the adhesive bond energy between the mask and the substrate. This may be achieved as a result of etching the mask in a controlled chemical ambient or as a separate process after the mask pattern has been formed.

Preferably such a method is used for the manufacture of semiconductor devices, conveniently thin film transistors, preferably transparent thin film transistors. Such a method may be used for the manufacture of transparent, translucent, or opaque microstructures.

The processing step may comprise coating the mask and the substrate with a material. Conveniently the method comprises coating the mask and the substrate by a process comprising one of closed-field magnetron sputtering, closed field unbalanced magnetron sputter ion plating, laser ablation, ion beam sputtering, ion beam assisted deposition, vacuum arc, multiple arc, electron beam evaporation, ion assisted electron beam evaporation, atomic layer epitaxy, molecular beam epitaxy, chemical vapour deposition, electron cyclotron resonance chemical vapour deposition, plasma enhanced chemical vapour deposition or laser dry transfer printing, pulsed magnetron sputtering, pulsed sputtering, pulsed biased sputtering, pulsed biased magnetron sputtering, laser-assisted chemical vapour deposition, electrostatic spray deposition, or electrostatic spray assisted vapour deposition.

Conveniently the method may be carried out at a processing temperature of less than 100 degrees C. The processing temperature may be very wide ranging since one of the primary benefits of the invention is the ability to mix and/or match processes with substrate and masking film media for the manufacture of transparent, translucent, or opaque microstructures. By way of example the substrate and the masking film could both be transparent but yellow coloured polyimide that is thermally stable and would permit the use of processes that require thin film deposition temperature up to about 540° C. Conversely, a temperature-sensitive bio-degradable masking film could be used on a polyester substrate with an organic vapour deposition process, such as polymerisation at room temperature, so that the residual by-product of masking film and organic deposit would be a bio-degradable waste processed at room temperature.

The method may comprise depositing a plurality of vertically aligned layers of different material. The multiple layer alignment is preferably within the resolution of the laser or other etching process. For laser etching the resolution is generally a fraction of the wavelength of the light used, although the nature of the processing system whether flatbed or roll-to-roll, or another will have an impact on the values that can be achieved in practice.

Conveniently the method comprises a method of manufacturing transistors in which the semiconductor-substrate and semiconductor-gate insulator interfaces are produced in a single processing step.

The method may comprise forming a reservoir for fluid in the mask.

According to a second aspect of this invention there is provided a method of manufacturing microstructures comprising: applying a mask to a substrate to form a deposition area; forming a pattern in the mask; forming a reservoir for fluid in the deposition area; depositing material on the deposition area to form a microstructure; and removing the mask.

The method may comprise forming two or more reservoirs for fluid in the mask.

The volume of the reservoir may be of the order of 5 to 15 picoliters, conveniently of the order of 7 to 13 picoliters, preferably of the order of 9 to 11 picoliters, in a preferred embodiment substantially 10 picoliters.

The method may comprise forming a reservoir for fluid in the substrate.

The volume of the reservoir may be of the order of 14 to 34 picoliters, conveniently of the order of 19 to 29 picoliters, preferably of the order of 23 to 25 picoliters, in a preferred embodiment substantially 24 picoliters.

The method may comprise forming an access window in a portion of the mask above the substrate.

The method may comprise depositing a fluid in at least one of the reservoirs.

The method may comprise depositing a second fluid in at least one of the reservoirs.

The method may comprise the fluid is or fluids are deposited by ink jet printing.

The method may comprise depositing fluid onto the substrate from at least one of the reservoirs.

The method may comprise forming an interconnecting duct between a reservoir and desired deposition site.

The method may comprise controlling the height of the reservoir.

According to a third aspect of this invention, there is provided a polymer mask for manufacturing a microscale structure comprising a thin, preferably ultra-thin, flexible film.

Preferably the polymer mask has sufficient tensile strength and tear resistance to be removable from a substrate by peeling. The polymer mask may have a tensile strength of 100 to 300 MPa, conveniently 150 to 250 MPa, preferably substantially 200 MPa. The polymer mask may have a tear resistance of >5 g per µm as a continuous film. In use, the tear resistance may be affected by any of a function of the masking film thickness used, the masking film material type, the size and distribution of the pattern features, the shape of the pattern features, the applied peel-off force used for the masking film—substrate scheme employed, and the nature of the deposition process to be used to coat the etched features (including coating coverage distribution, material type, coating thickness, and number of layers in a multilayer stack).

The aforementioned tensile strengths (as well as the other characteristics of the polymer mask, without limitation) apply to any appropriate aspect of the invention, including the methods described herein.

The polymer mask may have a thickness of 0.1 to 200 µm, conveniently 0.5 to 25 µm, preferably 1-10 µm.

The polymer mask may be made of a material such as a polyethylene tetrathalate, a polypropylene, a polyethylene napthalate or a polyimide. It is also possible for the masking film to be a polymer treated paper or an inorganic coating treated polymer film.

The polymer mask may have a surface of a pre-determined particular wettability which is different from that of the bulk of the material. Alternatively, or additionally, the polymer mask may have a surface of a pre-determined particular attachability which is different from that of the bulk of the material. Such a surface may be achieved using a surface chemical treatment, an ultra thin film organic or inorganic deposit, or as a result of the manner in which the masking film was produced for example thinning roller surface induced masking film surface. One or both surfaces or both surfaces may be altered independently during film manufacture including mechanical or physical changes.

The polymer mask may have a high chemical stability. An FEP (Fluorinated Ethene Propene) or PTFE (Polytetrafluorethene) based polymer masking system preferably either in ultra thin sheet form or produced using a liquid source that when dried provides an ultra thin sheet of such a chemically resistant material.

One of the layers may comprise an adhesive. The adhesive may be temporary semi-permanent which in this context means that the mask is peelable without restriction on time. Preferably it is not the time that the masking film is in contact with the substrate media but the adhesive strength. The adhesive strength preferably dictates the ease with which the masking film can be removed from the substrate after processing. This semi-permanent state may be maintained as a function of time and of subsequent processing events including etching and single or multiple layer deposition The mask may comprise an array of holes, the film being essentially continuously connected between the holes.

All of the previous features described also apply to the array of isolated semiconductors aspect of the invention, as well, of course, as to any other aspect of the invention.

According to a fourth aspect of this invention, there is provided an array of isolated semiconductor devices formed on a common substrate. Preferably the devices are functionally equivalent.

The devices may be transistors, conveniently thin film transistors, preferably transparent thin film transistors or diodes or resistors or capacitors or inductors.

The array, including the devices formed thereon, may be transparent. The array may be regular, by which is meant that the array comprises a plurality of rows and columns which are substantially equally spaced apart. The array may be three-dimensional. The array may comprise a flexible substrate.

According to a fifth aspect of this invention, there is provided an integrated circuit comprising an array as described above in which selected devices are interconnected. The interconnections may be essentially electrical in nature or alternatively or additionally may comprise optical or thermal interconnects.

Preferably the interconnections are laid down by a direct write method such as printing, preferably digital ink-jet or laser dry transfer printing.

A substantial proportion of the devices may be redundant. Substantially 20%, conveniently substantially 40%, preferably substantially 60% or even substantially 80% may be redundant. For example an application may comprise a universal switching backplane comprising a number of transistors and capacitors for each display pixel (universal cell circuit), preferably comprising 6 transistors and 2 capacitors. For a liquid crystal display (LCD) only one transistor and one capacitor are preferably used with the remaining devices being redundant for this display type. Using the same universal cell circuit but for an OLED display preferably 5 transistors and 1 capacitor are used with the remaining devices being redundant for this display type. By redundant it is meant that the devices perform no useful function in the interconnected integrated circuit.

According to a sixth aspect of this invention, there is provided a display comprising an integrated circuit as described above.

Such a display may comprise an array of addressable pixels, each pixel comprising such an integrated circuit and an electrode. The electrode may comprise a flexible portion. Each pixel may be individually addressable.

According to a seventh aspect of this invention, there is provided a method of manufacturing an integrated circuit comprising: forming a plurality of isolated semiconductor devices on a common substrate; and connecting some of the devices.

The method may comprise connecting the devices by a direct write technique. The method may comprise connecting the devices using one of ink jet printing, offset lithographic printing, soft lithography contact stamp printing, laser dry forward transfer printing, robocast printing, nib writing, or laser focussed beam conversion. For laser focused beam conversion the mask may have chemistry such that the laser converted material remains in place when the peelable sheet is removed.

The method may comprise direct writing of electrical insulator or isolation structures adjacent to the location of, and prior to the direct writing of the electrical interconnects. This to ensures that devices are not electrically short circuited.

According to an eighth aspect of this invention there is provided apparatus for manufacturing microstructures comprising: a laminator for laminating a substrate with a masking film; and a roller for winding the laminated structure onto a roll.

Preferably the apparatus is adapted to be used for the manufacture of semiconductor devices.

According to a ninth aspect of this invention there is provided apparatus for manufacturing microstructures comprising: a mechanism for unwinding at least one of a substrate film or a masking film from a roll; and a laminator for laminating the substrate film with the masking film.

The apparatus may comprise a mechanism for unwinding both the substrate film and the masking film from respective rolls. The apparatus may be adapted to be used for the manufacture of semiconductor devices.

According to a tenth aspect of this invention there is provided apparatus for manufacturing microstructures comprising: a mechanism for coating a masked substrate to create a structure; a mechanism for removing a mask from the substrate; and a mechanism for winding the coated substrate onto an output roll.

The apparatus may comprise a mechanism for unwinding the substrate from an input roll. Preferably the mask removing mechanism is operable to peel the mask from the substrate. Preferably the peeling mechanism provides for a controlled pull-off force and peeling angle. This helps to ensure that the masking film does not rip or tear.

According to an eleventh aspect of this invention there is provided apparatus adapted to be used for a method as described above, the apparatus comprising: a mechanism for applying a mask to a substrate; a mechanism for forming a pattern in the mask; a mechanism for processing the substrate according to the pattern; and a mechanism for mechanically removing the mask from the substrate.

Any of the features described above in relation to the first to ninth aspects of the invention may be preferred features of the tenth aspect of the invention.

According to a twelfth aspect of the invention, there is provided a thin film transistor comprising drain, source and gate electrodes, the drain and source electrodes being separated by a semiconductor, and the gate electrode being separated from the semiconductor by an insulator, comprising a bandgap alignment layer disposed between the semiconductor and the insulator.

Preferably the bandgap alignment layer is adjacent to the semiconductor and to the insulator. Preferably the product of the dielectric constant and the [average?] thickness of the bandgap alignment layer is of the order of 10, conveniently 50, preferably 100 times lower in value than the product of the dielectric constant and the thickness of the insulator. Both layers in the dielectric stack may have similar thickness variations that are likely to be a small element of either product used in the ratio.

The bandgap alignment layer may be an ultra thin film of the order of 10 nm, conveniently 5 nm, and preferably 3 nm or less.

Conveniently the insulator is a wide bandgap, and/or high dielectric constant material, such as Strontium Titanate $SrTiO_3$ preferably a Perovskite (general formula $A^{2+}B^{4+}O_3$) Hafnium oxide ($HfO_2$), Lanthanum sesquioxide, ($La_2O_3$), Zirconium oxide, ($ZrO_2$) are other examples of suitable materials. Preferably the insulator is transparent.

Preferably the insulator has a dielectric constant that is greater than, preferably twice or more, the dielectric constant of silicon dioxide. Such an insulator is generally known as a "high k" (or high dielectric constant) insulator.

Preferably the bandgap alignment layer has a dielectric constant that is similar to, or less than, that of silicon dioxide. Such a layer is generally known as a "low k" layer. Preferably the bandgap alignment layer has a bandgap energy larger than the transistor, and/or the materials it is trying to align with the gate insulator. Conveniently the bandgap energy is larger by at least substantially 1 eV above the conduction band and/or substantially 1 eV below the valence of the semiconductor The transistor may comprise a growth layer adjacent the semiconductor. The growth layer is conveniently between the semiconductor and the substrate. The growth layer may be made of the same material as the bandgap alignment layer.

Suitable materials include wide bandgap dielectric materials such as the insulator silicon dioxide (conveniently $SiO_2$ that has a bandgap of 9 eV) or aluminium oxide (conveniently $Al_2O_3$ that has a bandgap of 8.8 eV)

The transistor may comprise an adhesive layer between a substrate and the semiconductor. The transistor may comprise a barrier layer between a substrate and the semiconductor. The adhesive layer may also be the barrier layer and may serve as an inorganic material growth surface onto which the transistor is built-up.

The transistor may be transparent.

According to a thirteenth aspect of this invention there is provided a semiconductor thin film switch comprising a layer of insulator sandwiched between two layers of metal. Preferably the switch is transparent.

This aspect of the invention provides a non-linear resistance device for use with high capacitance pixels. The thin film multi-layer structure is relatively simple, and it may be manufactured cost-effectively. Having a transparent switch means that the whole aperture of a pixel may be used. The switch is conveniently a metal-insulator-metal (MIM) switch. Preferably the switch operates as a two-terminal capacitor or pin diode. Such a device is particularly suitable for applications that require no grey scale display processing.

According to a fourteenth aspect of this invention, there is provided a thin film transistor comprising gate source and drain electrodes, disposed in generally parallel trenches in a substrate. The transistor may comprise a single source (or drain) electrode having two adjacent gate electrodes. Two drain (or source electrodes) may be disposed adjacent the gate electrodes.

By means of this invention, an independently modifiable semiconductor contacting method is provided. With conventional thin film transistor technology, such as that termed amorphous silicon, a degenerately doped $n^+$ amorphous silicon layer is interposed between the semiconducting film and the drain-source contacts in order to improve charge injection and removal characteristics—providing better ohmic contacts. Preferably independently accessible trenches or elongated containment wells are provided that means degenerate material can be deposited separately in each well. This removes the need to pattern such a layer as would be the case in the amorphous silicon device and provides for subtle adjustment of the contact interfacing material to improve the barrier height properties for each contact (source and drain) separately so as to optimise charge transfer behaviour.

The trenches may be laser etched, stamped, or embossed. The drain electrode(s) may be offset for high variable voltage output. The transistor may be source-gated for lower voltage higher gain operation.

According to a fifteenth aspect of this invention there is provided a thin film transistor comprising a stack comprising a gate electrode, a gate insulator and a semiconductor, the stack being disposed in a trench in a substrate. Preferably the gate electrode is laid down first, the gate insulator being the middle layer, and the semiconductor being laid down last. This is known as a "bottom gate" or inverse staggered design. The semiconductor layer may be wider than the other two layers. A drain electrode and source electrode may be disposed on the substrate, conveniently adjacent and/or below the semiconductor layer.

Preferably the transistor comprises a liquid supply reservoir, conveniently a single reservoir. The reservoir may be laser etched, stamped, or embossed. The reservoir may be processed in-situ, conveniently to minimise processing error. A profile, conveniently a cross-sectional profile of the reservoir may be shaped to control layer thickness and/or to cater for drop placement or volume errors. The reservoir may be fabricated in the peelable masking film. This provides a means of using conventional ink jet printhead technology with its inherent limitations in drop volume and drop placement accuracy (due to nozzle straightness and ejection cone angle errors) to provide a source of material that can be used in the building of a device. The geometry of the reservoir may take into account droplet damping and Tsunami wave splashing and spill-over to retain the ink in the reservoir. Preferably the entrance to central device trench has a lip edge height that controls the amount of reservoir liquid that can be fed into the trench. Such control may use a difference in the reservoir liquid height relative to a height of the lip edge that permits the liquid to enter the trench. Alternative versions of this reservoir include providing surface tension restrictor features that terminate the flow of liquid about a surface contact line and trench fill flow surface gradient on the basis of opposing surface tension forces for example one such feature may be in the reservoir pulling the liquid back and/or one such feature may be in the trench pulling liquid in.

Alternatively, independent reservoirs may be provided for the semiconductor, insulator and gate layers. The semiconductor, insulator and gate electrode layers may be auto-aligned. This provides a very flexible device design and manufacturing approach with minimisation of contact overlap, and thus parasitic capacitance and leakage current.

In a further preferred embodiment the semiconductor may be laid down first followed by the insulator and then the gate electrode. This is known as a "top gate" or staggered configuration design. Independent supply reservoirs may be provided for the semiconductor, insulator and gate electrode layers. Such reservoirs may be defined by laser etching directly into a masking film, preferably a peel-off masking film. This design provides a very flexible device design and manufacturing approach, is tolerant of large mask window positional error, and provides minimisation of contact overlap, and thus parasitic capacitance and leakage current. It thereby is of assistance in increasing the performance of a liquid crystal display pixel.

Further aspects of the invention include its applicability to the production of many other types of microstructures for example microelectronic; opto-electronic and photonic devices and circuits.

This invention provides an auto-aligned gate manufacturing process. This invention permits the manufacture of high performance devices based on a highly flexible production strategy that permits a wide selection of wet and dry processes to be mixed and/or matched. Such cost and performance selective manufacturing uses simple position-tolerant feature patterning.

The selectable interconnect array integrated circuit provides for high resolution patterns using a high tolerance pattern alignment process.

This invention provides a concept for a universal device platform that can be used for a variety of applications, allowing for the inclusion of a set of components such as resistors, capacitors, transistors, diodes and contact pads. These may be defined as a "unit repeat cell" which may be repeat patterned onto selected substrate media to form a "universal device platform array". This invention may thereby provide a set of components that can be so interconnected to provide many different applications and built-in component redundancy in each unit repeat cell.

The manufacturing process provides self-aligning structures and fault tolerant processing, and the production of high precision devices from low precision processing. It is particularly suited for energy efficient logic processing surfaces.

This manufacturing process enables the use of a wide range of liquid, vapour, and solid particle processes to provide a very wide range of materials that permits the construction of all-inorganic, all-organic or hybridised inorganic-organic devices even mixing liquid, vapour and solid particle processes in one manufacturing sequence.

The manufacturing process enables "Cassette-to-Cassette Manufacturing" of semiconductor devices, using a cassette transport system for a roll of substrate material such that the cassette is inserted into a lamination machine. The cassette may then be processed further in subsequent manufacturing steps.

Any of the methods or apparatus or masking films outlined above may be of use in the manufacture of any of the devices outlined above. Preferred features described above in relation to any aspect of the invention may be combined with a different aspect of the invention, or provided independently.

The invention extends to methods and/or apparatus substantially as herein described with reference to the accompanying drawings.

Any feature in one aspect of the invention may be applied to other aspects of the invention, in any appropriate combination. In particular, method aspects may be applied to apparatus aspects, and vice versa.

BRIEF DESCRIPTION OF THE DRAWINGS

FIG. 1 shows schematically a number of stages in an embodiment of a process using a peelable mask;

FIG. 2 shows schematically a number of stages in an embodiment of a process using a peelable mask;

FIG. 3 shows schematically a number of perspective views of a structure formed by the process shown in FIG. 2;

FIG. 4 shows schematically a number of stages in an embodiment of a process using a peelable mask;

FIG. 5 shows schematically a number of perspective views of transistors;

FIG. 6 shows schematically a further embodiment of a process using a peelable mask;

FIG. 7 shows schematically a structure formed from a similar process as that shown by FIG. 6, having slightly different scaling;

FIGS. 8a and 8b show two further different embodiments of transistors made by the process shown in FIG. 6, illustrating flexibility of positioning;

FIG. 12 shows schematically a flow diagram of an embodiment of a method of manufacture;

FIG. 13 shows schematically a number of cross-sections of stages in a fabrication process using a peelable mask:

FIG. 13a shows schematically a substrate for the process;

FIG. 13b shows schematically a structure after a sputtering stage;

FIG. 13c shows schematically the structure after a peelable mask has been applied;

FIG. 13d shows schematically the structure having undergone laser etching;

FIG. 13e shows schematically the structure after a deposition step; and

FIG. 13f shows schematically the structure after peeling off the mask;

FIG. 14 shows schematically a number of top views and corresponding cross-sections in a fabrication process using a peelable mask:

FIG. 15 shows schematically top views of different structures:

FIG. 16a shows schematically a view of FIG. 14c with indication of alignment tolerances;

FIG. 16b shows schematically relevant voltages and currents in a transistor; and FIG. 16c shows schematically a graph of these;

FIG. 21 shows schematically an embodiment of an array of semiconductor devices;

FIG. 22 shows schematically an embodiment of an integrated circuit comprising the array of FIG. 21;

FIG. 23 shows schematically views of a further example of an integrated circuit comprising the array of FIG. 16, and making up a display;

FIG. 23a shows schematically an overview of the array; and

FIG. 23b shows schematically a single pixel;

FIG. 28 shows schematically a cross-section through a further transistor which comprises a single pixel element of a display;

FIG. 29 shows schematically views of a further structure which includes a pixel element of a display:

FIG. 29a shows schematically a top view; and

FIG. 29b shows schematically an electrical diagram;

FIG. 30 shows schematically views of a structure during the process of manufacturing a display;

FIG. 31 shows schematically views of a further structure in a further application:

FIG. 31a shows schematically a top view; and

FIG. 31b shows schematically an electrical diagram;

FIG. 32 shows views of an embodiment of co-planar in-line structures produced by a fabrication process:

FIG. 32a shows schematically a top view of a structure during the process;

FIG. 32b shows schematically a cross section through FIG. 32a;

FIG. 32c shows schematically a cross-section of a further structure, having optional reticulation trenches;

FIG. 32d shows schematically a top view of dual gate-drain transistor;

FIG. 32e shows schematically a cross section of the dual gate-drain structure;

FIG. 32f shows schematically a cross section of a dual gate-drain transistor having an alternate design; and FIG. 32g shows a top view of the dual gate-drain transistor having the alternate design.

FIG. 45 shows schematically different types of trench profile that may be produced by a laser beam:

FIG. 50 shows schematically views of a further structure having two removeable reservoirs:

FIG. 52 shows schematically views of a structure:

FIG. 52b shows schematically a cross-section through FIG. 52a;

DETAILED DESCRIPTION OF THE INVENTION

An Embodiment of a Fabrication Process

FIG. 1 shows schematically a number of stages in an embodiment of a process using a peelable mask. A peelable mask 10 which is a thin polymer film, for example a polyethylene terathalate, a polypropylene, a polyethylene napthalate, a polyethersulphone, or a polyimide, is laminated to a substrate 12, for example a glass material or a plastic material. The material may be rigid or conformable. The peelable mask 10 is laminated, or sprayed onto the substrate 12 and held thereon by electrostatic attraction and weak mechanical interlocking. Such a masking film can have a wide ranging selectable cross-sectional thickness in the range 0.1 to 200 μm, in this embodiment around 10 μm, that is preferably applied dry in sheet form for roll-to-roll or roll-to-substrate coverage applications. Some of the dry film polymers, such as 0.9 micron thick PET can be obtained in 4 meter wide rolls thereby providing for very large area array processing.

Alternatively the film 10 could be applied in dip cast, spray, ink jet printed, or liquid shower cast or doctor blade forms.

Figure 1A:
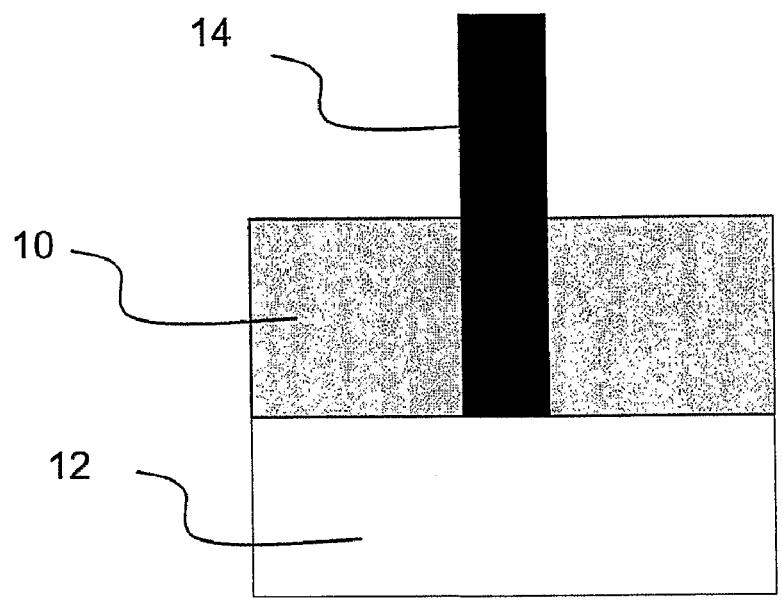
FIG. 1a shows schematically a pattern being formed in the mask by a laser beam.
Figure 1B:
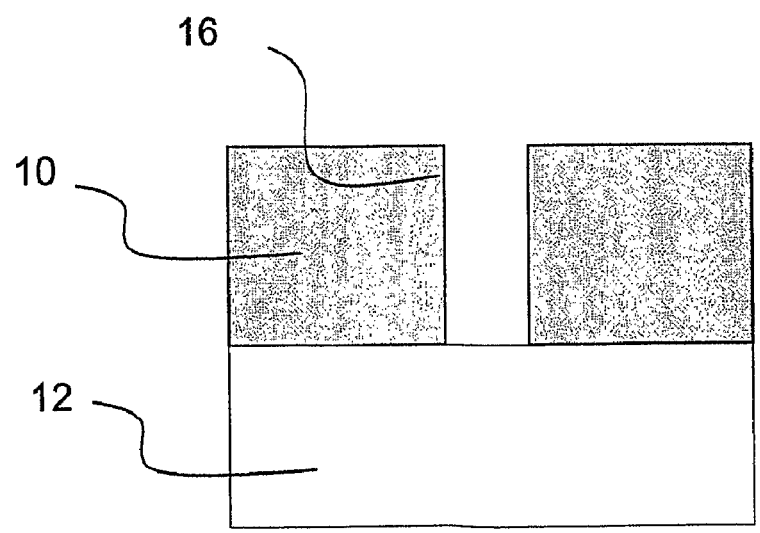
FIG. 1b shows schematically a trench so formed.

A laser beam 14 is used to dry etch the mask 10 using a direct write technique. The laser beam 14 forms a pattern in the mask 10 comprising a plurality of trenches 16, one of which is shown in FIG. 1b. In order to make peeling the mask off easier, the pattern is formed such that a continuous connection between portions of the mask remains after the pattern has been formed therein. For example the pattern may be an array of squares in cross-section.

Since each device is separate and there is a finite space between adjacent devices the masking film remains essentially continuously connected, as in a shaver foil that has an array of holes produced in it. This means that no islands of masking material are created that would be left behind when the peelable mask was removed.

The pattern thus transferred into the masking film defines a series of isolated devices. Isolation, in this context, means that each patterned device is not electrically connected to any other device. Additionally, the devices are physically isolated, comprising islands of material on, or in, the substrate.

The pattern may include interdigitated portions, such as comb fingers, if desired. Care must be exercised in selecting the masking film properties in order to ensure that isolate ribbons of masking film, such as would be produced in patterning a "comb-like" electrode, are not torn off the masking film and left on the substrate surface during the masking sheet peel-off process.

Figure 1C:
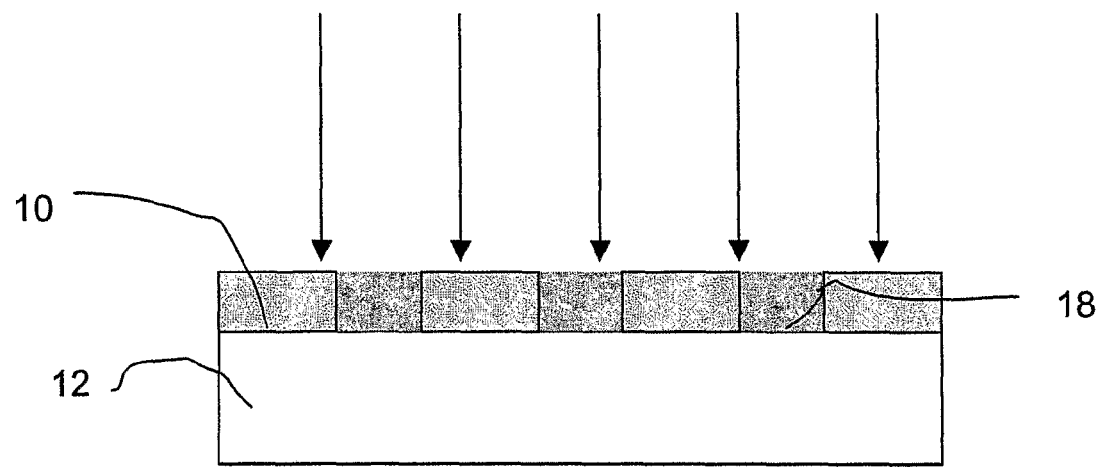
FIG. 1c shows schematically a plurality of trenches having material deposited therein.
Figure 1D:
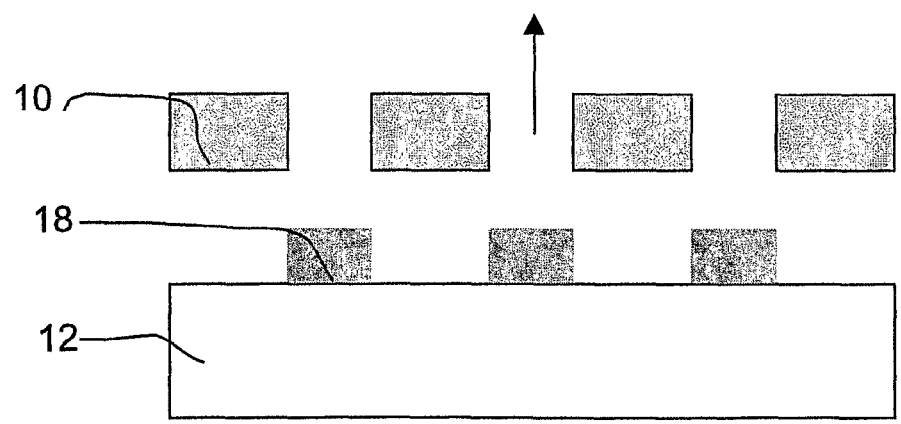
FIG. 1d shows schematically removing the mask.

Material, for example semi-conductor material or insulator material, or protective material is then deposited in the trenches, as shown in FIG. 1c. A wide variety of deposition techniques can be used. The mask is then peeled away to leave the substrate 12 having a layer of material 18 deposited thereon, as shown in FIG. 1d.

This production approach, using specific modification in surface and bulk properties as required, can be used for producing, for example, a thin film transistor based on, for example: organic materials (for example pentacene organic field-effect transistors O-FET), inorganic materials (for example amorphous silicon thin film transistors) or inorganic-organic hybrid materials (for example, an O-FET using an inorganic gate insulator).

This processing method is suitable for transparent materials, translucent materials, opaque materials, and combinations thereof in dry and liquid deposition source forms.

Therefore, the peelable mask manufacturing method can be used to produce thin film transistors based on, but not limited to: amorphous silicon, plastic polythiophene, organic pentacene, diamond-like carbon or zinc oxide and alternate inorganic oxide systems such as indium, gallium, magnesium, phosphorous, and nitrogen doped zinc-oxide, copper indium oxide ($CuInO_2$).

Moreover, the peelable mask manufacturing method is also applicable to the production of many types of microstructures, for example microelectronic, opto-electronic, and photonic devices and circuits. Some examples are polymeric or inorganic oxide optical waveguides, transparent conductive oxide heater elements, and lenticular and graded index lens arrays.

The Masking Film

Preferred features of the proposed masking film include: a simple masking film; bubble-free application and tear-free removal; masking film process compatibility with rigid and flexible media; a masking film process compatible with individual substrate, batch, and roll-to-roll manufacturing; masking film compatibility with liquid, vapour, and solid particle-based deposition media; high resolution feature generation in the masking film via selectable wavelength laser direct write etching; clean removal and controlled disposal of unwanted thin film deposits; and auto-aligned vertically stacked coatings deposited within the laser etched windows and substrate sub-surface wells and trenches.

Although a temporary or semi-permanent adhesive bonding material could be used to attach the masking film to the substrate with an appropriately chosen ultra thin polymer sheet such as polyethylene terephalate or polypropylene, the material and thickness of the masking film preferably is chosen so as to adhere to the substrate surface using electrostatic potential (Van der Weals forces) only. Moreover, having an ultra thin film, which in this embodiment means preferably less than or equal to 10 µm and most preferably less than or equal to 1 µm, means that the masking film will readily take-up the contours of any surface structures such as previously deposited thin film coatings and layers comprising complete or incomplete devices.

As well as the process parameters which define the film, it preferably has the following mechanical properties: possesses high mechanical strength; is tear resistant in ultra thin and thin film form; is easily laser etched with no etching residue left behind (Clean etch process); has high chemical stability (primarily for use with liquid deposition processes such as ink-jet printing and spraying); the pattern to be etched preferably forms an array of discrete features that are not connected, so that no part of the mask forms an isolated island of masking material that is left behind during the peel-off process; the outer surface is adapted to be so treated as to provide a highly wetting or highly non-wetting or intermediate wettability behaviour to a wide range of liquids and vapours; and the inner surface can be so treated as to provide a variation in adhesive bond energy from purely electrostatic (Van der Weals) to permanent chemical interacted bonding to cater for attachment to a range of substrate types including where the masking film forms an integral and permanent part of the device being manufactured.

The peelable mask has a tensile strength of substantially 200 MPa, films having a tensile strength of from between 100 to 300 MPa are also suitable. The actual tear strength of the peelable mask depends on a number of factors, including the mask film thickness used, the mask film material type, the size and distribution of the pattern features, the shape of the pattern features, the applied peel-off force used for the masking film-substrate scheme employed, and the nature of the deposition processes to be used to coat the etched features (including coating coverage distribution, material type, coating thickness and number of layers in a multiplayer stack).

The construction of the process bearing in mind all of these features can be manipulated to provide suitable value for the tear strength of the film.

Due to the penetrating nature of the laser beams used to etch the masking film and substrate media and the methods and optics used to shape the laser beam there are certain desirable properties of material type and mask thickness that can be used in combination with laser etching for a particularly cost-effective process.

In this regard such properties and associated ranges include a masking film thickness range of 0.1 to 10 microns. In a preferred embodiment, sheet processed polyetheylene tetrathalate (PET) is used having a thickness in the region of 0.4 to 0.6 microns. Other ultra thin film plastic sheet materials may be used having similar or greater cross-sectional thickness.

From a process efficiency point-of-view it is advantageous for the masking film to be as thin as is practically possible. For example, a YAG laser, having operating parameters as outlined above, will remove about a 0.25 micron depth of PET masking film for each laser pulse. The same laser would remove around 0.1 microns of indium tin oxide (ITO) film in a single pulse (depending on a number of factors, such as wavelength absorption behaviour of the ITO film), which is of use in dual peelable mask processes, such as those shown in FIGS. 2 to 4 and described below.

In a preferred embodiment, the material used for the mask film 10 is wavelength matched to the wavelength of the laser light to be used to etch the masking material. For certain types of material and laser combinations the efficiency of etching is increased if the optical properties of the material to be etched are matched to the wavelength of the laser so as to enhance the amount of energy that is absorbed by the material for each laser etch pulse If a liquid, rather than a sheet masking deposition method is used, preferred methods to coat the substrate 12 with the mask 10 include digital ink jet printing, spray, doctor blade, electrostatic liquid jet, spray, or vapour coating, thermally reflowed solid particles, plasma vapour, plasma polymerised, electron beam or thermally evaporated, sputtered, etc.

The use of direct deposition methods, as outlined above, such as digital drop-on-demand ink jet printing means that the design of the dispensed liquid masking film source can be such as to provide a better intimate coating to the substrate, irrespective of whether the surface has 3-dimensional features pre-deposited on, or etched in it, so as to give a better coating coverage but using a material that only provides a low energy interfacial bond strength so that the film can be readily peeled-off after use.

If desired, however, a large number of treatments are available to alter the physical properties of the masking film. For example, various nanoscale additives (including inorganic nanoparticles) and material blend, modification or mixture can affect the chemistry of the film. These changes affect the material properties such that the film may be hazy or optically clear, or have a particular tear resistance, or handleability. Handleability in this context means the ability to be able to mechanically apply and remove the ultra thin film without introducing creasing or buckling, or adhesion to itself. Subtle or major changes can be introduced to the masking film and flexible substrate media by such methods to optimise the physical properties of the peelable mask.

For example, adhesion promoters (such as polyvinyl alcohol, ethylene vinyl acetate co-polymer, and hexamethyldisilizane may be included with the polymer chemical source mix.

The nature of the peelable surface bond can make use of a large group of adhesives based on many polymers (acrylics, rubbers, polyurethanes), together with plasticisers and tackifying resins to form a permanently tacky (sticky) adhesive. Such adhesive layers can be deposited from solvents, water emulsions or hot melts as the active ingredient in pressure-sensitive tape adhesives where moderate pressure alone is sufficient to spread the viscous adhesive layer on to the surface and achieve useful adhesive strength. They do not solidify or chemically cure but even so are often able to withstand adverse environments. Such adhesive bonding layers can be applied to a variety of substrate (base) media such as cellulose, polyester or PVC. Generally, most pressure-sensitive tapes give high tack but fairly low strength. Some versions develop higher strength upon ageing but newer, higher strength products can be used in more rigorous applications.

The surface of the masking film may be treated so as to affect surface adhesion behaviour using treatments that induce surface effects/modifications in chemical bonding, surface charge state, and surface morphology at a scale of order 20 nm and above as produced by processing methods such as plasma or electric discharge exposure.

The use of direct deposition methods, such as those described above, can be an alternative to introducing polymer sheet film contact interface surface treatments in order to enhance masking film-to-substrate media adhesion.

The Laser Etching Process

There are numerous solid-state and gas-based laser systems that can be used to produce, or assist in the production, of patterning features in the mask. It is desirable if they possess photon energy wavelength in the range several microns (IR) through the visible to <190 nm (deep UV). Such laser systems include: Excimer [in the range 308 nm to 157 nm]; Diode-pumped YAG [2,128 nm to 266 nm (Quadrupled)]; and electronically tuneable Ti: sapphire (189 nm to 1,064 nm—femtosecond pulse).

The pattern shown in FIG. 1 can be produced by a laser having the following specifications:

Diode pumped solid-state Nd:YVO$_4$;

Repetition rate 100 kHz;

Wavelength 355 nm;

Pulse width in range 10 to 30 ns;

Average power 2 W; and

Writing speed $\leq$2 m second$^{-1}$.

An alternative, equally suitable laser, would be an excimer laser having the following properties:

| Pulse repetition frequency | 250 to 1,000 Hz |
|---|---|
| Pulse width | 10 to 30 ns |
| Operating wavelength | 248 nm |
| Multimode, $M^2$ | >100 |
| Energy density | >10 J cm$^{-2}$ |
| Feature resolution | 2 µm (minimum limit) |

An alternative, equally suitable laser, would be Diode-Pumped Solid-State YAG laser having the following properties:

| Output power | 400 Watts (measured at 10 kHz pulse repetition rate) |
|---|---|
| Pulse repetition frequency | 6 to 50 kHz |
| Pulse width | 20 to 200 ns |
| Operating wavelength | 1,064 nm |
| Multimode, $M^2$ | 20 to 70 |
| Energy density | >100 J cm$^{-2}$ |
| Feature resolution | 3 to 5 µm (minimum limit) |

The feature size produced by the laser patterning depends upon the specific application requirements. Feature size has a close relation to the performance of the materials used in the device build, they together enable a desired device performance being sought. By use of a peelable mask manufacturing process, materials that are difficult to etch using conventional processes can be used, making high performance devices possible at a wide variety of feature sizes. To produce laser etched feature sizes in the range 0.1 to 100 microns generally requires different laser systems to achieve features in the range 0.1 µm to 1 µm, 1 µm to 5 µm, and 5 µm to 100 µm. Such different systems may be used to form patterns on the same peelable mask layer to enhance flexibility and lower costs.

The simple, one mask process described above can be used to produce a working transistor. From the structure shown in FIG. 1d, a single direct write laser etch is used that delineates the drain and source contacts. The associated gate length contact spacing is also delineated during this etch from a continuous area of transparent thin film conductor that covers the whole surface of the substrate 10. The single mask system makes use of a dual laser process in the following manner. A plastic sheet flexible or rigid substrate that has deposited on to it a series of parallel stripes of a transparent conductive oxide, such as Indium Tin Oxide (ITO), is presented to the direct write laser process without any masking film at this stage. The first laser process is applied to this stripe patterned substrate so as to convert the stripes into an array of square lands of ITO. The substrate with square lands of ITO is now covered with an ultra thin masking film and then presented to the next laser station for the second laser etch. This etch dissects the ITO land to form the thin film transistor drain and source contacts. The masked and laser etched substrate is now taken to the deposition station where the semiconductor, gate insulator, and gate contact are deposited in a single process after which the masking film is peeled away to cleanly remove the excess thin film deposit leaving an unconnected array of thin film transistors.

An Embodiment of a Two-Mask Technique

Figure 2A:
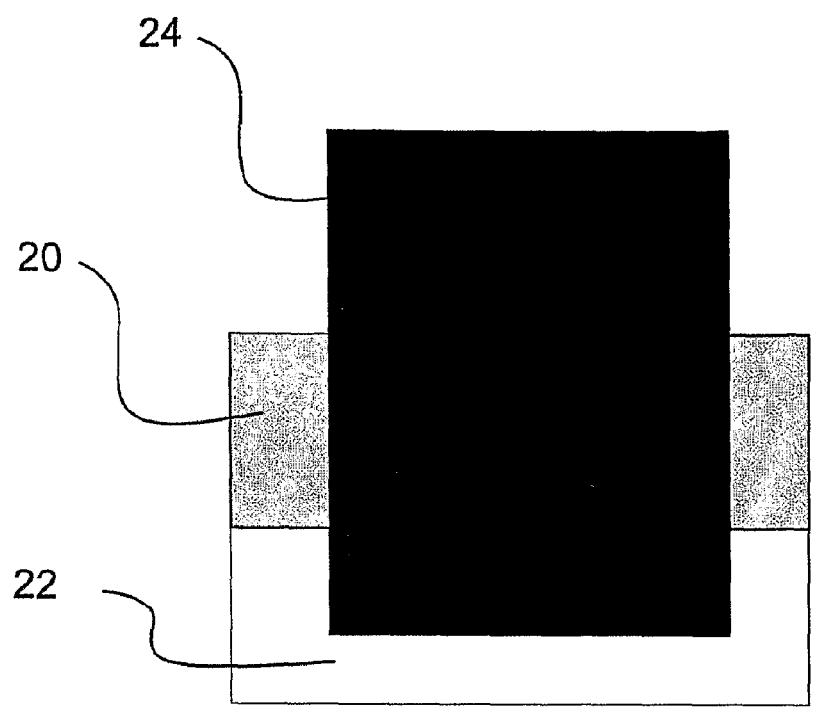
FIG. 2a shows schematically a process of forming a trench in a mask and a substrate using a laser beam.
Figure 2B:
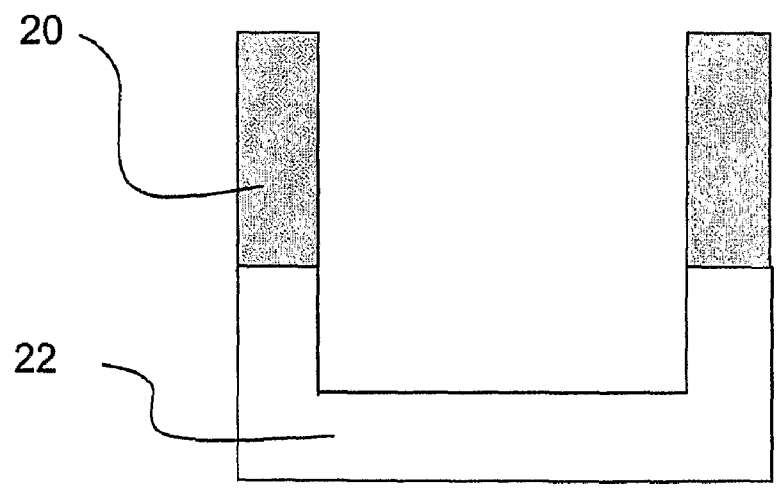
FIG. 2b shows schematically a trench so formed.
Figure 2C:
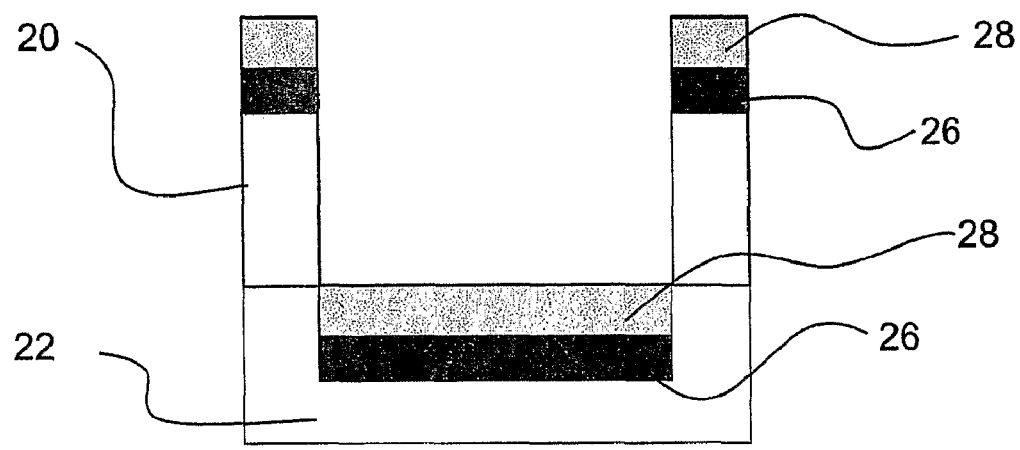
FIG. 2c shows schematically material deposited on the substrate.
Figure 2D:
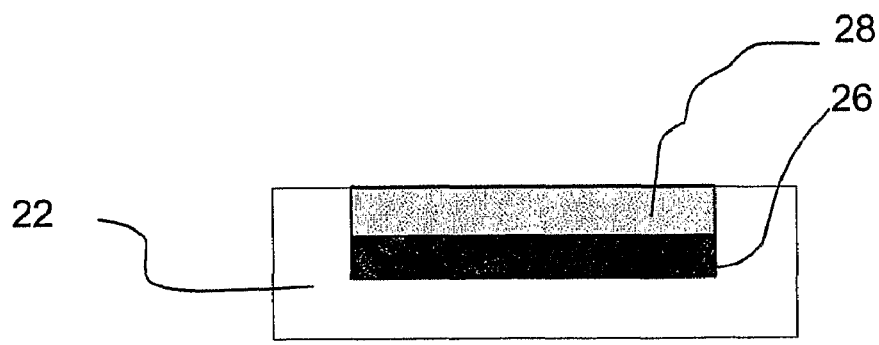
FIG. 2d shows schematically the substrate with the mask removed.
Figure 3A:
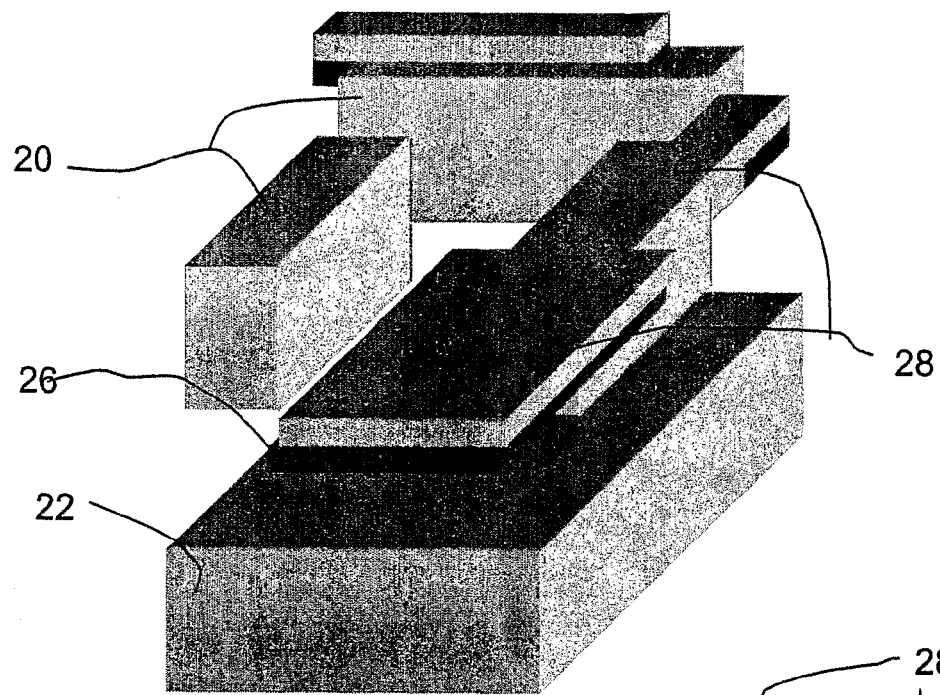
FIG. 3a shows schematically a first structure.
Figure 3C:
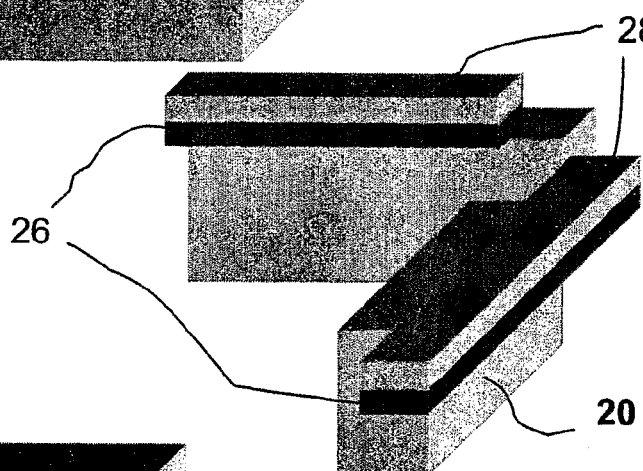
FIG. 3c shows schematically removed waste material.
Figure 3B:
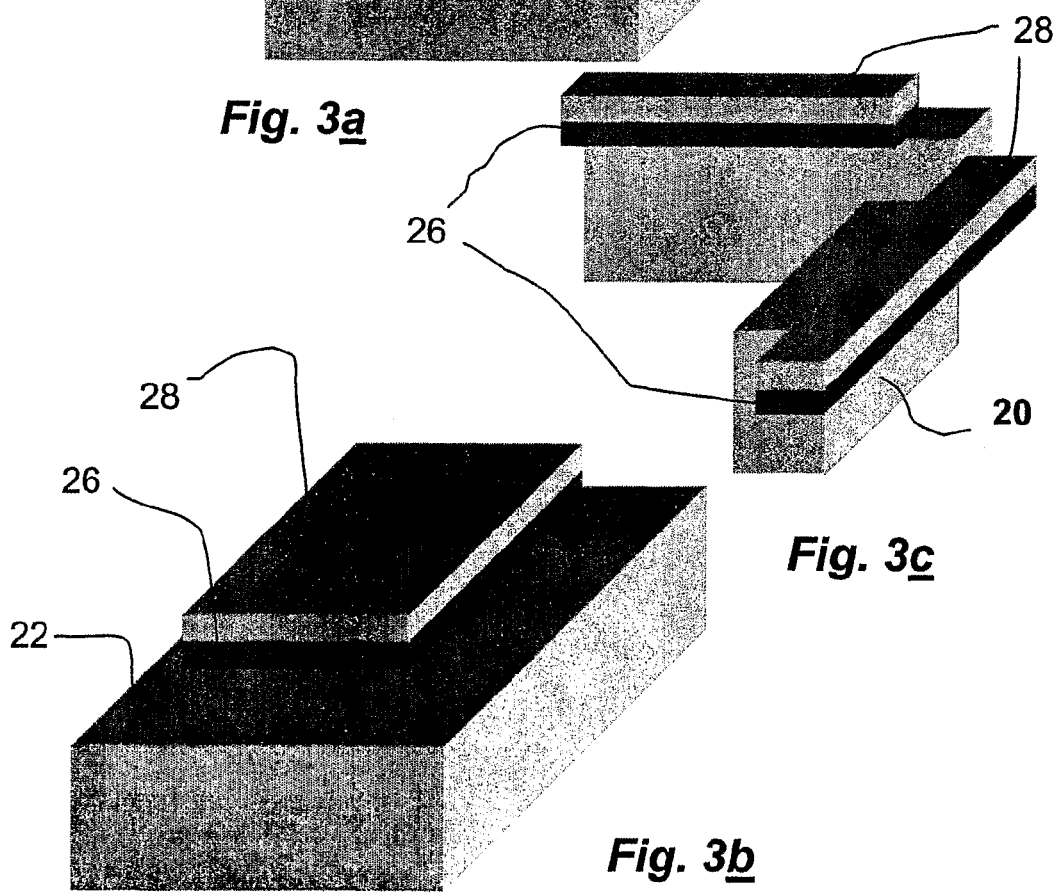
FIG. 3b shows schematically a second structure, having had waste material removed.

The technique can be made more powerful, however, and more complex devices constructed, if two or more masks are used. FIGS. 2 to 4 show examples of structures formed at various stages in such processes, which use two peelable masks.

A first peelable mask 20 is laid down on a substrate 22 in a first manufacturing stage. A focussed laser beam 24 is used to dry etch through the mask 20 and also cut into the substrate 22 to form a trench therein, as shown in FIG. 2b. Two layers of material are then sputtered on to the substrate 22 and the mask 20, using, for example a closed-field unbalanced magnetron sputter ion plating (CFUMSIP) process. An environmental barrier layer 26, made of silicon dioxide, aluminium oxide, parylene (organic film)-silicon oxide multilayer, or inorganic transparent multilayers is deposited adjacent to the substrate 24, and a transparent contact layer 28 is deposited atop the environmental barrier layer.

The first peelable masking film is then removed, as outlined above. As shown in FIG. 2d, the transparent contact layer is aligned with the top of the trench 16 in the substrate, when the mask is removed.

A perspective view of structures formed during the course of this process is shown in FIG. 3.

Figure 4A:
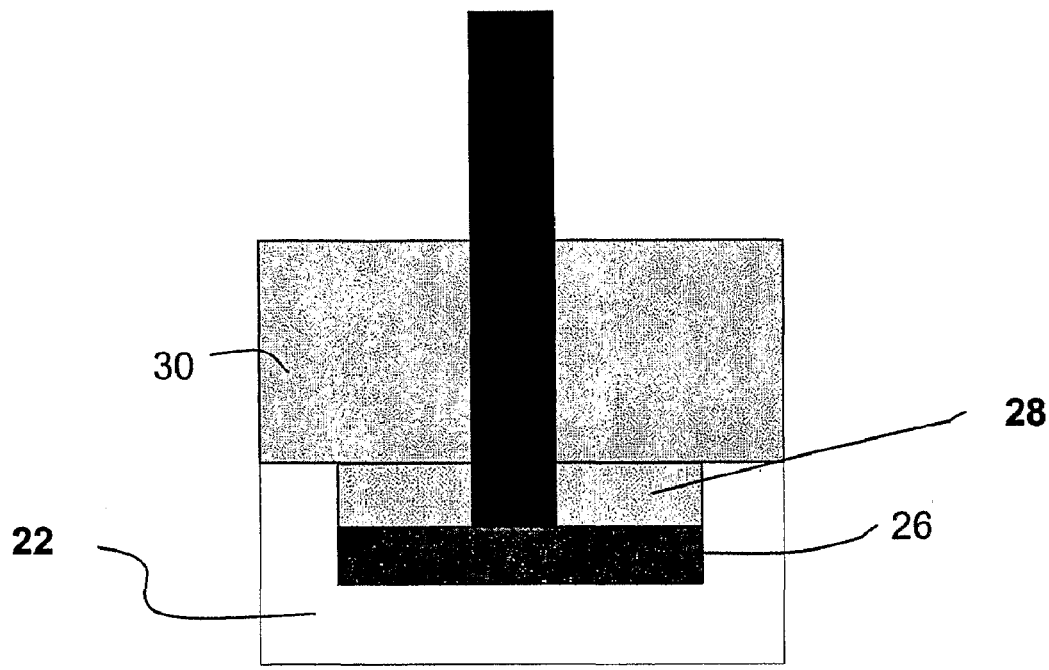
FIG. 4a shows schematically etching of the mask and material.

A second peelable mask 30 is then laid down on the structure, as shown in FIG. 4a. The thinness of this layer gives it the ability to conform to the structure, even if perfect alignment of the deposited layers has not occurred. The mask is aligned to the first mask patterned features using fiduciary marks formed around the substrate media edges. The fiducial marks can be introduced during substrate manufacture or as part of the feature etching process along the periphery of the substrate or along one or both edges of a roll of material.

Figure 4B:
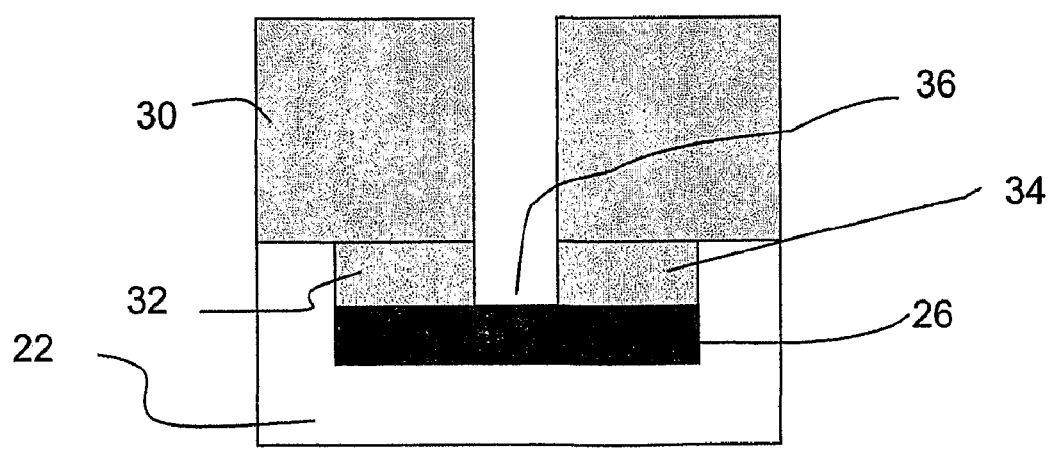
FIG. 4b shows schematically a trench formed in the mask and material.

A further laser dry etching stage now takes place, a pattern being formed in the peelable mask. In addition, the transparent contact layer 28 is bisected to form drain 32 and source 34 electrodes having a gap (to become a transistor gate region conduction channel) 36 between them, as shown in FIG. 4b.

Figure 4C:
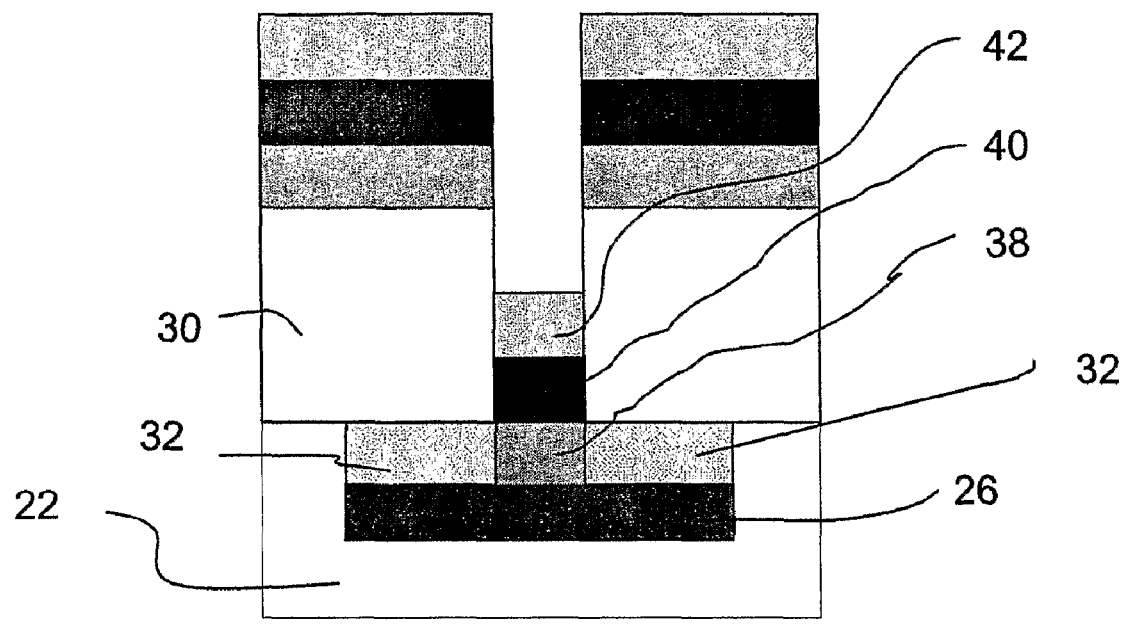
FIG. 4c shows schematically a structure after a number of layers have been deposited.

Another deposition step now takes place, with semiconductor 38, insulator 40, and gate electrode 42 layers being deposited as shown in FIG. 4c. The semiconductor layer 38 is deposited in a gap left between the drain 32 and source 34 electrodes, the top of the layer aligning with the top of the transparent contact layer 28. An ultra-thin bandgap alignment layer (not shown) is deposited on the semiconductor layer 38. The insulator layer 40 is deposited on the bandgap alignment layer (not shown) and the gate electrode layer 42 is deposited last. The gate electrode layer 42 and the insulator layer 40 are deposited in a trench 44 formed as part of the pattern etched into the peelable mask.

Figure 4D:
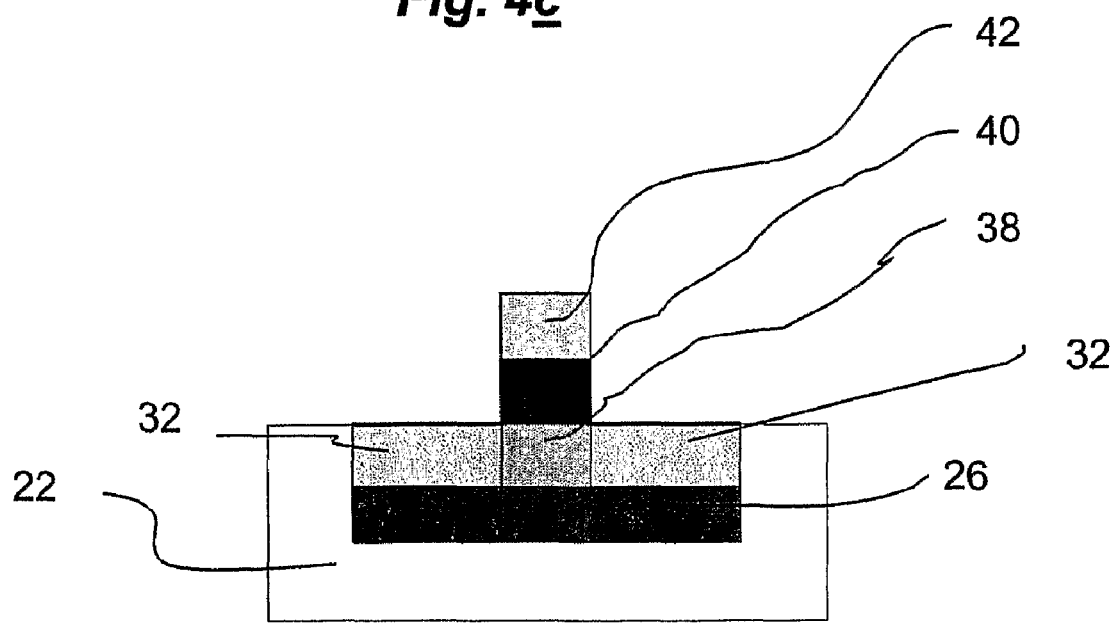
FIG. 4d shows schematically a structure having had the peelable mask removed.

The second peelable mask is then removed, together with waste coating, to leave a complete isolated thin film transistor device, as shown in FIG. 4d.

The peelable masking film process therefore can provide a means of etching a proportion of the substrate material that has been covered by the masking film. This means that an etch feature such as a trench or well can be produced in the substrate that is aligned with the etched hole created in the masking film. The alignment is inherent, as both are produced in the same process, and greatly superior to conventional techniques.

Additionally, the etch region of the substrate material can be laser smoothed after etching to produce a highly smooth surface finish onto which to deposit a coating or conversely the etched substrate surface finish could be deliberately roughened so as to provide mechanically enhanced coating adhesion or an increased surface area for microfluidic surface chemistry reaction and/or catalysis.

Deposition Processes

The provision of the etched feature in a substrate using a peelable mask means that a whole area process such as magnetron sputtering or discrete area process such as digital ink jet printing could be used to deposit a thin or thick film into the etched substrate feature using the mask to ensure that any excess material is removed when the masking film is peeled-off the substrate. This provides a means of ensuring that several coatings could be deposited into the etched substrate feature that are vertically aligned to each other whilst being isolated from other devices because of the nature of the pattern formed in the peelable mask and that it removes excess material when peeled off. Such multiple coatings could be achieved using a mix of processing methods such as laser ablation, ion beam deposition, electron beam evaporation in several processing chambers and at atmosphere or under vacuum. Such multiple coatings could also be achieved with one process using several differing materials in one process such as a range of ink types from an array of digital ink jet printheads or through the use of a multiplicity of magnetron sputtering cathodes in a single chamber or cluster tool.

By way of example the use of a multiplicity of magnetron cathodes provides many important benefits to the production of a thin film transistor because using the peelable masking and laser etched deposition window described above it is possible to deposit the heart of the transistor—the semiconductor, gate insulator, and gate contact—and, in particular, the important semiconductor-substrate and semiconductor-gate insulator interfaces, in a single processing step in a single vacuum chamber under very clean and highly controlled conditions. This has considerable positive implications for thin film and associated interface quality as well as minimising processing and masking steps that impact product yield and cost.

However Closed field Magnetron Sputtering (CFM) as described above, is just one of many physical vapour processes that can be used to produce a transparent thin film transistor based, for example, on semiconducting ZnO. CFM is a process that provides a high ion current density and maintains the ion-to-neutral ratio at the film growth surface as the power to the magnetron cathode is changed thereby maintaining the quality of the ensuing film microstructure (more detail is provided in GB 2 258 343, U.S. Pat. No. 5,554,519, and EP 0 521 045). The incident ions arrive at the growth surface with low energy impaction or impingement (typically less than 50 eV but preferably less than 5 eV) and it is this low impact energy coupled with the high ionisation efficiency that provides for a low temperature growth environment, very smooth oxide surfaces, very low oxide absorption coefficients, k, and high density coatings which are necessary to produce a high quality device on a temperature sensitive substrate such as PET.

Alternate processes to closed-field magnetron sputtering include, but are not limited to: laser ablation; ion beam sputtering; ion beam assisted deposition; vacuum arc (or multiple arc); electron beam evaporation; atomic layer epitaxy; molecular beam epitaxy, chemical vapour deposition, electron cyclotron resonance chemical vapour deposition, plasma enhanced chemical vapour deposition or laser dry transfer printing.

However, not all of the potential deposition processes that may be used in peelable mask microelectronic device fabrication are what is termed line-of-sight. This means that consideration has to be given to the manner in which the masking film is coated during the device build. This is especially so at the mask-substrate interface that is exposed by the laser etching of the required deposition window pattern, for example, as shown in FIG. 2b.

Considerations Affecting Peel-Off—Solid Deposition Coatings

A highly desirable feature of the peelable mask fabrication process is achieving a clean peel-off for the masking film after the required film or films have been deposited. Those deposition processes that produce conformal coatings such as non-line-of-sight processes such as PECVD, ECR-CVD, CVD, Plasma polymerisation, variants of magnetron sputtering, variants of spray coating, etc, pose the greatest challenge in this respect since they will provide a uniformly thick coating over the mask and substrate alike. Irrespective of the masking film wall, the "throwing power" of the film deposition process may provide a coating at the mask-substrate surface that might impair the peelability of the masking film.

The degree of impairment will depend on the overall thickness of the deposited film or films, and the mechanical strength of the film to resist forces during the peeling process. There is likely to be greater impairment where the deposition process coats the interface between the mask 20 and the substrate 22 in the laser etched trench 26. There is a risk that peeling the mask away will tear the deposited film or films from the substrate along with the masking film and so may introduce a degree of patterned film edge tearing/material removal.

By choosing the material properties of the mask, substrate, and deposited films, and the manner of adhering the mask to the substrate, carefully, the bulk of the required deposited film or films will be left substantially intact and adherent. It is anticipated that even for a conformal coating covering the masking film an adequately clean peel-off process can be obtained by ensuring that the contact cross-sectional area of the deposit at the peel-off interface (in the vertical plane of the masking film and substantially at normal incidence to the peel-off force direction) multiplied by the intrinsic bond strength of such a coating or multiple coating is less than, and preferably much less than the interfacial bond strength of the deposit to the substrate surface multiplied by the contact area of the deposit (essentially the etched window in the masking film).

Figure 38:
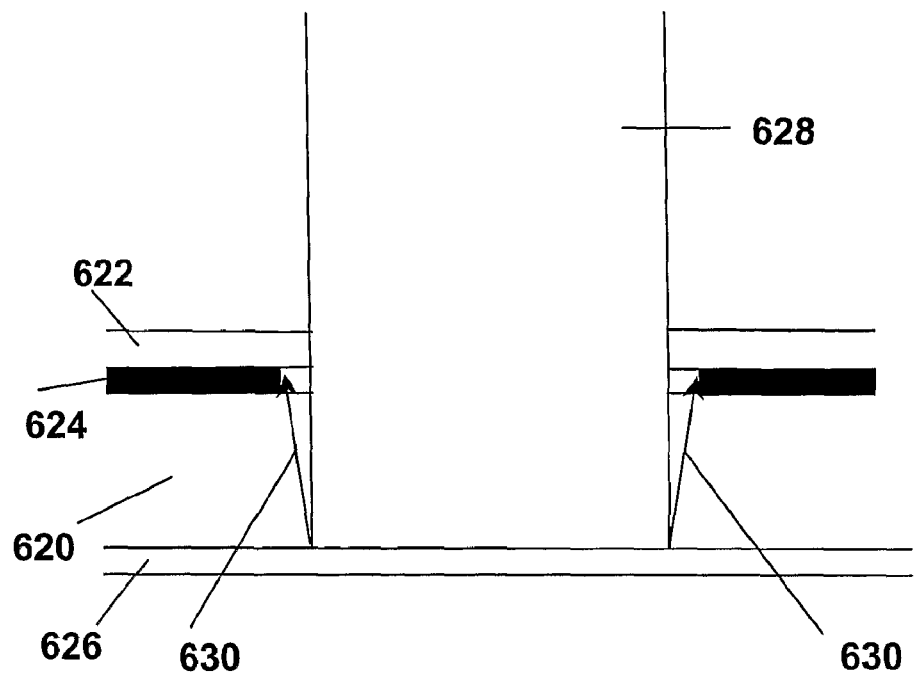
FIG. 38 shows schematically a cross section through a peelable mask undergoing etching with adhesive bond line removal.

FIG. 38 shows schematically a cross-section through a conformally coated substrate 600 covered by a mask 602. The coating comprises a barrier layer 604 and a TCO 606. These layers have coated and upper surface 608 of the mask 602, a side surface 610 of the mask 602 and a upper surface 608 of the substrate 600.

At the upper surface 608 of the substrate 600, a, the ease of peel off is represented by:

Thickness of TCO layer×contact area of TCO layer× interfacial bond strength by $^{SI}=d_{TCO}A_{TCO}\phi_s$ At the side wall 610 of the mask 602 the peelability is equal to=thickness of multilayer coating×cross-sectional area×intrinsic bond strength of layer on layer i.e.$=D_{MC}A_{SCMC}\xi_{SB}$ For ease of peel off without removing the required coating (TCO) in the well then: $a \gg$ than $B$ i.e. $D_{TCO}A_{TCO}\phi_s \gg D_{MC}A_{SCMS}\xi_{SB}$ Assuming no overhang in the mask and that the coating around the mask is essentially conformal.

The degree to which such tearing will act to remove the whole or a significant proportion of the required patterned film or films depends upon the magnitude of the deposited film or films bond strength (adhesion) to the exposed substrate surface resulting from the laser etching of a the required pattern deposition window. Poor adhesion will tend to favour complete removal of the required patterned film or films with the masking film. The converse is true for high bond strength deposits.

The use of sub-surface etching of the substrate tends to mitigate to some degree the effects of conformal coating because at the masking film-substrate surface edge line the planarity of the etched wall that comprises the masking film and substrate material will be inhomogeneous due to differential etching rates and localised laser induced chemical-assisted etching effects (i.e., enhanced polymer etching due to activated oxygen liberated from the polymer and substrate materials during etching). This inhomogeneity, although coated by the conformal process, will have a distributed coating weakness along the interface line that will act like a perforation cut as in a tear-off slip such as a cheque from the cheque book stub, rendering this region weaker thereby assisting the clean removal of the masking film and unwanted conformal coating film or films.

The peel-off edge of the required film deposit does not need to be straight and/or parallel. Peel off at the vertically aligned semiconductor-to-gate contact stack is not as crucial as it may seem, since the semiconducting film is in intimate contact with the drain-source contacts and in ultra thin band-gap alignment film is in intimate contact with the semiconducting film surface along substantially its entire area such that minor disruption at the edge of the stack will not substantially impair the performance or operation of the thin film transistor. Nevertheless, it is of considerable benefit to ensure that the interfaces of the vertically stacked films possess excellent adhesion in order to ensure that a plane of weakness does not exist at such interfaces thereby rendering the device potentially inoperable if failure occurred at such an interface.

Considerations Affecting Peel Off—Laser Heating Effects

The peelable mask manufacturing process is designed to be simple but to have the stretch capability to achieve very high pattern resolutions, as required, and as such is based on the technique of laser etching/ablation so that a range of laser beam types and irradiation wavelengths can be employed. Both thermal and non-thermal laser etching can be used but preference is given to non-thermal processes that provide material lattice bond scission without, or at least with the minimum of, heat generation.

The primary reason for minimising/eliminating laser etch induced heating is the need to be able to peel-off the masking film at the end of a specified deposition process. Excess heat generated by the etching of a deposition window might affect the masking film edge bond state by virtue of localised welding or melting, irrespective of whether the masking film has been attached to the substrate surface using electrostatic or adhesive co-polymer or bond film methods. Preferably the masking sheet material is bonded to the polymer (or glass, paper/treated paper) substrate sheet material in a roll lamination process where the masking film is held in place by electrostatic attraction in order to keep the substrate-mask interface as clean as possible and as free as possible from any semi-permanent/temporary bonding adhesive.

Considerations Affecting Peel, Off—Liquid Deposition Coatings

Consideration must also be given to the use of such peelable mask manufacture processing with liquid-based coatings. In this case it is to be expected that the liquid source, such as a semiconducting polymer (Polythiophene) or inorganic nanoparticle semiconductor (ZnO) ink, would coat the etched wall of the pattern feature. In this case consideration must be given to when to peel-off the masking film since if too early then smudging and smearing of the deposit will occur. Conversely, peeling off the mask when the ink has dried would lead to problems of mask removal or device degradation or failure. It is, therefore, advantageous to use a manufacturing method that makes use of a liquid (ink) reservoir that has integrated into it a fluid flow restriction device that controls the rate of liquid flow into a device defining micro channel. It is the termination geometry of this device defining structure that affects the manner in which the masking material can be peeled away from a substrate surface. This is because the initial liquid flow provides a specific thickness of liquid-solid (ink constituents) as no loss of carrier solvent (assuming not 100% solid ink) has occurred such that this ink thickness reduces as the solvent is evaporated off and the liquid contact line retracts off a suitably non-wetting surface to terminate when fully dry in a thin coating edge that is readily broken as the masking film is removed. This provides the necessary flow restriction from the reservoir into the microfluidic channel that defines the device active region which in the case of the transparent thin film transistor is the channel length.

It is possible to consider defining such ink reservoir and device structures using micro and sub-micron UV embossing techniques to define structures of specific surface energy to modify the flow properties of the ink channels leading to, and contained in, the device under manufacture. Such embossing is of considerable interest in components and devices where the microfluidic channels and ink reservoirs are a permanent feature of the design—that is where the patterning method is not a peel-off system. It is also anticipated that such microembossed reservoirs and related microfluidic channels could be processed off-line, for example on a polymer sheet that could then be used as a peelable masking film. This enables a separate process where the resulting microembossed plastic sheet is laminated to the substrate in approximate registration with surface features, such as transparent conductor contacts, and a laser etching system is then used to define in-situ alignment of the piece parts used to make the devices to ensure the correct flow of the selected inks/fluids. Such a microembossed plastic sheet (or microembossed peelable masking film) may have features that project through the whole thickness of the masking film so as to provide a direct transport path for a liquid to flow easily through the mask into a reservoir or microfluidic channel (i.e., to permit filling of a reservoir).

In one embodiment it is possible to use this peelable mask manufacturing method to produce high resolution tracks of transparent as well as opaque materials by making the surface of the masking film substantially non-wetting. Such a surface causes any liquid coating to de-wet there on as the liquid is drawn into micro channels formed by the laser etching process in the masking material and in the substrate material directly beneath the masking layer etch window. As the walls of the etched channels are substantially more wetting than the upper (outer) surface, the liquid is pulled under surface tension into the micro channels. The liquid fills the etched substrate channels and partially or completely fills the masking channels. After a specific time period has elapsed the masking film is removed, to leave a set of high resolution tracks. Thus, such high resolution tracks may be produced by a process combining peelable masking and ink jet printing or spray processing at low cost.

Figure 5A:
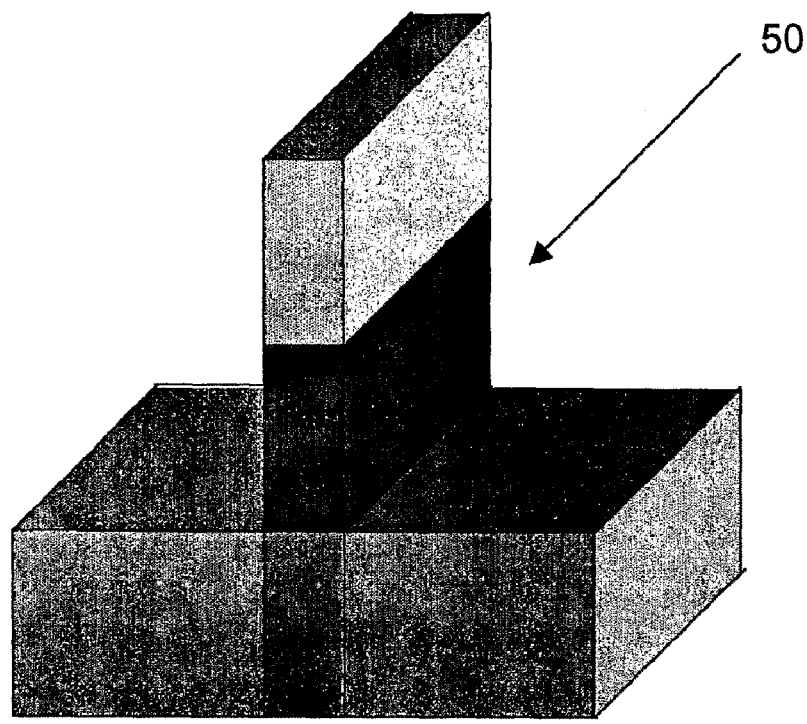
FIG. 5a shows schematically a perspective view of a transistor formed by the process shown in FIG. 4.
Figure 5B:
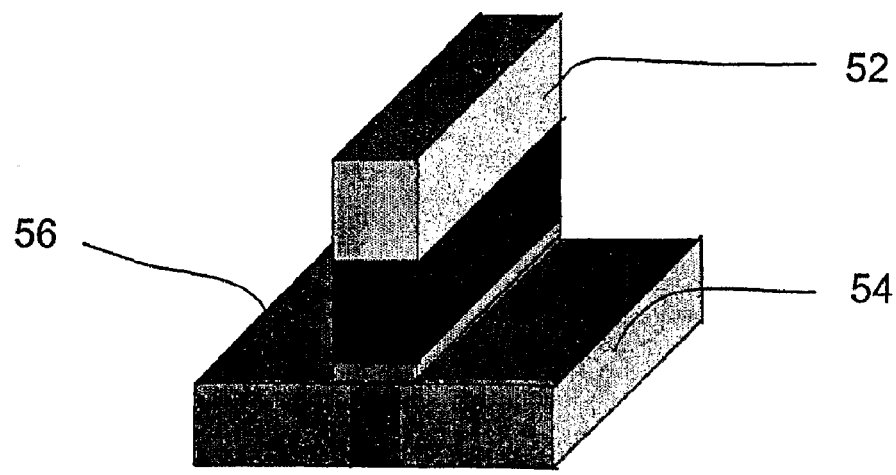
FIG. 5b shows schematically a perspective view of a prior art transistor.

FIG. 5a shows schematically a perspective view of a transistor formed by the process shown in FIG. 4, which has a vertically aligned semiconductor-to-gate contact stack 50. By contrast, FIG. 5b shows schematically a perspective view of a transistor where the second peelable mask was not aligned to the first peelable mask, and a gate electrode 52 overlaps drain electrode 54 and source electrode 56.

Contact overlap is not desired as it causes leakage current and parasitic capacitance effects.

If the gate and drain or source contacts overlap this must imply either that they are in direct contact which means that they form an electrical short circuit or that they are overlaid with one or more materials sandwiched between the electrodes. Dependent upon the nature and properties of the sandwich filling including film thickness, microstructure, chemistry, and number of individual layers, the resulting electrical path between the gate and drain or source contacts may be more or less conducting (dependent using other factory upon the magnitude of the voltage difference between the electrodes) and of greater or lesser capacitance dependent upon the dielectric nature of the material or materials that are interposed between the gate and drain or source contacts. This latter effect is also dependent upon film thickness and film thickness ratio in a multilayer stack. The leakage and parasitic capacitance directly affect the thin film transistor performance and degrades the operational characteristic of a switching circuit that makes use of such a transistor.

As peelable mask manufacturing means that a plurality of layers of material can be laid down in a trench, providing as to-alignment, it enables structures that depend on accurate alignment to be developed, and manufactured cost-effectively.

Figure 6A:
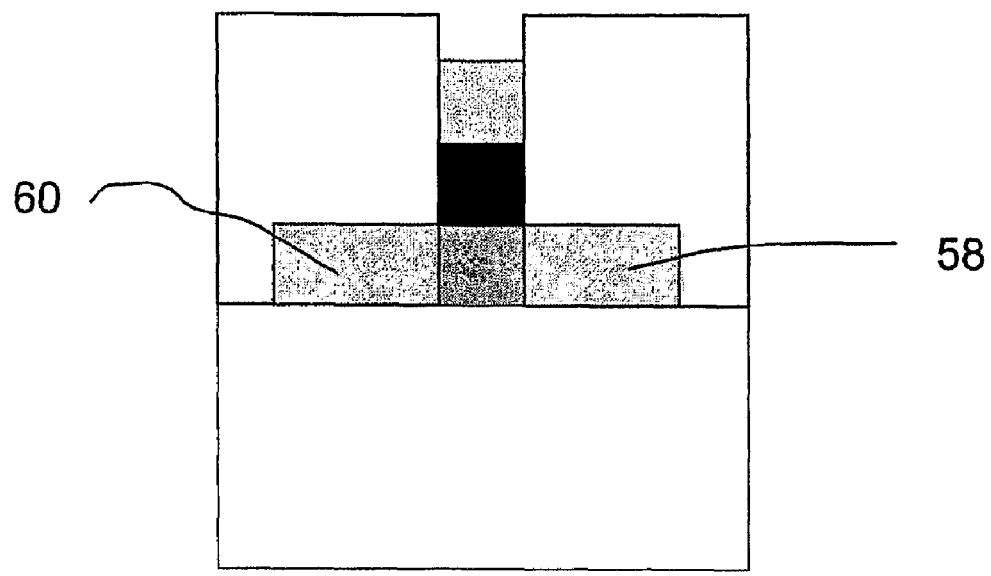
FIG. 6a shows schematically the mask in place.
Figure 6B:
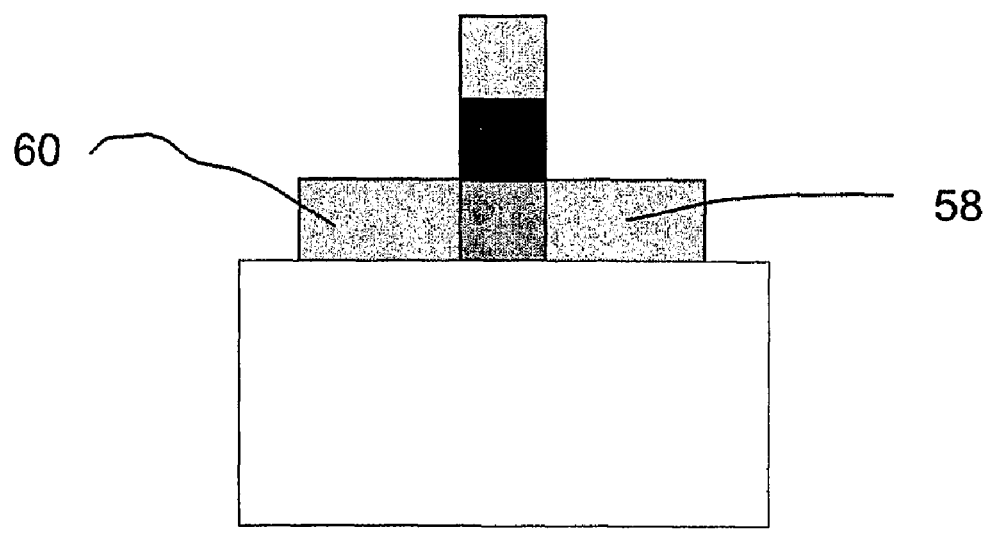
FIG. 6b shows schematically a structure having had the mask removed.

FIG. 6 shows schematically a further embodiment of a process using a peelable mask. Drain electrode 58 and source electrode 60 are produced by an off-set lithographic printing process. Alternatively one or both may be produced by laser etching or by off-set, stamped or ink jet printing processes. For applications where cost is the overriding factor, the thin film transistor performance, including the need to eliminate/minimise parasitic capacitance and leakage current, does not need to be ideal or optimised providing that it adequately selves the purpose for which it is intended. For such applications tolerances in the manufacturing process, for example a small offset from ideal alignment for the gate/insulate/semiconductor stack in the dissected drain-source contact, are not problematic as there is a concomitant reduction in manufacturing cost FIG. 7 shows schematically a structure formed from a similar process as that shown by FIG. 6, having slightly different scaling. In the embodiment shown in FIG. 7, a top surface of a semiconductor layer 62 lies below the top surfaces of drain electrode 64 and source electrode 66. The drain and source electrodes are approximately 50 nm thick and the semiconductor layer is approximately 40 nm thick. A gate insulator layer 68 is approximately 50 nm thick and a gate electrode layer 70 is approximately 50 nm thick.

FIGS. 8a and 8b show two further different embodiments of transistors, illustrating flexibility of positioning. When using laser etching to bisect a single conductive layer into a drain electrode 74 and a source electrode 76, the accuracy of a laser etching system determines the accuracy to which a position of a gate channel can be determined. The materials used in the device, and its structure, (i.e. its top gate thin film transistor configuration) mean that there is a large tolerance on where the gate channel may be laid down, and so less accurate and more inexpensive etching systems may be used. Compared with transistors constructed anywhere on the drain-source contact pad after dissection these inexpensive systems have equivalent high performance. Either structure shown in FIG. 8 could produce a working transistor. A gain of a factor of ten in tolerance means a factor of ten or so in terms of machine cost.

One of the problems with such direct laser etching of electrode layers in the past has been the tendency of the film to degrade or curl up at its edges in response to the heat generated in the etching process. This is particularly problematic if the film curls to the extent that it bends back on itself. The curling depends on the following process parameters including: material of the film from transparent conductive oxide or transparent conductive polymer or equivalents which are more susceptible to materials such as carbon nanotubes and sheets of unfolded carbon nanotubes which are less susceptible; laser wavelength and energy density; substrate material on which the film has been deposited; and quality of the optics used to generate the etching laser beam.

Such degradation manifests itself, in the most severe cases, as an up curled feature that forms a reverse "C" shape. It is understood that the cause of this degradation is thermal in nature and occurs even for the first pulse in a multiple pulse single site etch process.

Embodiments provide a number of ways to reduce the extent of the curling, so as to enable the use of a suitable material, preferably a transparent conductor such as an inorganic oxide indium tin oxide, ITO film, with a direct laser etch. The first of these is film capping, which involves covering an ITO film with another permanent or sacrificial film such as a peelable resist. Alternatively, an ITO film may be deposited on a thermal dissipating thin film to sink heat away from the ITO etch edge so as to dissipate the heat from the laser pulse in a time period of femto ($10^{-15}$), pico ($10^{-12}$), to nano seconds ($10^{-9}$) so as to substantially reduce the thermal load at the edges of the laser beam etch zone prior to, and during, the etching process. Alternatively, a suitable structure of ITO film is chosen depending on the properties of a substrate. For example, amorphous ITO film is more suitable for a glass substrate and crystalline ITO for a plastic substrate. Materials may be paired and/or processing parameters altered to have a series of grain boundaries whose interfaces are so weak as to cause the film to tear or break along such grain boundaries when the transparent conductor is laser etched. In this regard a nano/micro/polycrystalline coating can be deposited, by varying suitable processing conditions, on both glass and plastic substrates. Alternatively, the film can be formed as a series of vertically stacked ultra thin films, known as a superlattice or multilayer stacked contact. Alternatively ion-beam assisted ITO deposition can be used. This involves high energy ion bombardment to enhance surface adhesion through an atomic stitching process whereby the ITO-substrate contact interface is made diffuse through the irradiation process induced "radiation-enhanced diffusion" thus leading to increased adhesion of film to substrate media.

Severe "curling", features that bend upwards and partially back on themselves, and those that have a bend and/or lift dimension greater than about 150 nm are potentially troublesome. If such curl does occur, the vertical stack make-up and dimensions can be re-defined so that the curl height is covered by a thick enough insulating layer such that leakage between the drain and source to gate contacts is minimised and preferably suppressed. However, in doing this it is inevitable that the peelability of the masking film will be severely impaired due to the fact that the whole area deposition will coat the up turned edge of the masking film and base contact.

In general there are many potential effects of laser interaction with masking film bonded to plastic, treated paper, or glass substrates that include: polymer sheet bond scission; thermal reflow; trapped air/gaseous bubble rupture and mask lift-up; thermal edge melting and substrate surface bonding of exposed etched mask edge; vertical walled etched features such as ribbing; non-vertical walled etched features such inverted or re-entrant trenches and wells; and sub-surface aligned mask edge etching and production of "perforation-like" peel-off edge for masking There are many permeations of processing parameters that can be used to overcome such effects, as set out below.

| 1. | Mask thickness | 0.5 to 25 μm |
| 2. | Mask etch profile | Vertical, inverse, re-entrant |
| 3. | Mask material | PET, PP, PI, other |
| 4. | Substrate type | Glass, plastic, treated paper, metal foil, other |

Three primary methods are:

Firstly adhesive bond line selective area removal. A peelable reflective surface is used on the base of the substrate to control reflection angle and hence etch length. A schematic diagram of this process is shown in FIG. 39.

FIG. 38 shows schematically a substrate 620 having a mask 622 adhered thereto via adhesive layer 624. A further, UV reflective layer 626 is laminated to the underside of the substrate 620. The UV reflecting layer is preferably a reusable peelable film. A laser beam 628 is used to etch the mask 622. The primary etch is in the direction of the laser beam as indicated by arrows towards the centre of the laser beam, but the secondary etch occurs as the laser is reflected from the ultraviolet reflecting surface 626. The UV reflecting surface is patterned to cause reflected energy to reflect at a set angle. Various geometries and material types can be used for such patterning. Reflected light is shown by arrows 630 in FIG. 38 and this reflective light having less energy than the forward beam etches only the adhesive layer 624.

Figure 39:
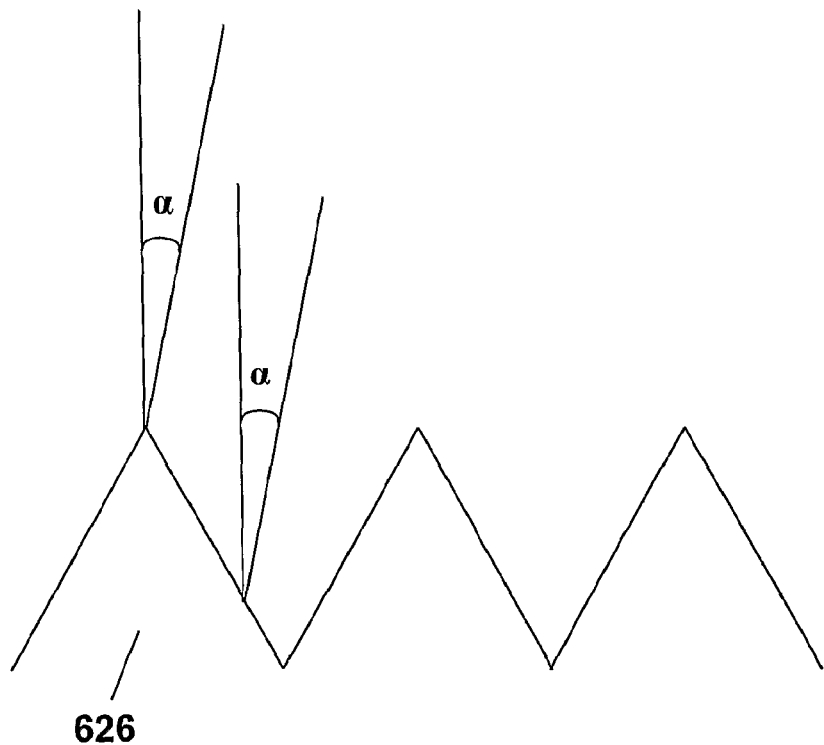
FIG. 39 shoes schematically a surface of a reflective film.

A typical surface for the UV reflecting layer is shown in FIG. 39. As seen schematically in this figure a normal laser beam hits an edge of the triangular cross-section structure 626 and is reflected by an angle α.

The etch back length which is the distance that the adhesive layer is etched such that the mask 622 overhangs the adhesive layer 624 is equal to the width of the substrate+the width of the adhesive layer×tan α. If we assume the width of the substrate+width of the adhesive layer is around 100 μm and the desired etch back length is around 2 μm the necessary angle is around 2°.

The "reflection" constitutes a mix of reflection, refraction and scuttering. The type of material that can be used for the UV reflecting surface includes gold and various multiplayer stacks, the actual materials in the multi-layer stacks depending on the wavelength of light used which in turn depends upon the bond strength of the adhesive. The bonding in the adhesive may be such that a different laser beam is used for the adhesive etch back length than the primary beam.

Alternatively, a method of breaking the bond strength of the adhesive is simply to irradiate the entire structure with ultraviolet light to which the other structures (mask substrate etc) are transparent.

A second method of improving the peelability of the masking film is to laser etch an inverse taper in the peelable masking film. This can be done before or after the peelable masking film has been laid down.

Figure 40:
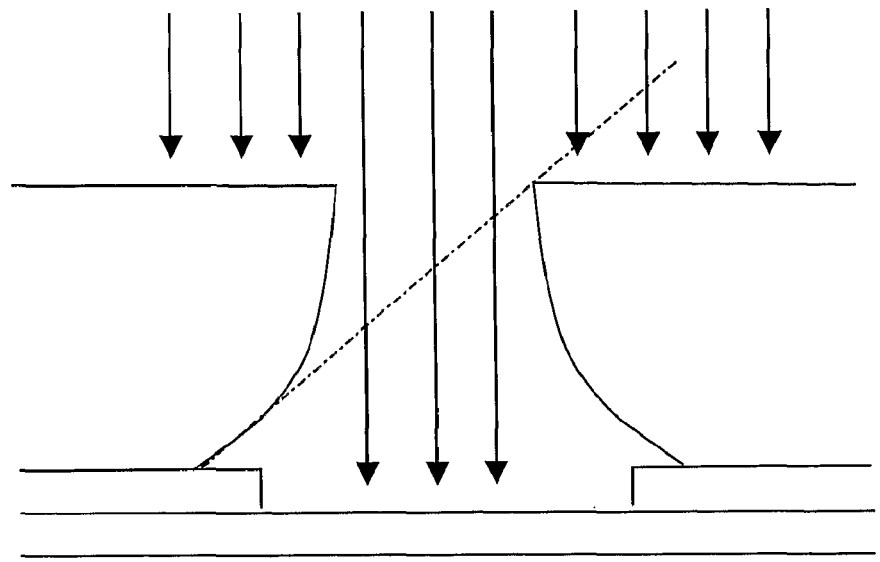
FIG. 40 shows schematically an undercut peelable mask.
Figure 41:
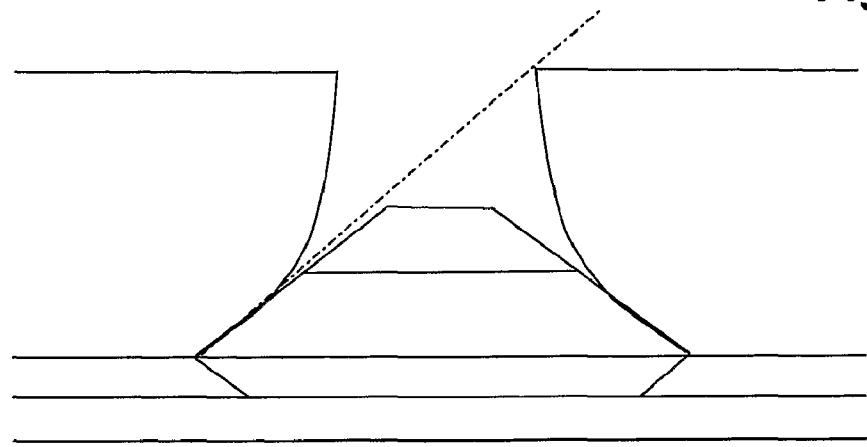
FIG. 41 shoes schematically a type of structure which may be produced using variable angle deposition.
Figure 42:
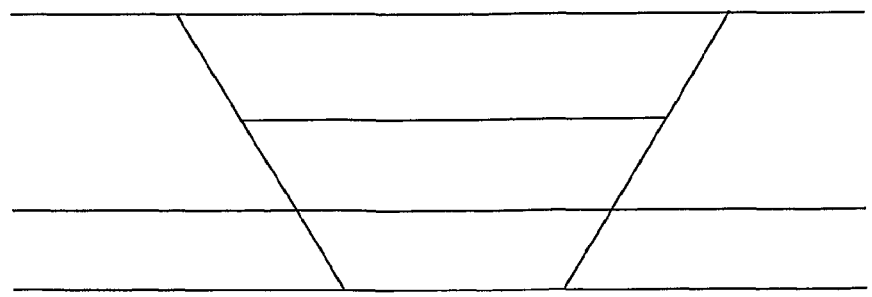
FIG. 42 shows schematically a type of structure which may be produced using variable angle deposition.

As shown in FIGS. 40 and 41 and 42 it is also possible to use a variable angle bombardment process which would produce a frustro-conical bi-layer having either an inverse taper (FIG. 41) or a standard taper (FIG. 42). In the standard taper the area above the drain and source electrode is air filled so there is negligible leakage current and/or parasitic capacitance.

Figure 43:
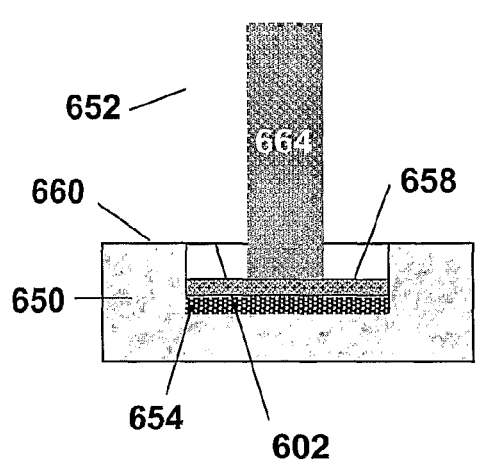
FIG. 43 shows schematically etching substances deposited in a well.
Figure 44:
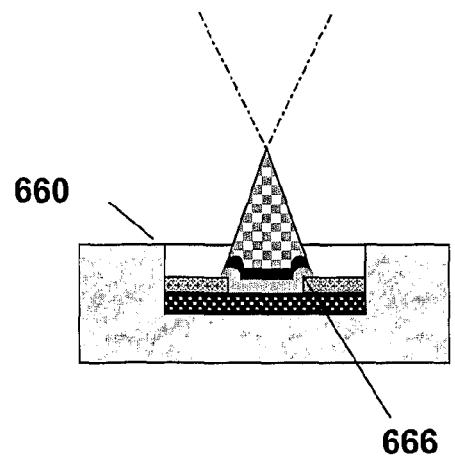
FIG. 44 shows schematically depositing substances in a well through an etched undercut film.

The third method of increasing the peelability is via an embedded well, as shown in FIGS. 43 and 44. In such a well the film coating deposited into the well does not fill the well and so there is inevitably a finite gap between subsequent masking films base and the deposited films in the well.

A variable angle line of sight deposition coating process may be used. This ensures that there is minimal contact overlap at corners of the film.

FIGS. 43 and 44 shows schematically a substrate 650 covered by a capping film 652. A first laser beam (not shown) etches a well 654 into the substrate in which a barrier film 656 and an ITO film 658 are deposited. The upper surface of the ITO film 658 is well below the capping film/substrate interface at the upper level of the substrate 660. Therefore when the capping film is laid down it overhangs the well as indicated at 662. A further laser beam 664 may be used to etch drain and source electrode and variable angle line of sight deposition coating used to lay down a tri-layer stack. The coating process used is such that only a very small overlap 666 is produced. The top surface of the tri-layer stack is still below the mask/capping film interface 660 leaving a gap between the capping film 652 and any deposited layers. This means the capping film is relatively easy to peel off.

Figure 9:
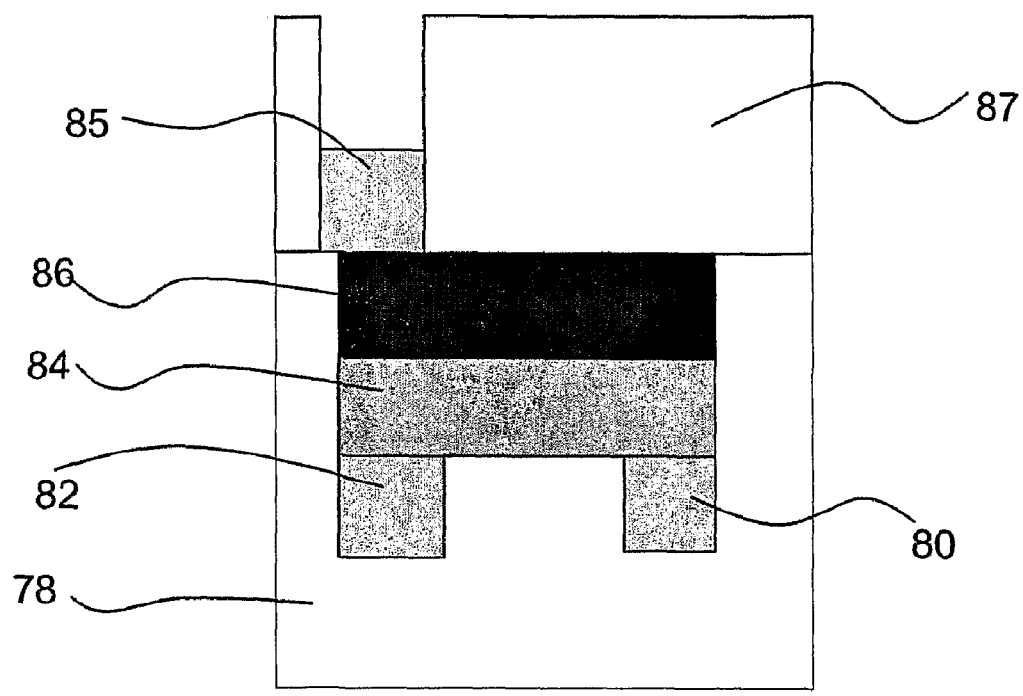
FIG. 9 shows schematically an example of a drain offset thin film transistor being manufactured using a peelable mask process.

FIG. 9 shows schematically an example of a drain offset thin film transistor that can be manufactured using a peelable mask process. A substrate 78 is laser etched and source 80 and drain 82 contacts deposited. A first peelable mask (not shown) is placed over the contacts and etched together with the substrate. A semiconductor layer 84 and an insulator layer 86 are deposited and the peelable mask removed. A top surface of the insulator layer is aligned with a top surface of the substrate 78. A second peelable mask 85 is then laid down and etched, forming a trench offset from the drain electrode 82. Gate electrode 87 material is then deposited in the trench.

In this manner a drain offset thin film transistor, preferably a transparent thin film transistor, may be formed. The second peelable mask can be precisely aligned with the first peelable mask by fiduciary marks as described further below.

This is a dual pattern process combining embedded and integrated processing. It is possible to use independent ink feed reservoirs for the drain source and gate contacts. This example also demonstrates the fact that the disclosed process may comprise a combination of liquid and dry processing.

Figure 10:
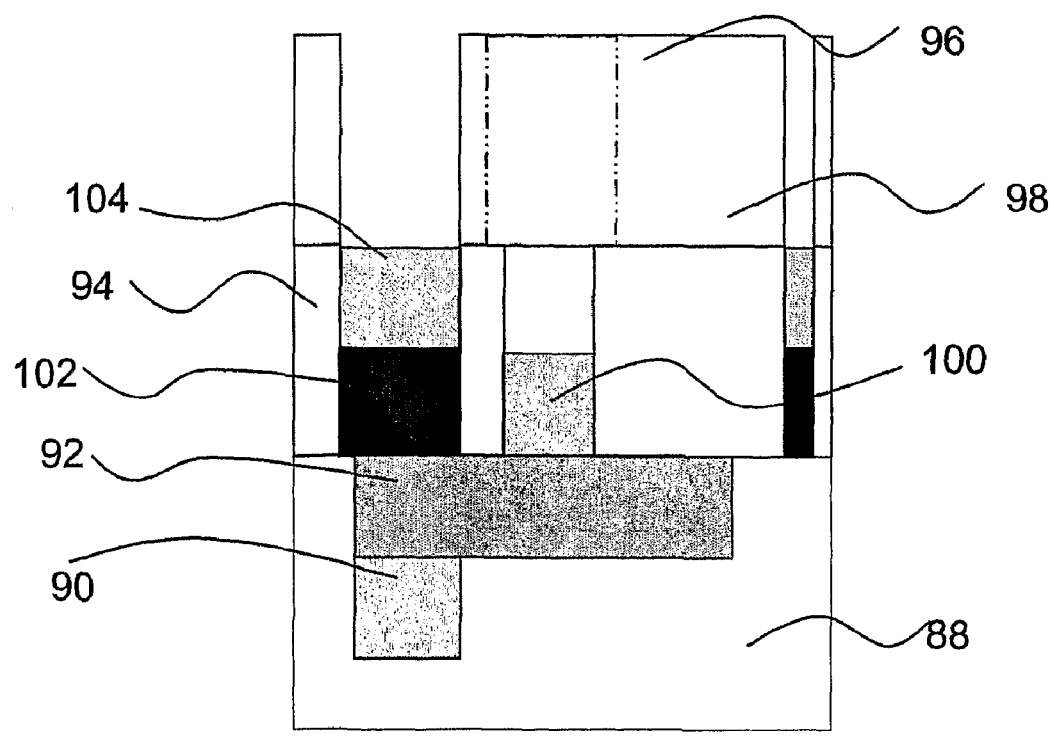
FIG. 10 shows schematically an example of a source-gated thin film transistor being manufactured by a dual peelable mask process.

FIG. 10 shows schematically an example of a source-gated thin film transistor manufactured using a dual peelable mask process. A triple pattern process is used with dual back-to-back peel-off masking. First a substrate 88 is laser etched and a source contact 90 and a semiconductor layer 92 deposited. A dual masking layer comprising first peelable mask 94 and second peelable mask 96 is then laid onto the substrate. This mask may be pre-patterned on its reverse side (adjacent to the substrate) or may be etched in-situ. An ink reservoir feeder channel is hidden in a portion 98 of the second peelable mask. This feeder channel is accessed to deposit a drain contact 100. An insulator layer 102 and a gate contact layer 104 are then laid down using standard deposition techniques. The technique thus combines ink jet printing deposition and vacuum deposition. The second vacuum deposition does cover the drain contact other than in the region that defines the entrance to the drain contact microfluidic channel feed reservoir, which will be removed upon completion of the device structure.

A reverse laser etched alignment mark not shown may be provided on the masks to ensure that higher resolution alignment can be achieved optical by through alignment on optically opaque substrates or for applications that require tighter processing tolerance.

A transistor such as that shown in FIG. 10 has many advantages, including a lower operating voltage, lower power dissipation, larger gains and a higher operating speed.

Figure 11A:
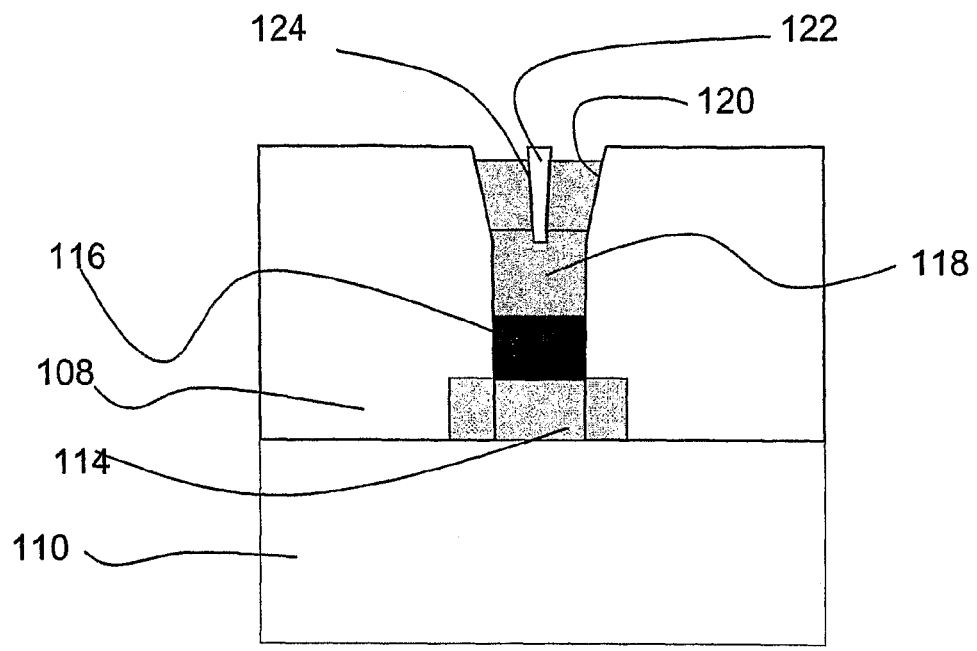
FIG. 11 shows schematically an example of an auto-aligned bottom gate thin film transistor, manufactured using a peelable mask process.
Figure 11B:
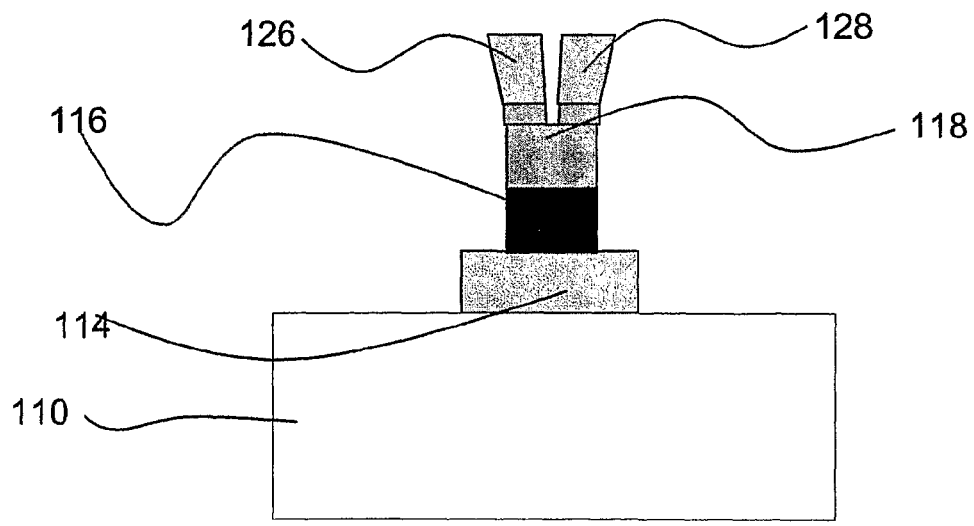

FIG. 11 shows schematically an example of an auto-aligned bottom gate thin film transistor, manufactured using a peelable mask process. This device can conveniently be formed using peelable mask technique. A peelable mask 108 is laminated to a substrate 110. A parallel-sided trench 112 is laser etched into the mask, as outlined above. A gate contact layer 114, an insulating layer 116 and a semiconductor layer 118 are then deposited, in that order, so that the gate contact layer is adjacent to the substrate 110.

The peelable mask is then dry laser etched for a second time. Optically split (single beam) or dual laser beams are used that constructively interfere at a depth below the peelable masking film outer surface, to generate a frustro-conically sided trench 120 having an spur 122 of peelable mask material at a mid-point of the trench. A further small amount of semiconductor material is deposited until walls 124 of the spur are lined and two separate trenches have been formed ITO film is then deposited in these two trenches to form a drain contact 126 that is separated from a source contact 128.

The mask is then peeled off. The spur may be peeled off with the rest of the mask, as it is continuous with other portions of the mask.

Low cost electronics, whether based on amorphous silicon, organic (plastic), hybrid organic-inorganic, or alternate thin film transistor technology require high performance to enable the widest range of applications. Conventional photolithographic patterning is too expensive, whilst current direct write processing, as exemplified by digital drop-on-demand ink jet printing has poor feature resolution and droplet positioning coupled with limitations in available materials. This is a significant limitation to the realisation of optimised Cost-Performance microelectronic products, particularly high performance transistor switching circuits processed on flexible substrates that are required to support high drive currents and voltages for long operating periods.

Hybrid Manufacturing

The peelable manufacturing approach provides for such high performance devices based on a highly flexible production strategy that permits a wide selection of dry and wet processes to be "mixed-and-matched" in the manufacture of a specific device type and performance-cost specification—"Cost and Performance Selective Manufacturing (CPSM)" using simple position-tolerant feature patterning. The peelable mask manufacturing is at the heart of the Selectable Interconnect Array Integrated Circuit ($SIA^{IC}$) production, based on this CPSM strategy, and as such has the capability of providing for high resolution patterns using a high tolerance pattern alignment process. This is best illustrated by the production of a transparent thin film transistor (TTFT) or more specifically a transparent thin film field-effect transistor.

Transparent Thin Film Transistor (TTFT) Production

A particularly high performance TTFT configuration may be produced by such techniques. A staggered structure having a gate contact being on top of the device is used. The structure is the result of a vertically aligned upward build of a 7 layer (4 materials) deposition sequence starting on an exposed laser etched feature surface in the substrate, as follows: Environmental barrier/Base Contact/Growth control/Semiconductor/Bandgap alignment/Gate insulator/Top gate contact $SiO_2$/ITO/$SiO_2$/ZnO/$SiO_2$/$HfO_2$/ITO.

FIG. 12 shows schematically a flow diagram of an embodiment of a method of manufacture which may be used as part of a peelable mask manufacturing process. More specifically, this method of manufacture is particularly suitable for the manufacture of thin film transistors such as those described hereinabove. FIGS. 13 and 14 illustrate various stages in manufacturing embodiment of this process. FIG. 13 gives an overview of manufacture of the array, whilst FIG. 14 shows the manufacture of an individual transistor.

In a first phase of the process, starting with an initial stage 130, a first peel-on masking film 147 is applied to a substrate 148. The substrate may be a rigid piece of glass or a section of transparent polymer sheet (made of, for example, PET), as required for the eventual application where the polymer sheet may in itself be rigid or flexible (conformable).

In a stage 132 a deposition window is formed in the first film and 147 the substrate 148 by laser etching. This substrate feature etch and deposition window provides a laser etched feature into the substrate material that isolates the TTFT from adjacent devices and provides for the environmental barrier and device growth stable platform film and base contact transparent conducting oxide bi-layer to be located below or substantially in-line with the substrate surface so as to afford greater mechanical adhesion particularly for substrates that are flexed or deformed during operation.

An inorganic glassy oxide barrier is then deposited in a further stage 134. A drain-source TCO contact made of an ITO film is then deposited in a further stage 136. A plurality of isolated islands 150 are deposited. In a further stage 138 the masking film is peeled off.

As an alternative to this first phase, if a simpler process is desirable, ITO TCO islands may be sputtered onto a substrate using a contact mask.

In between the phases, the substrate may be rolled into a mask and stored or transported, as described further below.

In a second phase of the process, as shown in FIG. 13c, a second peel-on masking film 152 is applied to the structure at a stage 140. The film 152 has a peel-off tab 154 which extends over the edge of the substrate 148. The tab may be pulled to peel-off the second film 152 making removal easier.

Figure 14A:
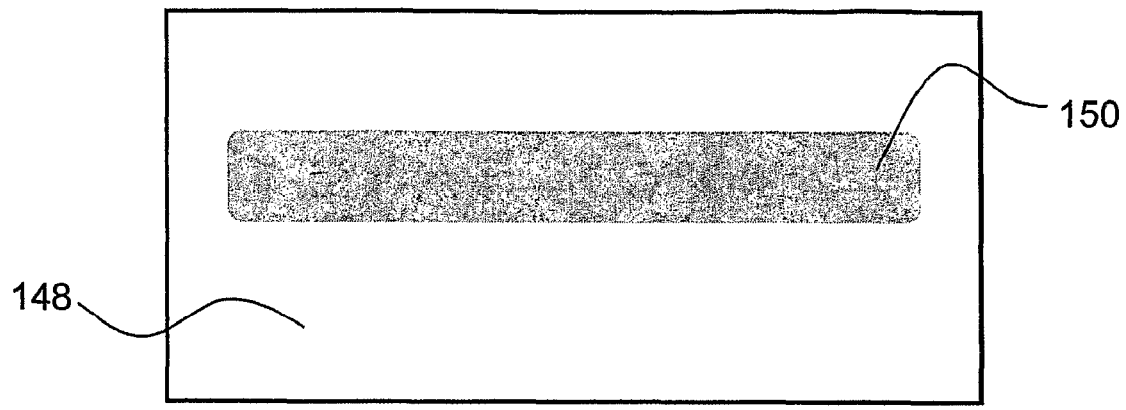
FIG. 14a shows schematically a top view of a printed structure.
Figure 14B:
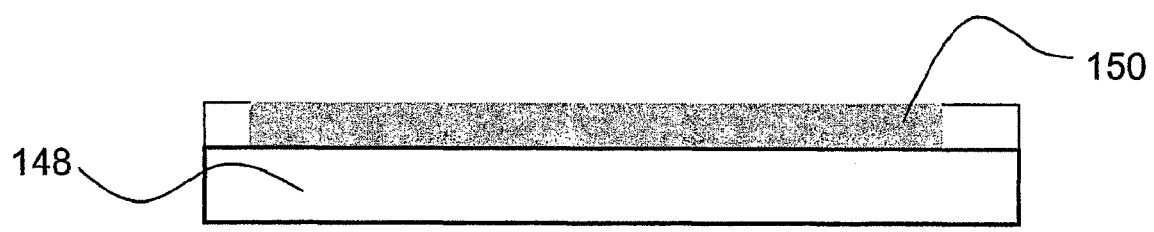
FIG. 14b shows schematically a cross-section of a printed structure.
Figure 14C:
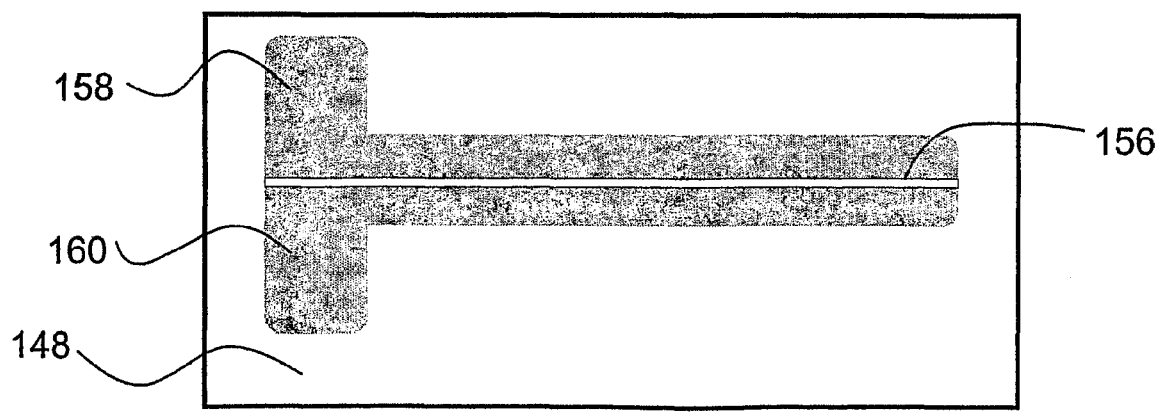
FIG. 14c shows schematically a top view of the structure after an etching step.
Figure 14D:
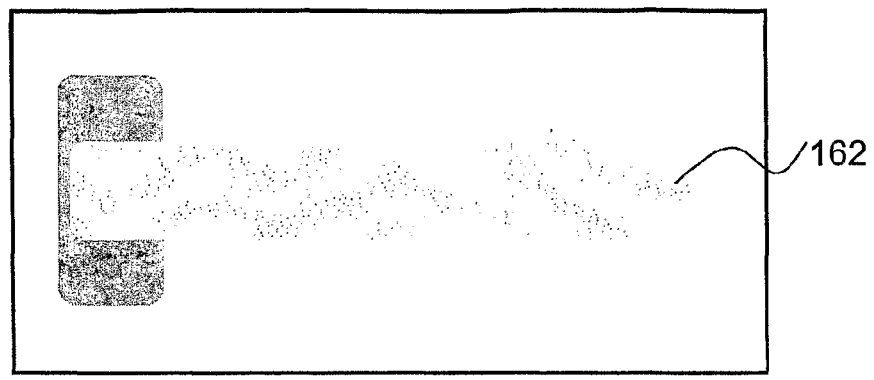
FIG. 14d shows schematically a top view of the structure after a number of deposition steps.
Figure 14E:
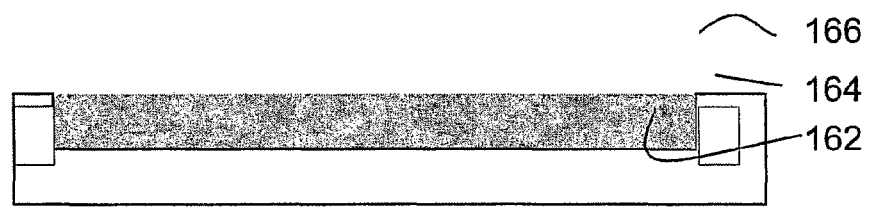
FIG. 14e shows schematically a cross-section through FIG. 14d.
Figure 14F:
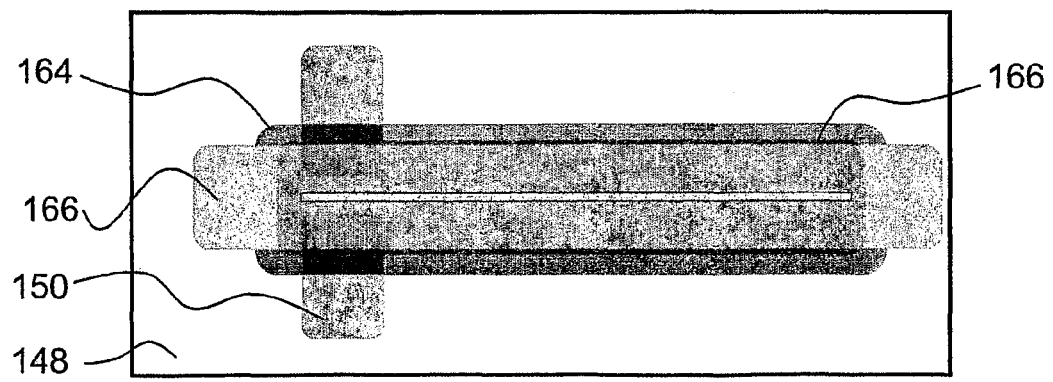
FIG. 14f shows schematically a top view of the structure after further deposition steps.

In a further stage 142, shown in FIGS. 13d and 14c, drain-source contact/gate channel laser etching occurs. A channel 156 is etched through the second peelable mask and through the deposited drain-source TCO contact. A drain electrode 158 and a source electrode 160 are thereby formed. The gate channel is auto-aligned with a masking trench for further deposited layers by this process.

As an alternative, offset lithographic printing can be used to define the drain-source contact land. If offset lithographic printing is used, then individual drain and source electrodes with a gate length as small as about 5 μm can be achieved. There is no need to laser etch a gate channel. If desired, offset printing may be used to deposit a base layer into which a gate channel is etched for those applications where vertically alignment is essential or where the resolution of the offset process (about 5 to 10 microns) does not meet the device application specification requirement (i.e., say a 3 micron gate length which is within the tolerance of a YAG laser system).

The second peelable masking film therefore provides a means of defining a laser etched trench in the base contact transparent conducting oxide film (ITO) so as to form two contacts from a single ITO film defined by the first peelable mask deposition/substrate etch window dimensions. The gap produced by the laser as it dissects the ITO base contact is the transistor gate channel and is an important dimension of the transistor. In order for the laser to be able to dissect the base ITO contact it must also etch a window into the masking film. This masking film window is aligned to the laser etched gate channel and provides a means of being able to deposit a vertical stack of films that are automatically aligned to the gate channel.

More specifically this patterning method provides a means of aligning the gate contact edges with the inside edges of the drain and source contacts so as to eliminate contact overlap thereby minimising parasitic capacitance and electronic leakage effects. This is a key element of the device processing approach since it provides a means of self-aligned patterning that is introduced at the time that the substrate media has been set-up ready for processing. This means that ambient temperature and processing configuration induced strain (i.e., reel uptake stress/strain in roll-to-roll manufacturing) can be catered for in the mask patterning of a flexible polymer sheet, such as PET, making the precision of the masking that much more uniform across the complete sheet area even for large area requirements.

A tri-layer stack 161 comprising a semiconductor layer 162, preferably of zinc oxide, an insulator layer 164, conveniently of hafnium oxide, or aluminium oxide or titanium oxide, and a gate contact layer 166 is then deposited in a further stage 144, using CFUBMSD. The masking film protects all other regions of the substrate. The tri-layer stack actually comprises four layers, having an ultra-thin bandgap alignment layer (not shown) positioned between the insulator layer and the gate contact layer. All deposited materials are transparent (even though the generic processing method is also applicable to translucent and opaque devices and microstructures).

The second masking film 152 and excess deposited materials are peeled off in a final stage 146.

The pattern of laser etching is chosen so that the process results in an array of isolated devices. Connections between the devices in the array may be made at a later stage, as appropriate to whatever application is desired.

Further details of this process will now be described.

The equation for a transparent thin film Transistor is:

$$I_D = (\mu)(\epsilon_r \epsilon_0/d)(W/L)(V_G - V_D/2)(V_D)$$

where:
$I_D$ is the output current, the larger the better;
$\mu$ is the semi conductor layer property;
$\epsilon$ represents gate dielectric layer properties;
W/L represents the patterning resolution;
and $V_G$ and $V_D$ are application device control voltages.

The semiconductor layer of the TTFT has a high mobility or μ. This leads to a high output current, from the equation above, and also a high device frequency ($f_{MAX} = \mu V/L^2$). The semiconductor layer also has a low bulk conductivity σ. The bulk conductivity determines output current on/off switching ratio, ($\sigma_{Semic} = ne\mu$). Layer purity and the defect nature of the semiconductor layer are also important.

The TTFT also features high semiconductor mobility, including intraparticle (nanorod) conduction across the gate channel. The nanorods, wires, tubes, or string cages may be CUED CVD grown or grown by tectronics plasma spray or generated in a liquid process or chemical solution process. The structure may be single crystal like or a coated nanowire or similar structure that is itself single crystal in its grown form.

The TTFT has a high gate dielectric with low operating voltages. The TTFT has low semiconductor-gate insulator interfacial trap density, with a low threshold voltage and low sub threshold slope.

Many of these advantages are as a result of the use of zinc oxide which has excellent properties but has not been widely used previously due to difficulty in etching it and growing and depositing high (device) quality material.

Benefits of the TTFT, dependent upon the specifics of the method of manufacture, include:
1. Self-aligned structure;
2. Simple build;
3. Fault tolerant processing;
4. High precision device from low precision processing;

5. Isolate high-K gate dielectric;
6. Embedded structure;
7. Low-K contact isolation;
8. Selectable drain-source contact-semiconductor interface metalisation;
9. Simple access to the drain-source-gate contacts for inter-device connectivity;
10. Minimum number of processing steps and patterning stages;
11. Shaped ink containment microfluidic feeder reservoirs;
12. Built-in layer thickness control reservoir flow structure;
13. Easy source contact off-set;
14. Selectable hybrid manufacturing to suit cost-performance criteria;
15. Processing methods (such as SPS design and manufacturing methods) provides a means of integrating P and N type semiconductor based TTFT's into a single circuit;
16. P-N junction formation (a peelable mask process for a single charge device is also compatible with the use of more than one material in a multilayer structure to achieve p-n and p-i-n structures hence equivalence to CMOS technology);
17. CMOS equivalent technology;
18. Energy efficient logic processing circuits.

The important features of the peelable mask manufactured TTFT design include:
1. Top gate, staggered, thin film transistor configuration (a peelable mask process as described in this application can also be used to produce bottom gate inverse staggered and co-planar thin film transistor structures)
2. Self-aligned vertical structure;
3. Simple build using wide variety of processes and a generic patterning platform
4. Low temperature processing;
5. Fault tolerant processing;
6. High precision device from low precision processing;
7. Bandgap aligned high-k gate insulator;
8. Substrate semi-embedded structure; and a
9. Minimum number of processing steps and peelable masks.

In the search for a low cost low temperature (<100° C.) processing method that can produce a high performance transparent thin film transistor (TTFT) several factors must be resolved including:
1. Vertically aligned gate contact edges to drain-source contact inner edges;
2. Control of transparent semiconductor and gate insulator wide bandgap alignment;
3. Low interfacial defect density;
4. Low bulk defect density;
5. Lowest number of masking steps possible;
6. Manufacturing method compatible with a wide range of deposition processes; and
7. Device design compatible with a wide variety of build materials (thin film layers).

The transparent thin film transistor design proposed herein provides a device that addresses all of the above factors and establishes a cost effective manufacturing method that produces a high performance TTFT. Preferred features are as follows.
1. Auto-aligned peelable mask deposition window with drain-source contact spacing (contact edge alignment);
2. Serially located very wide bandgap ultra thin insulator acting a bandgap alignment adjustment layer;
3. High quality ultra smooth, ultra thin oxide growth surface (Controlled growth surface–minimum damage);
4. High quality ultra smooth, ultra thin oxide growth surface (Controlled growth orientation and optimised lattice matching for minimising stress-strain effects); such layers are used on both sides of the semiconductor to ensure that back and front conduction channels and associated interfaces are of the highest quality possible whilst also providing a controlled growth surface for the high-k gate insulator;
5. Peelable self-aligned masking method means TTFT requires 2 masks;
6. Peelable masking method is compatible with a wide range of liquid, vapour, and solid particle processes;
7. Wide range of liquid, vapour, and solid particle processes provides a very wide range of materials that permits the construction of all-inorganic, all-organic, or hybridised inorganic-organic devices even mixing liquid, vapour, and solid particle processes in one device manufacturing sequence.

There are many manufacturing alternatives which may be used with peelable mask technology. Some of these are outlined below:

Laser Patterning, Multiple Ink Jet Printed Layers

In this process laser etching is used to define microfluid flow channels that may be used with the regions of the TTFT. Device fluids from DoD-IJP are conveyed into placement tolerant reservoirs. Ink reservoirs provide droplet volume tolerant processing. The TTFT may, thereby, be essentially completely ink jet printed.

Off-Set-Laser Patterning-Sputtering-Inkjet

In this process off-set printing is used to provide pre-patterned drain-source contacts to a resolution of the order of 5:m. The laser patterning is also used for masked windowed delineation in situ. CFUBMSD is then used to deposit a semiconductor-insulator by layer. DoD-IJP is used to deposit isolation, insulation and conductive links to the X-Y addressing bus lines, if manufacturing a display.

Ink Jet-Laser Patterning-Sputtering-Inkjet.

DoD-IJP used to perform a continuous land of transparent contact metalisation which provides drain-source contact. Laser etching of this drain-source contact pattern and of a mask window is used. CFUBMSD is used to deposit a bi-layer semiconductor-gate insulator. DoD-IJP is then used to provide isolation and conductor pattern via a direct write printing process.

Inkjet-Laser Patterning-Dry Transfer Deposition-Inkjet

DoD-IJP is used to print drain-source contact lands. Laser etching is then performed to provide drain-source contact patterns and mask windows. Dry transfer printing (i.e. laser direct write forward transfer ablation) is then used to provide a self-aligned semiconductor-gate insulator stack. DoD-IJP direct write printing is used to provide isolation and conductor patterning.

Inkjet-Laser Patterning-Xerographic Deposition-Inkjet

DoD-IJP is used for drain-source contact land printing. Laser etching of drain-source contact pattern and mask windows is then carried out. Xerographic print deposition (i.e. dry transfer printing) of a self-aligned semiconductor-gate insulator stack then takes place. Finally DoD-IJP isolation is used for direct write printing of isolation and conductor patterns.

Figure 15A:
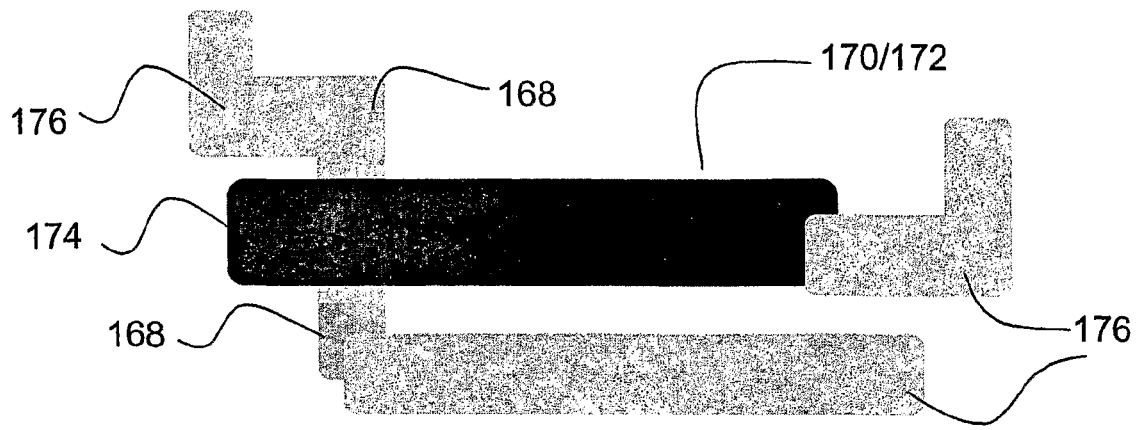
FIG. 15a shows schematically a top view of a bi-layer structure.
Figure 25:
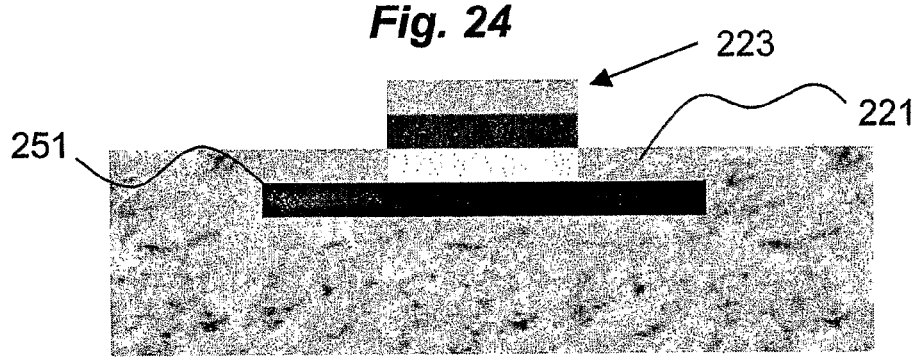
FIG. 25 shows schematically a cross-section through a transistor having a sub-surface deposited environmental barrier.
Figure 26:
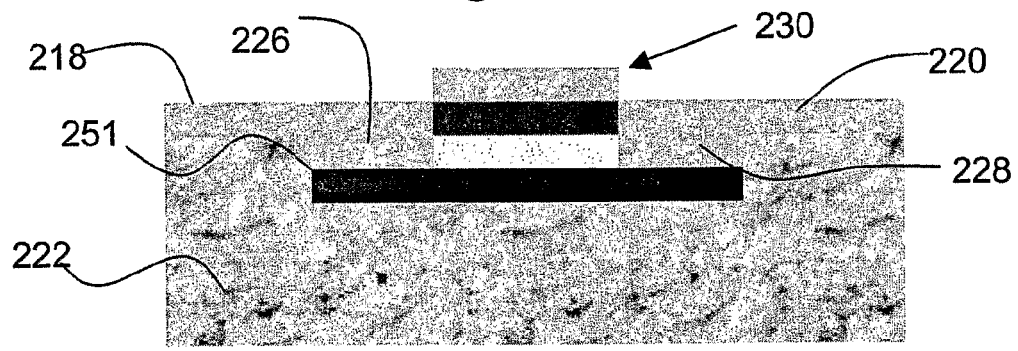
FIG. 26 shows schematically a cross-section through an addressable transistor having printed gate and data bus lines.

FIG. 15*a* shows a TTFT structure with TCO interconnects deposited. TCO drain-source electrodes 168 are 100 nm thick, a semiconductor layer 170 and a gate insulator layer 172 are 30 to 50 nm thick, and a TCO gate electrode 174 is 100 nm thick. An optional barrier coating (shown in FIGS. 25 and 26, FIG. 25 shows schematically a cross-section through a transistor having an environmental barrier; and FIG. 26 shows schematically a cross-section through a transistor having a sub-surface deposited environmental barrier) is 100 nm thick, and TCO interconnections 176 are 100 nm thick, also. In the embodiment shown FIG. 15a the gate electrode has been laid down separately from the semiconductor-gate insulator auto aligned bi-layer. If a bi-layer structure is used, the gate TCO metal may be printed onto the partially complete transistors, conveniently at the same time as interconnections are formed between them.

Figure 15B:
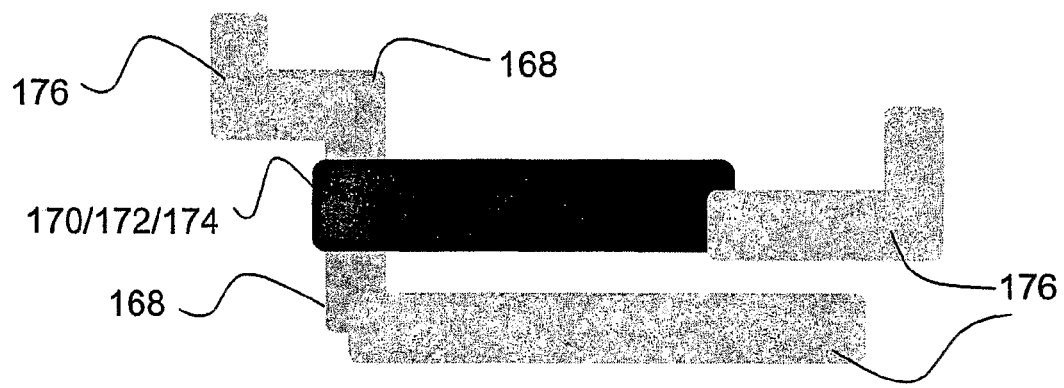
FIG. 15b shows schematically a top view of a tri-layer structure.

FIG. 15b shows a similar structure having a semiconductor-gate insulator-gate electrode aligned tri-layer. The semiconductor comprises an inner film, the gate insulator a middle film and the gate electrode an outer film.

Figure 15C:
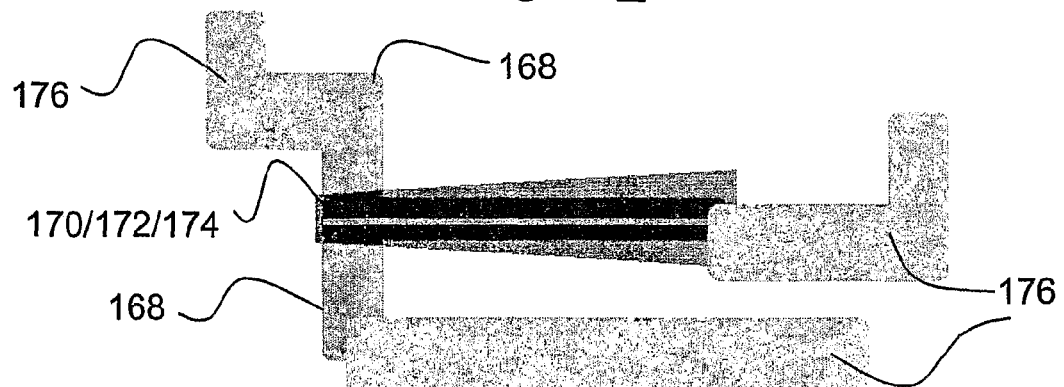
FIG. 15c shows schematically a top view of a tri-layer structure having an alternate shape.

FIG. 15c shows schematically how a tri-layer 177 may be shaped as a frustro-cone in cross section. As the narrower end of this shape is between the drain and source electrodes (which are connected to the drain and source layers). This shape minimises electrode overlap leakage, and leaves the wider end of the tri-layer available for inter-connect.

The tapered geometry deposition provides a means of achieving minimal leakage current and parasitic capacitance due to control overlap whilst providing a wider end section for ease of contact with a direct write interconnect.

FIG. 16a shows schematically a view of FIG. 14c with indication of alignment tolerances. The length of the structure, l1, is in the region of 500 μm, the length of the wider portions of the source and drain, l2 being in the region of 50 μm, the width of the gate structure, w, is less than 10 μm. The gate electrode, which is nominally in the middle of this structure, could be misaligned by ±25 μm whilst still allowing transistor action. It is advantageous to ensure that the drain source probing is defined so that the gate electrode is on the side that exhibits the lowest leakage field.

FIG. 16b shows schematically a transistor comprising a drain electrode probing pad 179, a gate electrode probing pad 181 and a source electrode probing pad 183. In combination with FIG. 16c it shows how voltage and current inter-relate across the transistor. Such a transistor will have field effect mobility in the region of >0.5 $cm^2V^{-1}s^{-1}$, a threshold voltage in the region of <3V, a pre-threshold swing of in the region of <1.5 volts per decade and a switching on/off ratio of in the region of $10^5$ to $10^6$. The chain dotted line A shown in FIG. 16c represents the maximum loci of the saturation drain current drive voltage, the solid line B represents the gate-source voltage.

Figure 17:
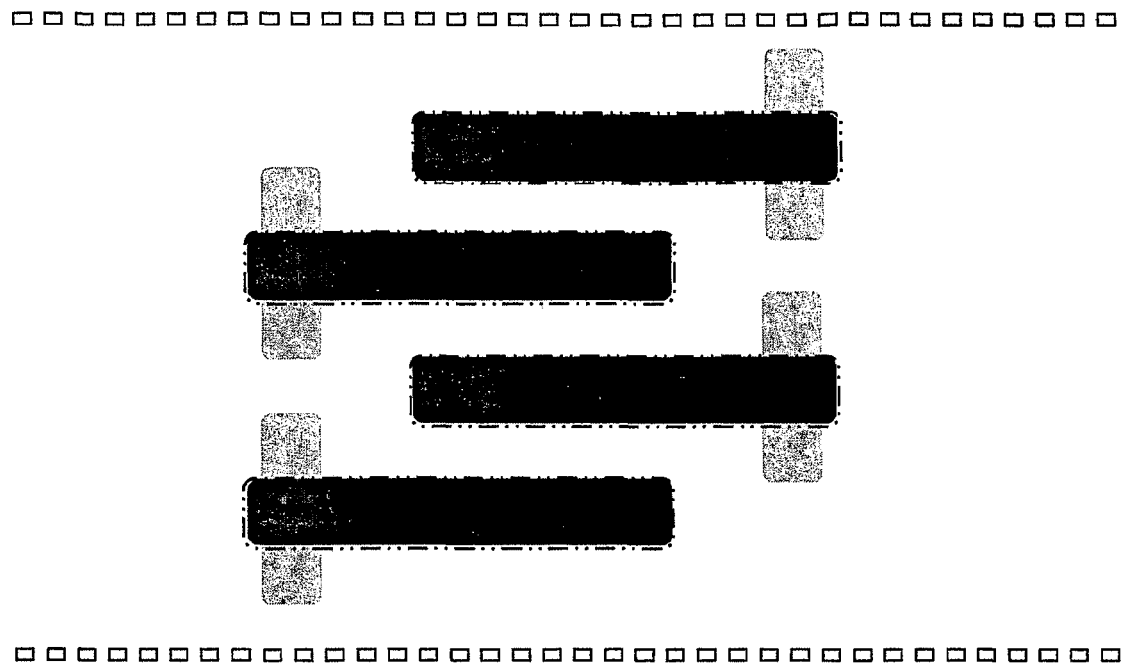
FIG. 17 shows schematically a view of a peelable mask having alignment markings.

FIG. 17 shows schematically a view of a peelable mask having alignment markings also called fiduciary marks. These markings can be used to align two masks being used in the same process with each other.

Figure 18:
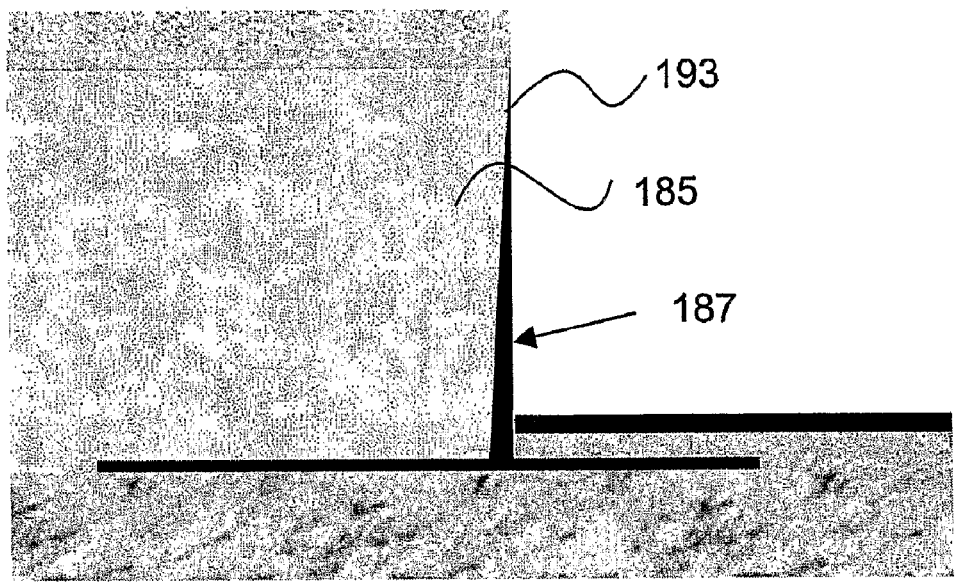
FIG. 18 shows schematically a cross-section through a peelable mask, the peelable mask having a straight edge.
Figure 19:
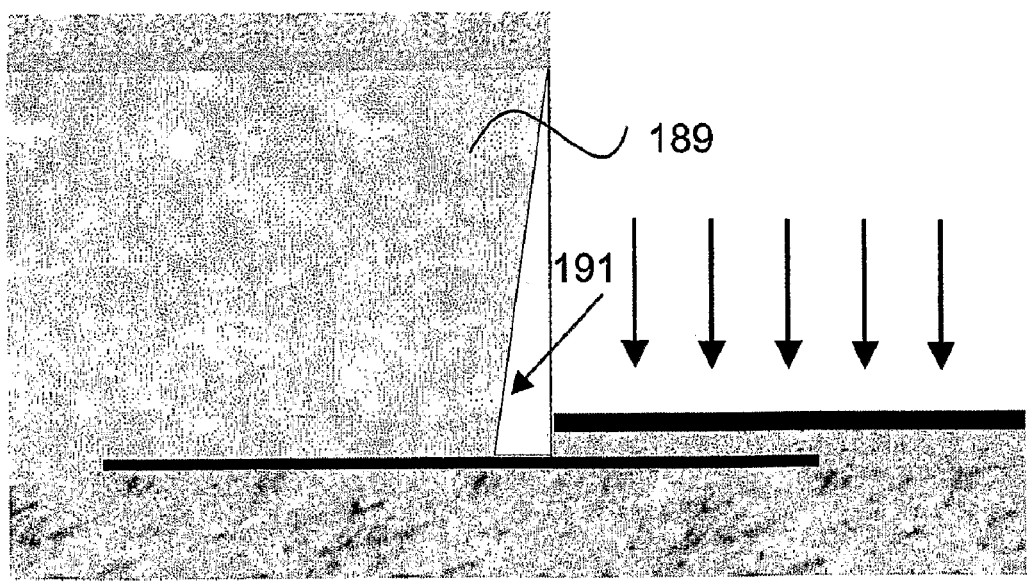
FIG. 19 shows schematically a cross section through a peelable mask during a fabrication process, the peelable mask having an undercut edge.

The marks comprise two generally parallel rows of squares, each row being adjacent an opposite edge of the peelable mask. They enable two masks to be aligned to better than ±20 μm in two perpendicular directions (X and Y axes). Alternatively or additionally, the alignment marks can be high tolerance sprocket holes for use in a roll-to-roll process that employs a drum feed that uses sprocket gear to both align and transport the plastic sheet Manipulation of a Section or Edge of a Peelable Mask FIG. 18 shows schematically a cross-section through a peelable mask, the peelable mask 185 having a straight edge 187, and, in contrast FIG. 19 shows schematically a cross section through a peelable mask 189 during a fabrication process, the peelable mask having an undercut edge 191. Deposition processes may cause a coating layer 193 to build up on the straight edge 187.

Since most deposition processes are not truly line-of-sight—that is they have a finite "throwing power" that can quite literally coat blind surfaces—it is preferable to alleviate such effects by producing a peelable mask that has a section that is to all intents and purposes screened from the deposit thereby permitting easier peel-off masking film removal. It is envisaged that such a structure can be achieved with a semi-permanent adhesive bond coated masking film that has also laminated onto it a removal UV reflecting structured plastic film as previously described. The adhesive bond may be etched away to increase the peelability of the film as previously described.

The UV reflecting structure acts to reflect laser beam energy at a controlled reflection angle so as to cause the exposed adhesive (glue) bond to be etched from the opposite side to which the laser is etching a deposition window into the masking film. The reverse-side masking film (actually the temporary adhesive bond coating) etching is achieved by making use of the regular array of UV reflecting structures on the reverse surface of the plastic (or glass) carrier film surface to direct the angle at which the reflected UV energy is returned toward the rear side of the masking film based on the thickness of the carrier film so that a known etch distance from the etched wall edge is achieved. The etched adhesive material is ejected into the etched channel (or well or trench) feature (lateral ejection occurs, without causing the masking film to lift) and is removed using powerful localised suction methods. If any of the etched adhesive bond material is re-deposited on the etched feature base then a subsequent clean-up pulse or pulses can be applied to remove such debris.

Although directional (line-of-sight) deposition processes are preferred it is still possible that small angular deviations in the substrate orientation, particularly so of flexible substrate media, might provide a means for the depositing film to coat the sidewall and mask-substrate etched interface whilst also not properly coating the drain-source electrode edges as exposed when the base contact land of material was dissected by the laser to produce the drain and source contacts and the gate channel, due to the set-up geometry of the deposition process and the masked substrate.

For a high performance device it is anticipated that the laser etched gate channel and vertically aligned stack mask will have a length dimension (gate length) of 1 μm. If one assumes that the mask thickness is also 1 μm this creates a 1:1 masking ratio (etched feature width to height ratio). In this case a small change in deposition direction can cause the drain-source spacing to not be fully coated leading to degraded thin film transistor operation. However, in the case of most of the preferred deposition methods such as magnetron sputtering the source is not a single point but a finite area and as such the coating is due to a finite range of angles as seen by the masked substrate and dependent upon the geometry of the deposition process set-up. This implies that there will be some coating of the masking film etched wall even for a highly directional process. This will be true to some degree for shaped etched walls that have been engineered to provide a form of undercut (such as that shown in FIG. 19) (base of the mask etched window is larger than its top) due to the partial resputtering of material by the energetic bombarding ions, although the magnitude of the resultant secondary coating will be substantially lower than that observed on the surface to be coated or than with a straight-sided wall.

Fully re-entrant (concave) etched features are also possible. These preferably use special processing or a customised masking film that comprises at least two co-polymers or laminated films that etch at different rates in the etching laser beam, with the fastest etching material being closest to the substrate surface. If the masking film comprises a base layer and a bonding adhesive layer then it is possible to deliberately etch/chemically attack the adhesive at the etching exposed interface so as to cause the bond line to be etched back under the base film, thereby creating a suitable peel-off undercut masking feature. It is possible to consider the production of a masking film that has a thin oxide or polymer overcoat or hard coat that etches at a slower rate to the bulk polymer onto which it has been deposited. Once again this would provide a means of creating a concave undercut.

Alternatively, dual wavelength single laser or dual laser processing could be used (co-incident beams aligned to better than 1 µm positional accuracy) to create a differential etching environment leading to concave etched wall features. Alternatively, a process that uses two aligned laser beam processes (or overlaid holographic patterns) could be used where the beams are present to the front and rear of the masking-substrate composite structure so as to receive additional benefit from the rear surface laser exposure even though this surface is not etched. A first laser, Laser A, is introduced from the frontsurface and a second laser Laser B, is introduced from the rear surface. Laser B is of a lower intensity such that it does not in itself etch but when it constructively interferes with Laser A at some specific point then the combined energy density introduces a controlled increase in the localised etching rate in the interference zone only. This method is of particular interest in producing aligned device features that require connecting via holes that pass from the front to the rear surfaces of the substrate material. It is also possible to use multiple frequency laser systems to create shaped microfeatures and via holes through the substrate and peelable masking film as required It is further possible to consider using the same etching process but at different etching pressures (with or without the introduction of supporting etch gases such as oxygen) to effect a concave undercut wall etched feature or specific shaping of the etched feature profile.

The shaping of the masking film etched feature wall is dependent upon a number of factors including: laser energy; laser wavelength; ambient environment chemistry; ambient pressure; masking film material type, chemistry, and laser wavelength absorption behaviour; masking film thickness; and laser beam shaping and focussing optics.

Laser Etching Effects

The reflective nature of the material directly below the coating to be etched, in respect of the wavelength of the laser light that is to be used to etch the masking film and underlying coating has an effect on the removal efficiency and resulting etch exposed surface quality. This is important for the transparent thin film transistor because for this microelectronic device an important surface is that which is left exposed after the ITO land has been etched (dissected) to form the drain and source electrodes. This exposed surface is where the growth control film must be deposited prior to the deposition of the ZnO semiconductor film. It is this semiconductor-growth control surface interface that is important as it needs to be smooth, clean, and defect-free if high quality devices are to be produced.

Cleaner and more abrupt etched film interfaces and etch exposed surfaces result from achieving good reflectivity at the etched film interface with the surface that is not etched (in effect the etch stop surface). With respect to (transparent) thin film transistor manufacture this means getting good reflectivity of the laser light (e.g. YAG 1,064 nm) at the adhesion (barrier) film—ITO (transparent) conducting oxide film interface. This coating specific wavelength reflective interface located underneath the transparent conducting oxide film (film to be etched) is desired in order to achieve a clean abrupt interface and can be achieved by:

- Depositing an adhesion promoter/barrier/semiconductor growth control multilayer/quantum layer stack where the optical properties of the stack affect the laser wavelength/energy reflectivity behaviour; and/or
- Controlling specific chemical composition of adhesion/barrier layer so as to provide a means of enhancing the optical reflective nature of this film at the adhesion/barrier film—ITO transparent conducting oxide film interface, via introducing optical reflectivity and refractive index changes.

Laser Beam Profile Effects

The specific nature of the YAG laser beam profile introduces a variation in the shape of the etched feature. FIGS. 45a to d show some examples of different profiles that can be achieved with different lasers and laser profiles.

Figure 45A:
FIG. 45a shows schematically a straight-sided trench.

FIG. 45a shows a tri-layer comprising a mask 700, a TCO layer 702 and a barrier layer 704. The trench etched into the mask and TCO layer by the laser has straight vertical walls being a "top hat" laser beam. Such a laser beam has high quality optics and homogenised laser beam cross-section. This type of trench provides excellent alignment but minimal contact area for semi-conductor-to-contacts. The semi-conductor layer will be laid down in the trench.

Figure 45B:
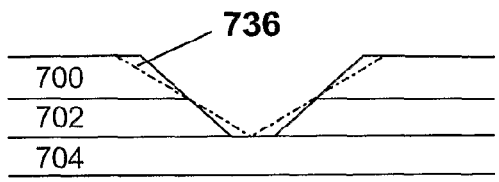
FIG. 45b shoes schematically a "V" trench.

FIG. 45b shows a "V" shape device which provides high current and speed performance. The device again comprises a tri-layer of the mask 700 a TCO layer 702 and a barrier layer 704 as shown by dotted lines 706. This "V" shape gives better coating coverage but only a slightly larger compact area. The average gate length is smaller than the mask opening. The width height of the V can be varied.

Figure 45C:
FIG. 45c shows schematically a "U" trench.

FIG. 45c shows a "U" shape in a tri-layer structure comprising a mask 700 a TCO layer 702 and a barrier layer 704. Such a shape has excellent alignment characteristics. It provides a base region to control growth of the semi-conductor layer and force the back conduction channel further away from the active device zone. Also the channel length may be longer to provide "off-state" conduction. This shape may have a thicker barrier layer to cater for etched depth into it. This gives control of actual length, extension of the back conduction channel even with the growth layer in place.

Figure 45D:
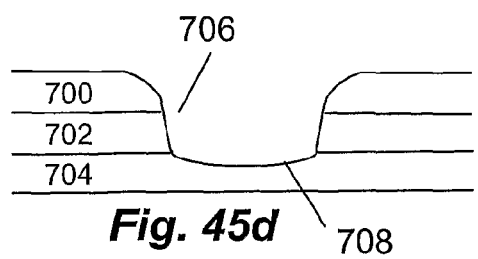
FIG. 45d shows schematically a variable sided trench.
Figure 45E:
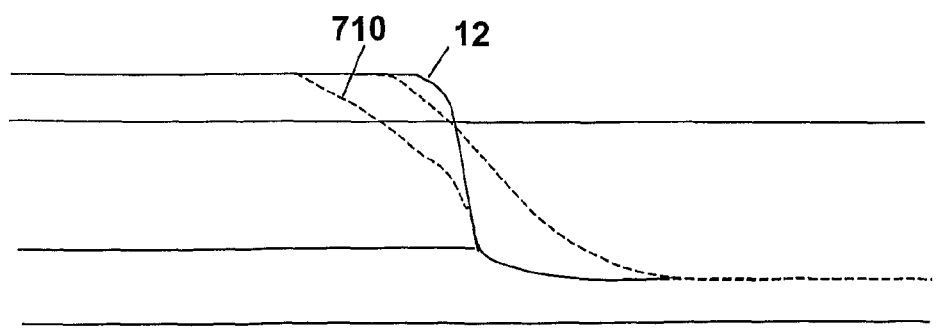
FIG. 45e shows schematically a wall of a variable sided trench in more detail.

FIG. 45d shows a variable profile shape as does FIG. 45e. The curved shape is etched into a mask layer 700, a TCO layer 702 and a barrier layer 704. Different profiles are shown in dotted lines. This off-set inverted "S" shape gives a profile which is easier to achieve using a typical laser. It is also easier to coat and gives a slightly larger contact area. The profile may be changed to affect a lower average gate length. For example using one of the dotted lines shown at 706 and 708 the profile could include breaking into the barrier coating below the TCO contact land. Further achievable profiles are shown in FIG. 45e. Profile 710 and 712 demonstrate that greater or lesser mask etch back can be achieved with this profile as can a variable TCO contact layer for any deposited semi-conductor layer. The barrier layer may have a variable thickness in order to provide the facility to etch into it. This may be used to do without a bandgap engineering layer because the thickness of the barrier layer can be used to control quality of the semi-conductor layer.

So, the etched well that is the gap (or transistor conduction channel gate length) between the dissected ITO transparent conductor land (leading to the formation of the transistor drain and source electrodes) that under certain conditions can be used to advantage namely:

- Electrode exposed surface shaping to achieve larger semi-conductor-to-electrode contact area in a confined space
- "V" shaped device that promotes higher current and speed performance "U" shaped device that provides a larger conduction path for the back conduction channel (reduce leakage current and off-state conduction behaviour) whilst achieving a short conduction path for the front conduction channel.

Figure 20:
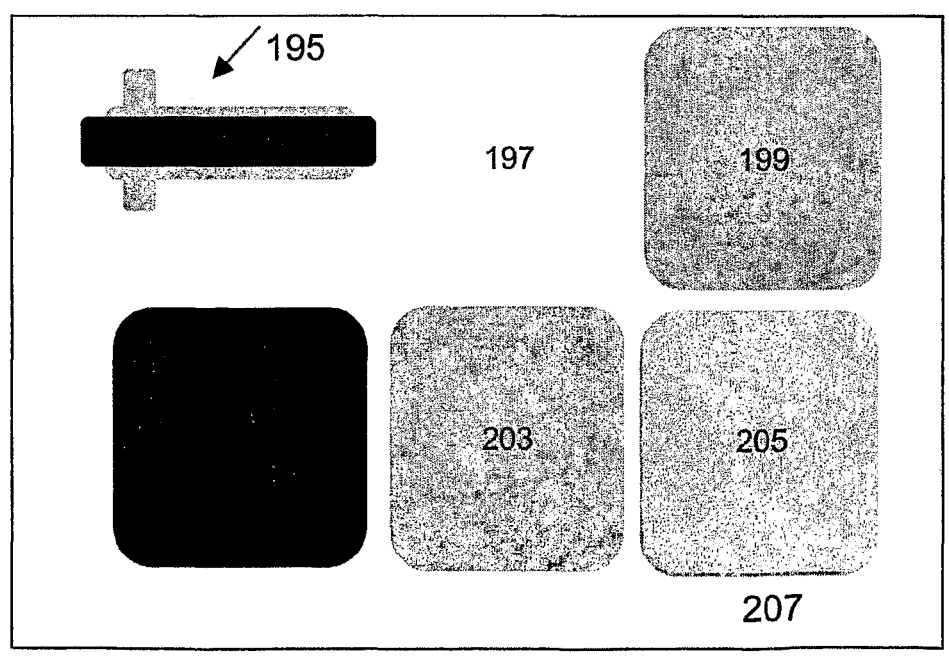
FIG. 20 shows schematically a test pad for optical transmission analysis.

FIG. 20 shows schematically a test pad for optical transmission analysis, which is particularly important for the manufacture of transparent transistors. Large scale deposits of different materials under test are made. The optical properties of different materials, different combinations of materials, and different thicknesses can be tested thereby. Materials shown in FIG. 20 include a CV-TFT (CV here means Optically Clear View or See-Through) test transistor 195, a single layer of zinc oxide semiconductor 197, a single layer of silicon or hafnium or titanium dioxide gate insulator 199, a single layer of ITO drain-source electrode material 201, a single layer of ITO gate electrode material 2031, and a multi-layer test pad 205. The multi-layer test pad provides optical transmission analysis for a layering structure equivalent to a complete device. The materials are laid down on a clear plastic or glass substrate 207.

Selectable Interconnect Array Integrated Circuit

In order to achieve low cost, high performance integrated circuits that exhibit stable operation at high speed, high voltage, and high current it is necessary to produce a core thin film transistor device using high quality materials and processing methods. The materials and processing methodology affect the overall performance and to some extent the cost of the finished integrated circuit.

An approach which reduces manufacturing cost is to produce a non-assigned and non-connected standalone set of transistors and support components such as diodes, resistors, and capacitors in a repeat array such that application-specific integrated circuits (ASIC's) can be produced by selecting the interconnection pattern (2-D in-plane and/or 3-D multiplane build) and method of producing the interconnect such as with digital ink jet printing or laser dry transfer printing. This method of integrated circuit construction is hereinafter termed "Selectable Interconnect Array" (SIA) Technology with the device being termed a "Selectable Interconnect Array Integrated Circuit" ($SIA^{IC}$).

The objectives behind producing standalone devices using this peelable mask manufacturing approach include:
1. Facilitating peel-off with a continuously connected masking film. Since the devices are not interconnected there is no section of the masking film that is left as non-connected islands of material or is potentially weakened to the point that islands of masking film might be left behind as the masking film is peeled-off in a continuous sheet format;
2. Producing an array of equivalent devices and/or circuit building components, such as transistors, diodes, resistors, capacitors, etc., this means that a high volume throughput of a standard product can be produced invoking economy of scale considerations. Individual circuit designs are catered for by introducing a repeat array of selectable device and component designs that permit device redundancy and flexible 2-D and 3-D circuit manufacture because the individual devices and components can be interconnected using low cost direct write methods such as digital ink jet and laser dry transfer printing to achieve 2-D and 3-D device interconnectivity. The choice of direct write or alternate interconnect method depends upon the resolution of the circuit required to support the application but would include:
   Digital ink jet>15 microns
   Forward transfer laser>5 microns
   Offset lithographic printing>5 microns
3. Have a laser etching process that has a large placement error tolerance brought about because of the top gate thin film transistor design. This means that processing errors can be much reduced leading to higher tolerance devices in large area array formats.

FIG. 21 shows schematically an embodiment of an array 200 of semiconductor devices 202. Each semiconductor device is a transistor comprising a gate, a source, and a drain. Each device 202 is electrically and physically isolated, there being no interconnections formed on a substrate 204 on which the devices are disposed. The array 200 is a regular array formed of equally spaced rows and columns. It is programmable, in that if the devices are interconnected in different ways, the two initially identical arrays will perform very different functions, and be suitable for different applications.

FIG. 22 shows schematically an embodiment of an intregrated circuit comprising the array of FIG. 21. Interconnections 206 are directly written, at multiple levels within the structure, between different devices in the array. Insulation pads (that can also be written in a selectable manner) 208 are used to connect to a tri-layer stack 210 (as hereinabove described) to lessen the risk of a stack short-circuit.

The specifics of the device-to-device inter connections, and, of the devices themselves, defines the circuit function. Examples of circuits which may be manufactured in this manner include radio-frequency identification devices (RFID), or digital (low or high frequency and analogue circuits also possible) logic circuits. Conveniently the semiconductor devices in the array are staggered top gate transparent thin film transistors (but could also be inverse staggered or co-planar configurations).

Such transistors are of use in one preferred application, a display. FIG. 23 shows schematically views of a further example of an integrated circuit comprising the array of FIG. 16, and making up a display; FIG. 23a shows schematically an overview of the array; and FIG. 23b shows schematically a single pixel.

Each single pixel 210 comprises a transparent thin film transistor 211 and associated drive circuitry. A high capacity storage capacitor 212 and a large contact pad for display media 214 are connected by device interconnects 216. The device interconnections extend to other layers in the structure through vies 218. Such an array can form an active matrix display in which the array comprises a transparent backplane or Frontplane (and includes the capability to have dual back- and front-planes that can be interconnected so as to provide for the construction of more complex circuitry.

Figure 24:
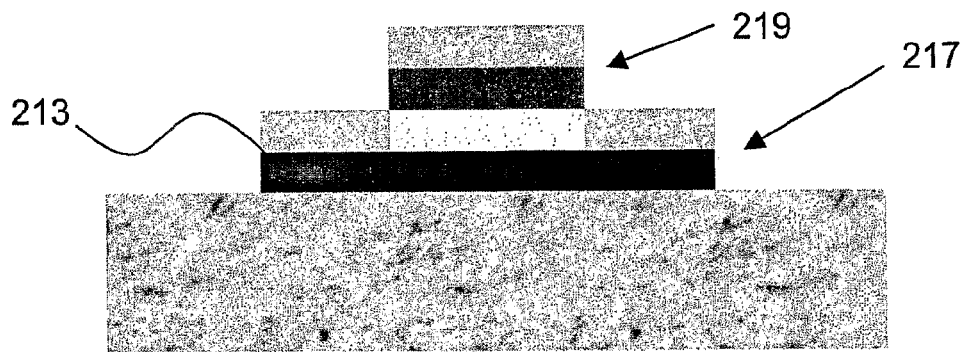
FIG. 24 shows schematically a cross-section through a transistor having an environmental barrier.

Possible structures for such transistors are shown in FIGS. 24 to 28. FIG. 24 shows schematically a cross-section through a transistor having an environmental barrier 213, and FIG. 25 shows schematically a cross-section through a transistor having a sub-surface deposited environmental barrier 215. Either would be suitable for use in a display. The barriers 213, 215 are typically made of a glassy oxide. They are laid down adjacent to a substrate.

The transistor shown in FIG. 24 comprises an auto-aligned bi-layer stack 217 and an autoaligned tri-layer stack 219. The bi-layer stack comprises the environmental barrier layer and a drain-source electrode layer. The tri-layer stack is as described hereinabove.

The transistor shown in FIG. 25 comprises a sub-surface deposited environmental barrier 215, drain-source contacts 221 and a gate channel 223. There is no gate to drain-source contact overlap thereby minimising leakage current and parasitic capacitance effects. The environmental barrier 215 limits: thermal expansion mismatch and associated micro and nano cracking; and bending stress induced strain in the TTFT device. The barrier 215 also gives better adhesion control. Having embedded barrier and drain-source and semiconductor layers provides greater mechanical protection during flexing of a plastic sheet substrate.

A high density glassy oxide environmental barrier is also preferred because it acts as gate channel laser etch stop (when suitably designed to give the required laser light reflectivity behaviour) and as protection against ingress of moisture and oxygen. Such a layer provides a stable surface to deposit TTFT on to and can beneficially influence crystallography of device layers (this is clue to surface energy control of the depositing adatom transport on the growth surface—the surface energy control is achieved by surface relief and smoothing effects, including nanoscale planarisation and surface defect repair or decoration, brought about by the laser interaction on the barrier growth during the transparent conductor land dissection. Such a barrier may have a number of different structures: it can be based on quantum or superlattice multilayer structure to enhance barrier performance; can be nanoparticle-dispersed polymer+inorganic coating multiple layer stack; and can be a thermally isolating or dissipating or spreading material. FIG. 26 shows schematically a cross-section through an addressable transistor which could be used in a display, having a printed gate line 220 and a printed data bus line 218. The gate bus line 220 and data bus line 218 are disposed generally orthogonally on a flexible substrate 222. The transistor comprises a sub-surface deposited environmental barrier 224 and subsurface drain-source contacts 226, 228 and gate channel in which a tri-layer stack 230 has been deposited.

Figure 27:
FIG. 27 shows schematically a cross-section through a transistor which comprises a single pixel element of a display.

FIG. 27 shows schematically a cross-section through a transistor which comprises a single pixel element of a display, and has large cross-section TCO data lines 232 and gate lines 234. These lines are sub-surface deposited. They provide low resistance long length transparent conductors. An environmental barrier layer 236 provides isolation at the transistor. The boundary line of the single pixel is outlined in a chain dotted style.

FIG. 28 shows schematically a cross-section through an alternative transistor 238 which comprises a single pixel element of a display. In this structure a data bus 240 and gate bus 242 are separated from the transistor 238 by a substantially thickness of flexible substrate 244. This deep isolation minimises electrical cross-talk via bus lines. Connection between the bus lines and the drain or source or gate are provided by bus bar access vias 246. These are laser etched and printable conductive links. Both laser etch then direct write processing, such as ink jet printing, can be used, preferably together to in-fill the resulting via hole to provide a conductive column. Such links extend through the substrate 244 and any environmental barrier layer 248. A further isolation layer 249 provides isolation between the data bus and the gate bus.

FIG. 29 shows schematically views of a further structure which includes a pixel element 250 of a display, defined by address lines 252 and data line 254. The lines comprise offset lithographic printed bus bars. They are in the region of 5 μm to 10 μm wide. FIG. 29*a* shows schematically a top view; and FIG. 29*b* shows schematically an electrical diagram. An integrated liquid crystal capacitor 256 is incorporated into the layers structure of the device. This comprises a layer of insulator, a layer of ITO film, a layer of liquid crystal, and a further layer of ITO film. The capacitor may be formed at the same time the process of fabricating the transistor. A peelable mask manufacturing process is suitable for the fabrication of either or both.

FIG. 30 shows schematically views of a structure during the process of manufacturing a display. The process comprises a combination of printing and vacuum deposition and uses peelable mask technology. FIG. 30*a* shows schematically a substrate 300 comprising a single active matrix pixel display area 302 of 300 micrometers by 400 micrometers. Structures of many different scales can be created by the process described in this application, form very small (microns) to very large (cm) scale, for example display pixels and microelectronic, opto-electronic, and photonic devices and structures.

Figure 30A:
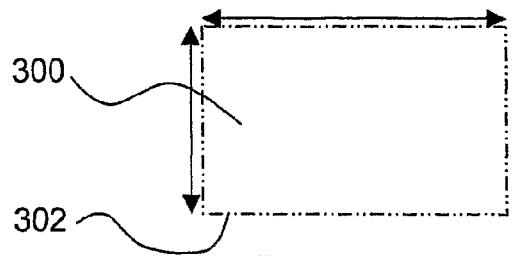
FIG. 30a shows schematically a substrate.
Figure 30B:
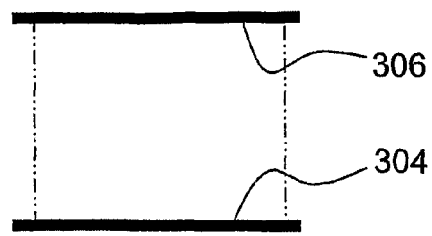
FIG. 30b shows schematically a substrate with deposited electrodes and bus lines.

FIG. 30*b* shows schematically a top view of substrate with deposited electrodes and bus lines. A gate bus line 304 and a storage capacitor line 306 are deposited as generally parallel lines at opposite sides of the pixel display area. The lines are generally parallel to the limits of the display area.

Figure 30C:
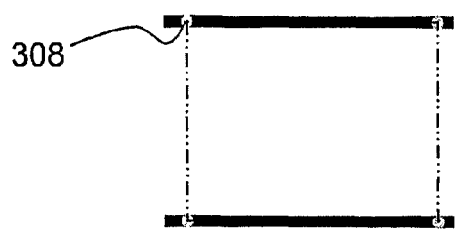
FIG. 30c shows schematically addition of interlayer isolation.
Figure 30D:
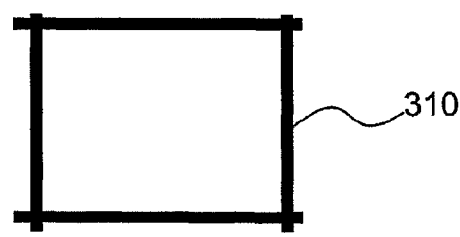
FIG. 30d shows schematically addition of data bus lines.

FIG. 30*c* shows schematically addition of interlayer isolation. Isolation pads 308 provide isolation between the gate bus line 304 and data bus lines 310. FIG. 30*d* shows schematically addition of data bus lines 310.

Figure 30E:
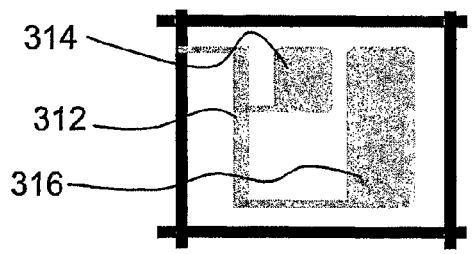
FIG. 30e shows schematically deposition of contact pads.

FIG. 30*e* shows schematically deposition of contact pads. A drain-source contact land 312 is deposited, a capacitor base contact pad 314 is deposited and a display element base contact pad 316 is deposited.

Figure 30F:
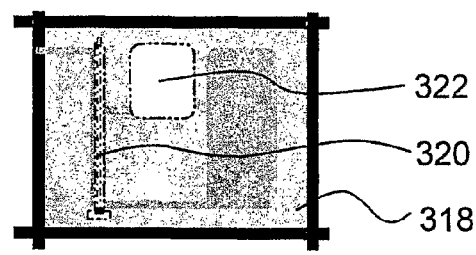
FIG. 30f shows schematically deposition of a masking film.

FIG. 30*f* shows schematically deposition of a masking film 318. The laminated peelable masking film 318 has a very thin cross section and bonds to the substrate 302 electrostatically. A laser etching process is used to create drain-source contact spacing definition 320 and to open masking film deposition windows 322.

Figure 30G:
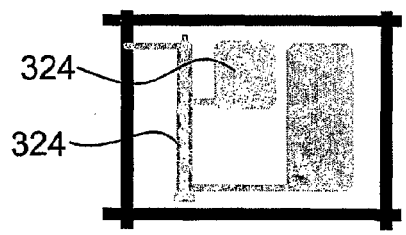
FIG. 30g shows schematically deposition of a semiconductor, a gate insulator and a gate metal.
Figure 30H:
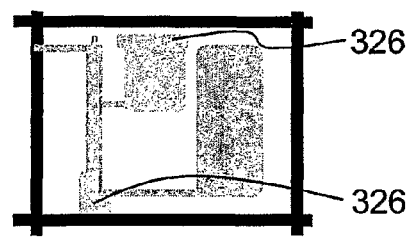
FIG. 30h shows schematically deposition of printed edge insulation land.
Figure 30I:
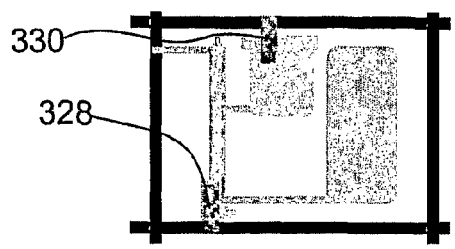
FIG. 30i shows schematically printing of a gate bus line and a storage capacitor.
Figure 30J:
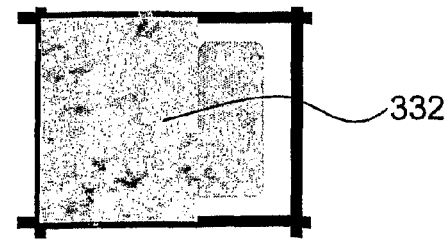
FIG. 30j shows schematically printing of interlayer insulation.

FIG. 30*g* shows schematically deposition of a tri-layer 324 comprising a semiconductor, a gate insulator and a gate metal. The masking film is removed following deposition using a peel-off action onto a take-off roller.

FIG. 31*h* shows schematically deposition of printed edge insulation land 326. This assists in elimination of edge short circuits when link connections are printed.

FIG. 31*i* shows schematically printing of a gate bus line connector 328 and a storage capacitor line connector 330. There are top electrode link connectors and use an on-gate method of connection.

FIG. 31*j* shows schematically printing of interlayer insulation 332. This is laid down between the transistor/capacitor and the display material base electrode.

Preferably the electrodes are formed using direct write methods such as ink-jet printing. The electrodes may comprise a thin film portion and an ink-jet printed portion which may be termed a flexible conductive link or FlexCLink, the ink jet printed portion being laid down when the interconnections are made. A number of interspersed thin film portions and ink jet printed portions may make up the electrode. The provision of ink jet printed portions means that the electrode is far more flexible than conventional electrodes, which is important in applications such as digital paper.

FIG. 31 shows schematically views of a further structure in a further application, being an inverter circuit. FIG. 31*a* shows schematically a top view; and FIG. 31*b* shows schematically an electrical diagram. A drain resistor 334 is connected between a supply voltage electrode 336 and an output voltage electrode 338. An input voltage electrode 340 is connected to a gate, and a ground electrode 342 is connected to a source.

Optional reticulation trench 366 may be provided to either side or indeed on any or all sides of the transistor as shown in FIG. 32*c*. This trench is laser etched, generally parallel to the electrode trenches. The trenches assist substrate deformation. Such trenches are particularly useful if the substrate is flexible. The trenches can be optionally filled with a damping material such as a compliant polymer (silicone or semi-hard clear polyurethane or similar) to assist flexural stability during operation without reintroducing significant mechanical stiffness.

FIG. 32 shows views of an embodiment of co-planar in-line structures produced by a fabrication process: FIG. 32a shows schematically a top view of a structure during the process. The structure shown in FIG. 32a is a transparent thin film transistor 350. The transistor comprises a drain 352, a source electrode 354, a environmental barrier/insulator layer 356, a semi-conductor layer 358 and a gate electrode 360 the substrate in which the transistor is formed is preferably made of PET, or PEN or thin glass. The substrate material may be in rigid or flexible (conformable) formats. The width of the semi conductor channel is indicator by CW on the figure and the channel length CL. This transistor may be made using a peelable mask process substantially as previously described.

As shown in FIG. 32b three generally parallel trenches 362 are laser etched into a substrate 364. Drain source and gate electrodes are deposited in the trenches the semi conductor-conductor layer 358 is deposited on top of the gate contact 360, and the environmental barrier layer is deposited such that it covers all three electrodes.

FIG. 32d shows schematically a dual gate-drain transparent transistor. An increased width-2-length ratio may be obtained using command gate and drain electrodes, as shown. FIG. 32e shows schematically a cross-section through FIG. 32d as may be seen from these figures, this transistor comprises two gate electrodes 368 and two drain electrodes 370 and a single source electrode 372 which is positioned generally centrally. All electrodes are generally parallel. By spacing drain electrodes 370 each side of gate electrode 368 and gate electrode 368 each side of the source electrode 372 the channel width is, effectively, quadrupled, whilst the channel length is only doubled.

FIGS. 32f and 32g show respectively a cross-section through and a top view of a dual gate-drain transistor having an alternate design. The gate electrode 374 has its fill reservoir end at the same end of the transistor as the drain electrode, and the connection pad for the source electrode is at the opposite end of the transistor as shown in FIG. 32g.

Figure 33:
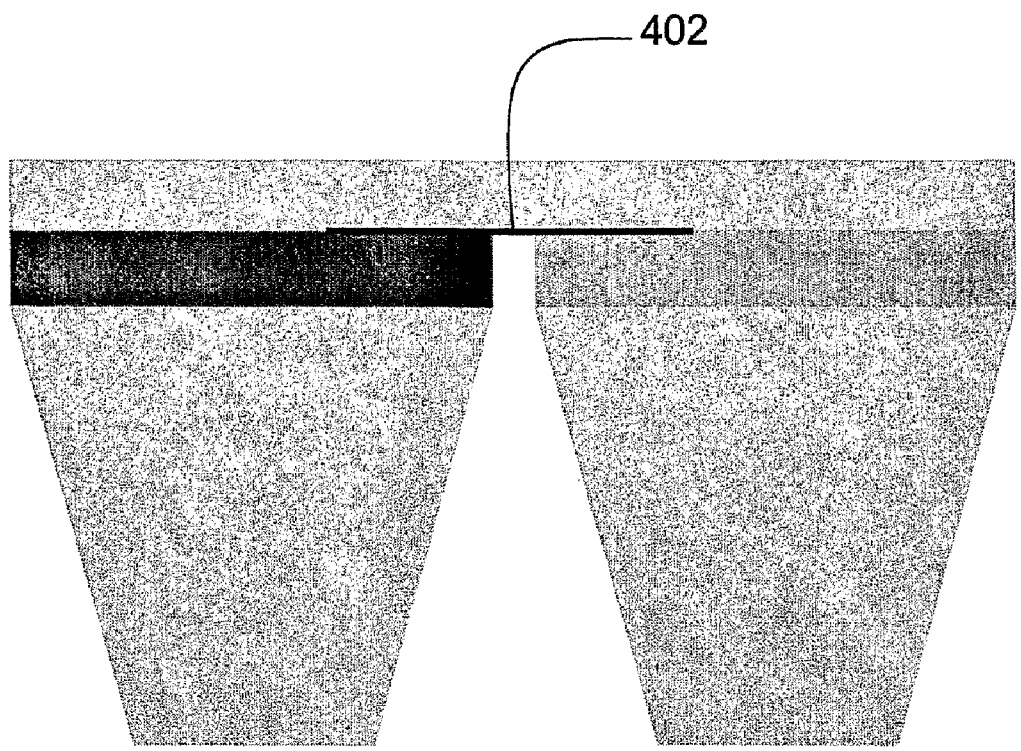
FIG. 33 shows schematically a cross-section through deposited elements of a thin film transistor, indicating a band-gap alignment layer.

This transistor operates as a coplanar thin film transistor the device configuration shown. This configuration makes use of the fact that all the electrodes are on the same side of the semiconducting film and as such manipulation of the individual connections to such a layer make for a wide range of device behaviour including high voltage by virtue of modifying the spacing between the gate to source electrode trenches FIG. 33 shown schematically a different type of transistor design, in which there is only one gate electrode that is positioned at the bottom of the common gate channel trench and into which each of the 3 reservoirs flows. This means that for the 3 layer stack of gate electrode, gate insulator, and semiconductor may be precisely vertically aligned thereby minimising/eliminating gate-to-drain/source electrode leakage current and parasitic capacitance. To manufacture such a transistor a ITO train/source conductive film 380 is first laid down on a substrate 302 a trench is then laser etched through the film, through a peelable mask and through the substrate. A vertically aligned tri-layer comprising a gate electrode 384, a gate insulator layer 386 and a semi-conductor layer 388 is then laid down in the trench. The semi-conductor layer can be confined to the trench at a height equivalent to the drain source electrodes or can be deliberately permitted to flow over both drain and source contacts. An optional protective film 390 may overlay the structure.

FIG. 33c shows schematically depths of the tri-layer trench. A step etched structure is used with depths to suit the required film thickness. A feed-in channel is also shown 392. This device operates in the same manner as a bottom gate thin film transistor the only difference is the method used to produce it. In this case it can be produced using liquids or inks based on low viscosity fluids (typically less than 100 mPa·s).

FIG. 33d shows schematically how a tri-layer stack may be built up from a simple cross over structure. A gate layer 394, a insulator layer 396 and a semi-conductor layer 398, all being generally rectangular, are laid down at an angle on a substrate such that they cross over at a square shaped central point 400.

This structure is advantageous because it permits the correct sequencing of the gate electrode, gate insulator, and semiconductor materials into a single trench so as to provide a low cost all printing or liquid processing manufacturing method of a thin film transistor with low leakage current and parasitic capacitance An in-line structure such as that shown in these figures provides self-levelling embedded contacts. Laser etched cavities shown in these drawings can be produced as smoothly varying structures as in a corrugated roof. A transparent thin film transistor can be manufactured in this way.

Figure 46:
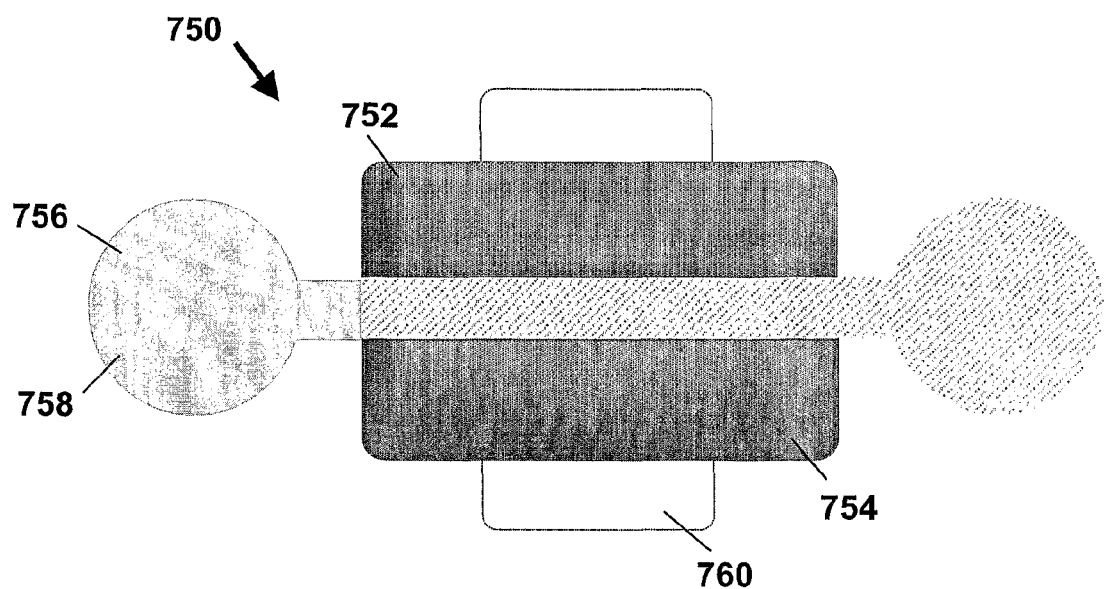
FIG. 46 shows schematically a transistor with reservoirs.

This embodiment outlines a method of manufacturing a transparent thin film transistor (TTFT) that makes use of laser etched or embossed microfluidic structures that are defined in a peelable masking film. One such device is shown in FIG. 46. The device 750 is a bottom gate inverse staggered thin film transistor that makes use of two fluid reservoirs to control the flow of fluid dispensed into them by an ink jet printhead. One reservoir is embedded in the substrate, the other is introduced in the peelable mask and is removed when the peelable mask is removed. The embedded reservoir contains the gate contact material and is left in place to act as a gate contact pad. The other reservoir contains semiconductor and insulator material. The reservoirs are so displaced in position and depth that a sequencing of the fluids is achieved that permits the construction of a self-aligned thin film transistor in both opaque and fully transparent forms.

FIG. 33a shows a similar device having three independent reservoirs 384 386 and 388. Each reservoir may be a different depth if necessary.

The method of producing the device 750 comprises laser etching stripes of a transparent conductive oxide (TCO), such as Indium Tin Oxide (ITO), to form discrete pads 752, 754 of transparent contact material pre-deposited on to a sheet of glass or plastic (the glass or plastic being either rigid or conformable in nature).

During the delineation of the contact lands of ITO the "Embedded gate contact" ink reservoir 756 and contact pad 758 is also etched. An optional facility during this first etching step is the introduction (laser direct write etching) of an embedded ink reservoir 760 that is produced adjacent to both the drain and source contacts so as to provide a proximity alignment for the inaccurately placed ink jet printhead droplets to ensure an efficient connection between the interconnection tracks between adjacent isolated device contacts and the device contacts to be connected therein. This contact related containment well 760 also serves the purpose of providing a liquid containing structure (reservoir) for a barrier height adjustment material/coating so that normally inefficient or poorly electronic barrier height aligned materials, that are better in other respects (i.e., electronic conductivity or electro-optic transconductivity in a specific waveband), can be used separately for the device contacts and the device-to-device or device-to-component interconnection bus bars or connecting links.

Figure 47:
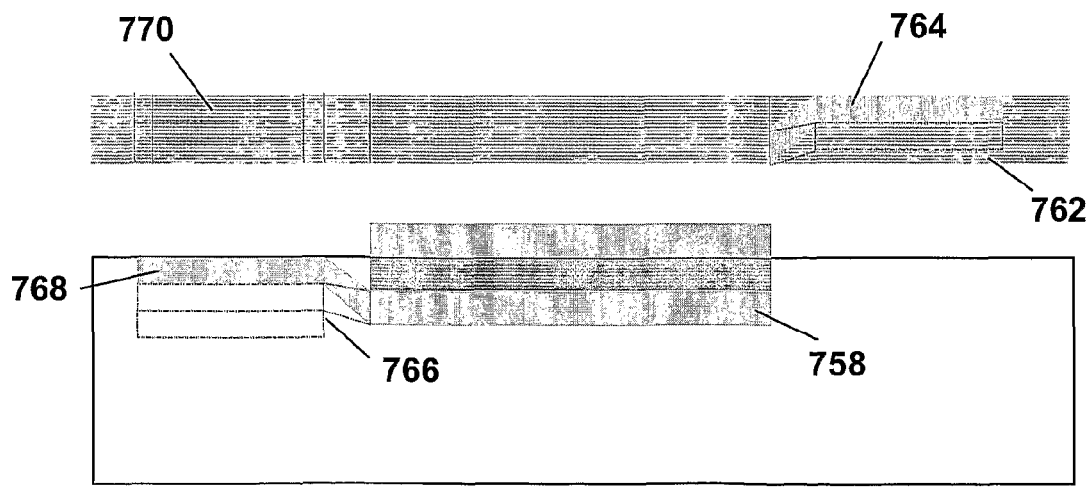
FIG. 47 shows schematically a transistor and peelable film, both having reservoirs.

A masking film 762 as shown in FIG. 47 is now applied to the upper surface of the substrate material into which has been etched the embedded gate contact/land reservoir and on which is contained the bisected ITO land (drain and source contacts in the finished thin film transistor). This masking film 762 is applied over the whole of the substrate upper surface using electrostatic or semi-permanent interfacial bonding methods. The laser etching system provides a means of mask patterning that can easily register onto the ITO contact land covered by the masking film. Into this masking film and through the ITO land below is etched a trench that bisects the ITO contact to form two individual electrodes (the drain and source contacts). This trench is extended in one direction into the previously etched gate contact reservoir 768, embedded into the substrate media, using variable height and etch rate (number of pulses) to control the geometrics of the interconnecting duct. This trench is also extended in the other direction into a newly etched semiconductor layer reservoir 764 (completely contained within the masking material) once again using variable height and etch rate (number of pulses) to control the geometrics of the interconnecting duct. This interconnecting duct geometry influences the amount of liquid that is transferred from the reservoir into the microfluidic gate channel and hence directly affects the thickness of the resulting device film (selected device build layer) once the liquid has dried/solidified.

The location of the device trench break through into the gate contact and semiconductor containment well reservoirs is not critical since the liquid will still flow, via the connecting duct, into the main device microfluidic channel (gate channel) to provide the necessary uniform coating.

FIG. 47 shows a variable shaped interconnection duct 766 between a gate contact reservoir 768 and a gate channel region where an aligned gate electrode bottom contact is disposed. The figure also shows a variable depth reservoir containment well 768 with a corresponding laser etched access window 770 in the masking film. The access window can be appreciably smaller than that shown and still provide adequate access to fit within the reservoir even allowing for the tolerances and variable accuracy of procedures such as digital ink jet printing. A variable depth semi-conductor reservoir 764 is laser etched into the masking film 762 only.

A direct write processing method such as digital drop-on-demand ink jet printing can be used to apply one or more droplets of ink into the appropriate reservoirs to produce the required gate contact—gate insulator—semiconductor vertically aligned stack. Where the embedded gate contact reservoir, etched into the substrate, remains in place and serves the secondary purpose of providing a device-to-device or device-to-component or external connection contact pad once the remaining liquid has dried/solidified.

It is envisaged that in using digital or continuous selectable drop-on-demand ink jet printing technology that a monodispersed droplet stream (jet) comprising individual droplet volume in the range 0.001 picoliter to 100 picoliters will be used in relation to the filling of the laser etched reservoirs. This means that droplets of mean diameter 1.24 microns (0.001 picoliter) to 57.6 microns (100 picoliters) will interact with the etched reservoirs and will provide a feed liquid for the construction of the required thin film transistor.

For the purpose of illustrating how a transparent transistor can be produced using digital ink jet printing (includes multiple level greyscale printhead technology) a 10 picoliter (26.7 micro meter diameter) droplet will be used. Since the transistor to be constructed is transparent it is possible to consider building a very different scale of device when compared with conventional opaque structures. In order to illustrate this we will take as our representation demonstration product an approximately 1 meter wide by 0.56 meter (16:9 length:height ratio) high flexibility (conformable plastic substrate media such as Melinex [polyethylene terephalate, PET]) colour display active matrix backplane where the display media is liquid crystal technology (including transmissive, reflective, or transreflective) that requires a switching circuit comprising a single thin film transistor and associated storage capacitor. Each display pixel comprises three individual colour pixels for red (R), green (G), and blue (B). Since this display panel is for large viewing distance (of order 2 meters or more) applications, such as colour video playback posters for upcoming film and product sales advertisement in cinemas or Blockbuster stores, etc., it is possible to use a large area tri-colour pixel of order 1 mm square. The large pixel actually comprises 3 individual pixels (for RGB colours) of geometry 1 mm in length by 0.33 mm in width (including isolation spacing between pixels).

For clarity we will continue our manufacturing illustration by looking at a single colour pixel of overall size 1 mm by 0.33 mm. Since the switching circuit is completely transparent in the optical waveband range of wavelengths it is possible to use large and complex geometry structures in the circuit manufacture irrespective of whether the manufacturing process is of lowest cost or not. This means that fluid reservoir/contact pad containment well structures can be used as part of the transistor fabrication scheme and that such features can be large in comparison to conventional opaque transistor technology.

Figure 48:
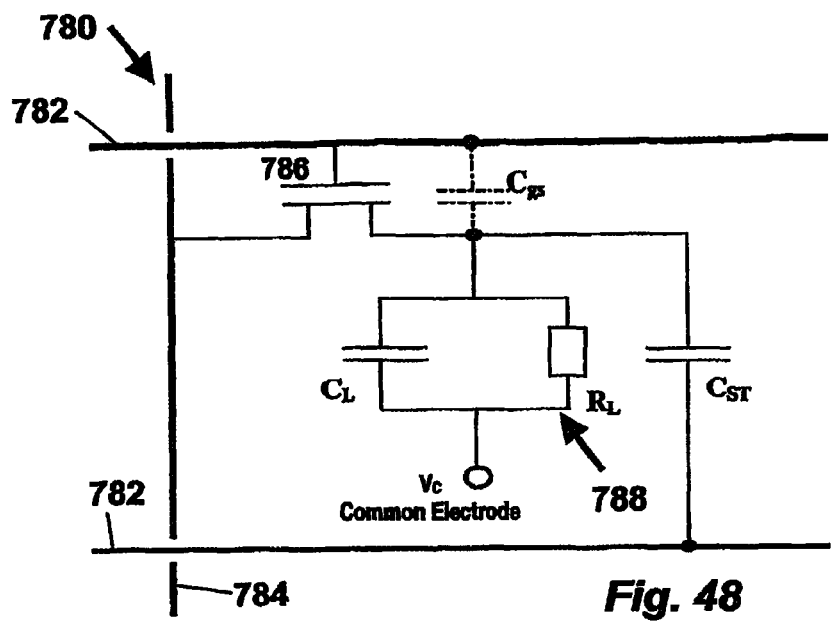
FIG. 48 shows schematically a circuit diagram for a single pixel of a structure.

The active matrix switch—transparent thin film transistor—shown in FIG. 48 is a three terminal highly non-linear switching device that possesses a steep threshold characteristic. Such a pixel is shown in insert G and is defined by eight lines 782 and a data line 784 the pixel also comprises a transparent thin film resistor 786 an LC element 788 a capacitor CST and, inevitably, parasitic compacitents CGS. It is possible for a transistor with a field-effect mobility of only 0.1 cm$^2$V$^{-1}$s$^{-1}$ to switch an LC display pixel. The transistor switch must supply a voltage $V_{LC}$ to completely switch on the pixel where the LC pixel behaves as a capacitor with a capacitance, $C_{LC}$. To cater for not overcharging the LC pixel capacitor during the refresh time (T) of a large array (N rows by M columns) display the row duty cycle (T/N) switching requires an optimum current drive level—the transistor On current, $I_{ON}$—that is given by $I_{ON}=6C_{LC}V_{LC}(N/T)$.

There are a number of dynamic characteristics of an LC pixel in an active matrix liquid crystal display (AMLCD) that are important including:
1. Storage time of the signal potential that drives the switching of the LC element
2. Switching time to transfer the signal voltage into the load capacitor via the on-state TTFT
3. Shift in potential that appears just after the gate voltage changes from the on-state to the off-state bias condition as a result of the parasitic capacitance between the gate and source electrodes, $C_{gs}$
4. Delay and distortion of the gate pulse voltage or the gate delay If the resistances of the LC element and the thin film transistor are sufficiently high then a storage capacitor is not needed. However, to achieve adequate levels of storage time, $\tau_{st}$, a storage capacitor is usually employed in the pixel switching circuit.

EXAMPLE

Figure 49:
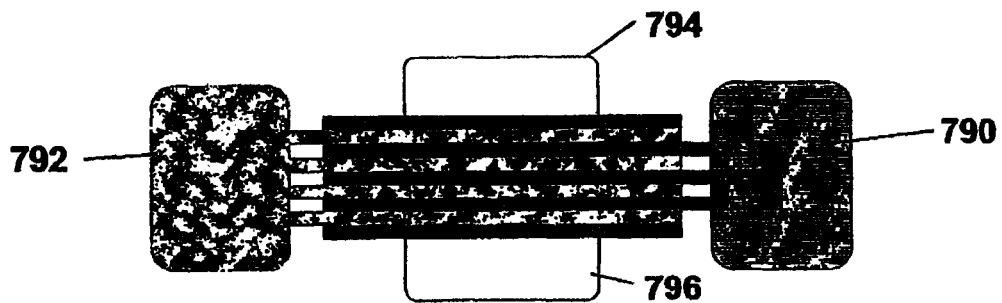
FIG. 49 shows schematically a top view of a structure having a removeable reservoir.
Figure 51:
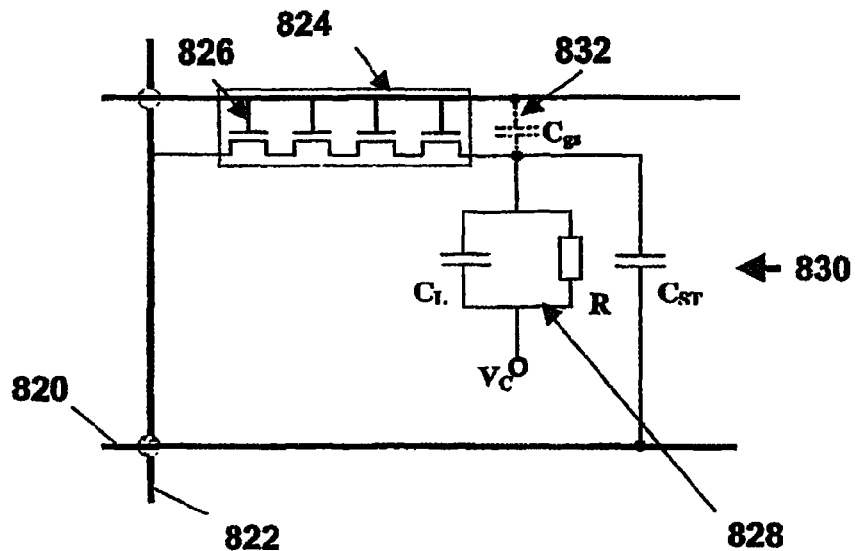
FIG. 51 shows schematically a circuit diagram for a structure.

FIG. 51 shows a single pixel circuit 790 that can be used to switch a high (for this illustration 60 volts but in principle even very high voltages exceeding 200 volts can be supported) voltage liquid crystal display element. The device shown in this illustration is able to switch a high voltage without degrading the transistor performance. Since the transistor switching circuit is transparent it is possible to provide a solution that makes use of a number of thin film transistors that are switched in unison (all at once), using a common connected gate 792 and interlinked drain 794 and source 796 electrodes are shown in FIG. 49.

Figure 50A:
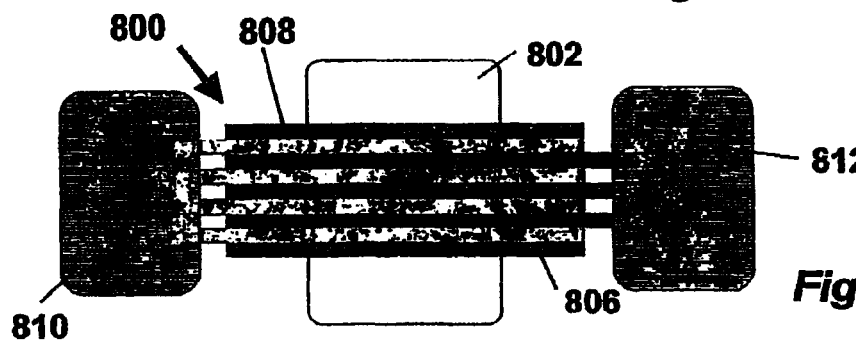
FIG. 50a shows the structure with reservoirs.
Figure 50B:
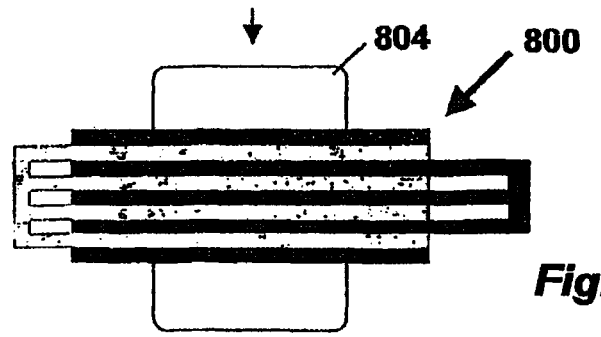
FIG. 50b shows the structure with the reservoirs removed.

An alternative device is shown in FIG. 50. FIG. 50a shows a device 800 before removal of the mask; and FIG. 50b shows the device 800 after the removal of the mask. The device comprises a drain and source contact wells 802, 804 a plurality of interdigitated interlinked gate electrodes 806, the electrodes 806 are interdigitated with an insulator and semi-conductor stack 808. The microfluidic channel filling for gate contact pads 810 and a removable reservoir in a peelable mask containing the insulating semi-conductor materials 812 are both removed when the peelable mask is removed.

Alternatively, the device presented here, and also shown as a circuit schematic in FIG. 51 may provide that a high voltage to be switched can be distributed between a series of transistor devices that are produced as a single device in a single processing sequence.

An alternate design provides for a removable gate contact reservoir.

FIG. 51 comprises a plurality of gate lines 820 and a data line 822. The device comprises a switch 824 comprising 4 transparent thin film resistors 826, a LC element 828 and CST 830 and parasitic capacitance 832 as previously described.

It is envisaged that, in this embodiment, the transistor output current, for the display size and pixel density of interest, will be of order several µA to several mA since the transistor circuit is switching a capacitive liquid crystal pixel. One possible design geometry for the switching transistor, for a large pixel size (say 1 mm square comprising one or more pixels dependent upon whether the display was monochrome, colour, or a hybrid of pixel technologies) commensurate with large area displays, such as electronic and video playback posters, would be a 4 gate structure with a gate length of <50 µm, a channel width of >5 µm, and a semiconductor mobility of >0.1 $cm^2V^{-1}s^{-1}$, which for a suitable selection of gate insulator and drive voltage would provide a suitable transistor output current.

From the design parameters of the transparent thin film transistor as outlined above it is possible to define the geometry of the containment well reservoirs for the multiple gate contacts and the insulator-semiconductor bilayers. Using typical transistor film thicknesses the required gate contact pad and conductive ink reservoir geometry would, for a rectangular shaped (other shapes are possible) reservoir, be a length of say 120 µm, a width of say 100 µm, and a depth of say 2 µm. This provides a total fluid volume capacity of order $24 \times 10^{-15} m^3$ (or 24 picoliters sufficient to hold 2-off 10 picoliter drop even with a drop volume variation of ±10%). The 20 picoliter total drop volume would have a static liquid height, assuming no solvent loss, of 1.67 µm. Since the collective volume needed to provide the necessary gate contacts in the multiple contact structure is of order $20 \times 10^{-15} m^{-3}$, assuming a solid loading of only 5%, the access window that allows the fluid to flow from the reservoir into the microfluidic channels can be limited to depth of order 2 µm from the substrate surface (essentially in-line with the depth of the reservoir). This would allow uniform in-filling of the gate contact microfluidic trenches and the reservoir that after drying/solidification of the conductor containing fluid would produce a suitably distributed gate contact and interconnect contact pad. The contact pad/reservoir being substantially empty after the fluid has dried/solidified provides a catchment/containment well for suitably printed (i.e., digital ink jet) device-to-device and external connection (i.e., to gate bus line, etc.).

A similar argument exists for the removable reservoir that provides the necessary liquid source material for both the insulator and semiconductor layers. In this instance the layer thickness is generally less than the gate contact and as such a single 10 picoliter droplet, for each layer, should be adequate to provide the distributed bilayers being proposed. The insulator—semiconductor fluid reservoir being substantially empty after the fluid has dried/solidified from the first filling, the gate insulating layer, provides a catchment/containment well for the second fluid to provide the semiconducting layer in an aligned structure.

Figure 52A:
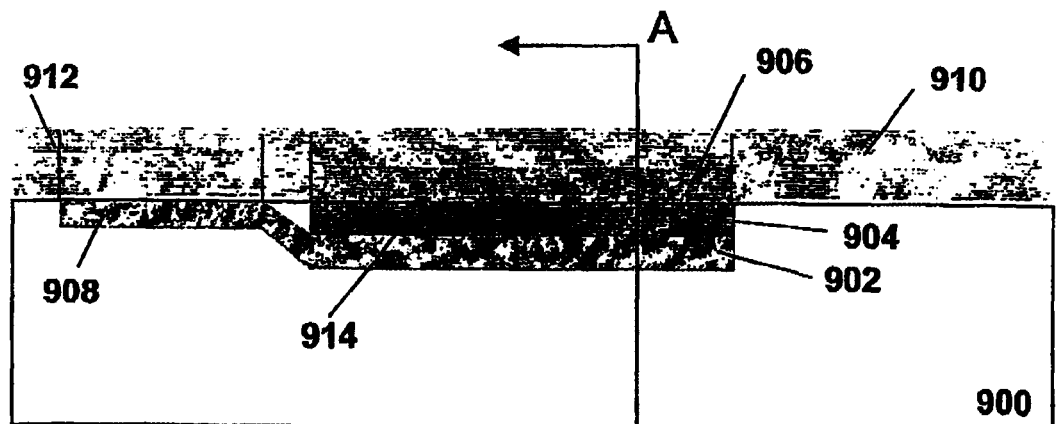
FIG. 52a shows schematically a structure and peelable film with reservoirs.

Such a geometry is shown in FIG. 52. FIG. 52a shows schematically a cross-sectional view of a substrate 900 having a gate bottom contact 902 a gate insulator 904 drain source contacts 906 a gate reservoir 908 and a semi-conductor reservoir 910. A laser etched peelable mask 912 provides access to the gate reservoir and houses the semi-conductor reservoir.

Figure 52B:
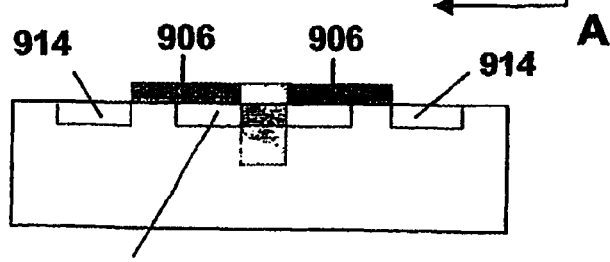

FIG. 52b shows schematically a cross-section across the transparent thin film resistor along the line AA showing embedded ink containment wells 914 and an embedded gate contact interconnection pad 916.

Another important electrical characteristic of liquid crystal (LC) display technology is switching speed. The LC takes time to react to the application or removal of the switching voltage resulting in small delay times associated with the onset of rise and decay. LC's exhibit an exponential increase in viscosity as the operation temperature is reduced resulting in increases in delay times. Such delay times can be reduced by decreasing the LC viscosity or display pixel thickness but for optimum behaviour it would be useful to control the temperature of each LC pixel. Using the method manufacture outlined above in conjunction with a transparent resistor, based on a controlled resistivity of a transparent conducting oxide such as Aluminium-doped ZnO or Indium Tin Oxide (ITO), it would be possible to build a localised heater in each pixel that could be used to control the pixel temperature to a specific operating range.

Applicability

The above outlined manufacturing method for the production of a thin film transistor and related micro- and opto-electronic devices and components, whether opaque, translucent, or transparent in nature, can be achieved using the following material types:
1. Polymers
2. Polymers combined with nanoparticle powder
3. Nanoparticles, rods, wires, flakes, belts, or tubes
4. Direct chemical converting liquids Features of the Processes and Structures Include:
1. The use of a laser etched peelable mask to define the semiconductor film where the liquid containment reservoir is completely contained in the masking film and is removed, along all remaining contents, when the masking film is peeled away from the substrate
2. The use of a laser etched embedded gate contact reservoir that is a permanent feature of the device and serves the secondary purpose of provide a gate contact connection pad 3. The use of laser etching to dissect the ITO land and form the microfluidic channel and the embedded gate electrode
4. The use of a vertically self-aligned thin film transistor structure
5. The use of the dissection of an ITO land of material covered in a masking film with concomitant etched trench in the masking film that aligns directly with the gap etched in the ITO film due to the dissection process
6. The use of multiple gates in a single device build using a common trench fill reservoir (whether reservoir is a permanent or temporary feature of the transistor structure)

Bandgap Alignment

Figure 34:
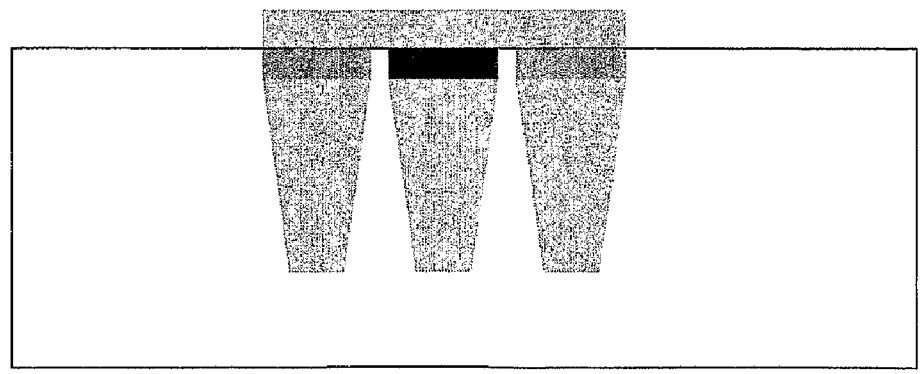
FIG. 34 shows schematically a cross-sectional view of a structure.

FIG. 34 shows schematically a cross-section through deposited elements of a thin film transistor, showing a bandgap alignment layer 402. A bandgap alignment layer allows a relatively high-k (dielectric constant) insulator for a film to be used with a low-k semi-conductor 406 even though the electron band energies of the semi conductor and insulator are such that, without an alignment layer, leakage might occur.

The bandgap alignment layer is preferably made from a material such as silicon dioxide which has a very high bandgap and is an excellent insulator.

We have realised that the basic bandgap selection issue relates to the use of a pair of vertically stacked insulators that form a pair of capacitors in series. This means that the important issue is the (dielectric constant)(thickness) product such that the band gap alignment layer (dielectric constant)(thickness) product is of order 100 times lower in value than the required wide band gap insulating film in order to not influence the overall charge transfer properties of the higher-k material in the bilayer insulating stack. This is as a direct result of the key equation for two capacitors in series, namely:

$$C_{Equivalent} = (\epsilon_0 \epsilon_{SiO_2} A)(\epsilon_{HfO_2} / \{\epsilon_{SiO_2} d_{SiO_2}\} + \{\epsilon_{HfO_2} d_{HfO_2}\}) \ [F\ m^{-1}]$$

For example, a hafnium oxide (HfO$_2$) thin film has a dielectric constant of order 20 and thickness of 50 nm to give a (dielectric constant)×(thickness) product of 1,000 so in order to achieve a 100:1 ratio the (dielectric constant)×(thickness) product of the much wider bandgap silicon dioxide (SiO$_2$) film must be 1,000 divided by 100. In mathematical terms:

$$\epsilon_{SiO_2} d_{SiO_2} \leq 10\ [nm]$$

$$d_{SiO_2} \leq 10/\epsilon_{SiO_2}\ [nm]$$

$$d_{SiO_2} \leq 10/3.4\ [nm]$$

$$d_{SiO_2} \leq 2.94\ [nm]$$

Such a thickness of ultra thin film is readily achievable using any one of the proposed manufacturing methods whilst still providing adequate direct tunnelling leakage current protection due to the drive voltages that might be required to operate this design, particularly when used as a transparent thin film transistor.

The use of a bandgap alignment layer permits a much wider range of gate insulators to be used.

The peelable mask manufacturing method also enables the use of various novel types of apparatus and techniques.

From the above considerations it is possible to use an ultra thin film of a much wider band gap transparent dielectric (such as silicon dioxide with a 9 eV band gap and $\epsilon_{SiO_2}$ of 3.4), even though it has a low-k value, to protect against leakage effects from non-centralised (non-symmetric) charge neutrality level (CNL) alignment thereby permitting a much wider choice of high-k dielectric (such as strontium titanate with a 4 eV band gap and $\epsilon_{SrTiO_3}$ of 100 or more) without recourse to considering conduction and valance band overlap induced leakage in the TTFT design. For strontium titanate a bandgap alignment silicon dioxide film thickness $d_{SiO_2} \leq 14.7$ nm would be required to fulfil the 100:1 ratio.

One of the benefits of the peelable masking manufacturing method is the fact that it is compatible with a multiple layer device build where the layers are vertically aligned and where the layers can be deposited with whole area, selective area, or direct write processing methods using a single mask. This means that the introduction of the bandgap alignment and conduction channel and bulk film growth control insulating layers can be achieved without having to introduce any further masking. This is, therefore, an improvement over a standard build that does not introduce the symmetrically aligned controlling layers and thus provides for a more flexible TTFT manufacturing method that has the potential to produce a much higher quality device at lower cost than conventional TFT manufacture.

Figure 35:
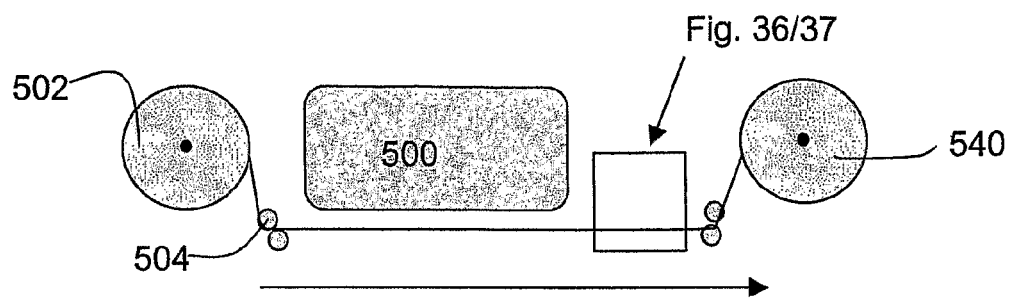
FIG. 35 shows schematically an embodiment of apparatus for roll-to-roll processing.
Figure 36:
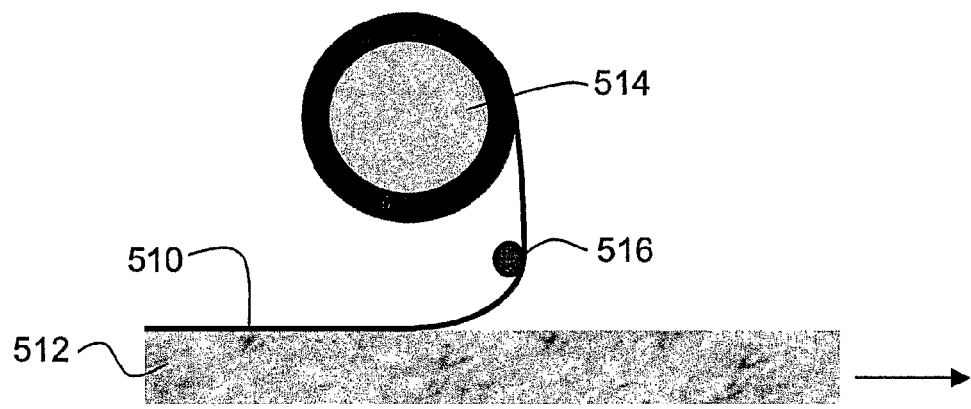
FIGS. 36 and 37 shows schematically embodiments of apparatus for removing a mask.
Figure 37:
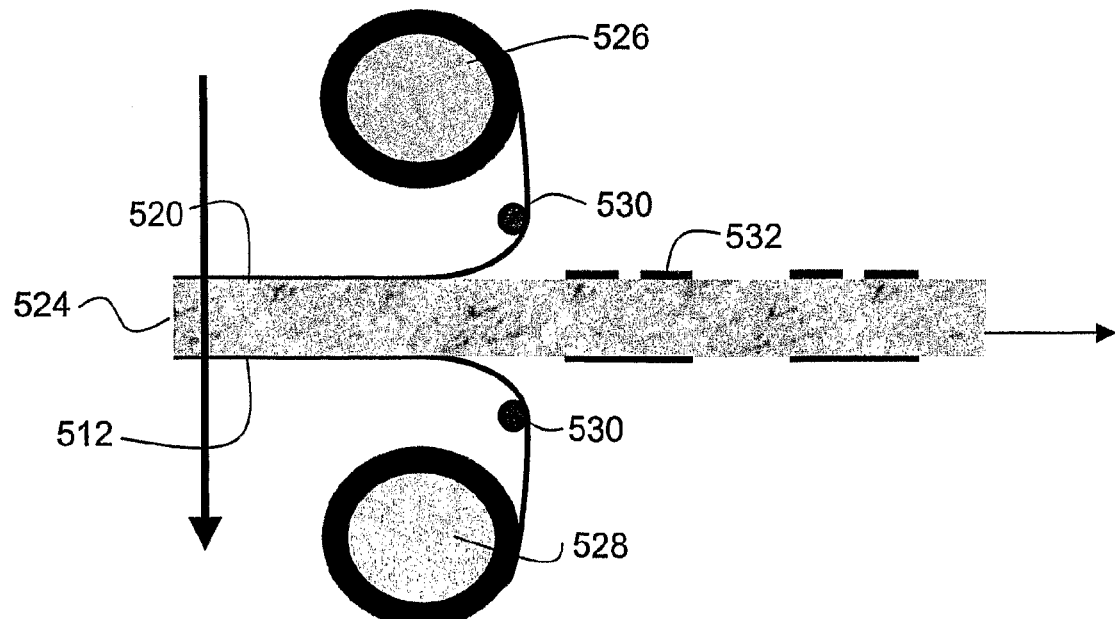

FIGS. 35 to 37 shows schematically an embodiment of apparatus for roll-to-roll processing; and embodiments of apparatus for removing a mask.

Cassette-to-Cassette Manufacturing

There is a conceptual method of manufacturing for "Selectable Interconnect Array Integrated Circuits" (SIA$^{IC}$) production that makes use of cassette-to-cassette processing. The idea is to use a cassette transport system for the roll of substrate material such that the cassette is inserted into a lamination machine. The lamination contains a second roll of masking film and a mechanism that pulls the substrate material out of the inserted cassette and mates with the masking film on to a temporary support take-up roller. The laminated substrate-masking film bilayer is then rewound off the temporary take-up roller back into the cassette casing and on to the take-up roller housed therein.

The cassette is now removed from the lamination system and is then coupled into apparatus such as that shown in FIG. 35. This apparatus includes a processing machine, which may be a multi-cathode magnetron sputtering system 500. A feed cassette 502 stores a bi-layer material comprising a peelable mask and a substrate. This cheap material may be pulled from the cassette passed through secondary rollers 504 and introduced into the sputtering system 500. The masked substrate sheet material is then coated. The coated bilayer material is subsequently dissected as shown in FIG. 31 or FIG. 37. The masking film is peeled away from the substrate sheet material so as to remove the unwanted coating whilst leaving the required coating pattern (in this case peel-off occurs as the roll of coated materials is rewound back onto the carrier roller located in the cassette housing). As shown in FIG. 36, masking film 510 is laminated to a substrate 512 the masking film is wound onto a tape-up roller 514, a secondary roller 516 being used to provide a continuous tension on the film, as the substrate is pulled rightwards as shown in the figure.

FIG. 37 shows a system suitable for peeling a double sided masking film 520, 522 from a substrate 524. Each of the masking films is taken up onto take off rollers 526, 528 tension being maintain by secondary rollers 530 islands of deposited material 532 are left on the substrate 524 as it moves toward the right of the figure. The substrate is then wound onto an output roller 540. This coating patterned substrate sheet film is then rewound off the temporary take-up roller back into the cassette casing and on to the take-up roller housed therein.

Laser processing creates debris as a by-product of the etching process. This can be removed by a close proximity micro vacuum system (not shown) that effectively provides continuous suction at the laser processing point or along a distributed etching area or that is removed using a secondary laser beam or equivalent or differing laser wavelength, pulse rate, and pulse energy density.

Figure 53:
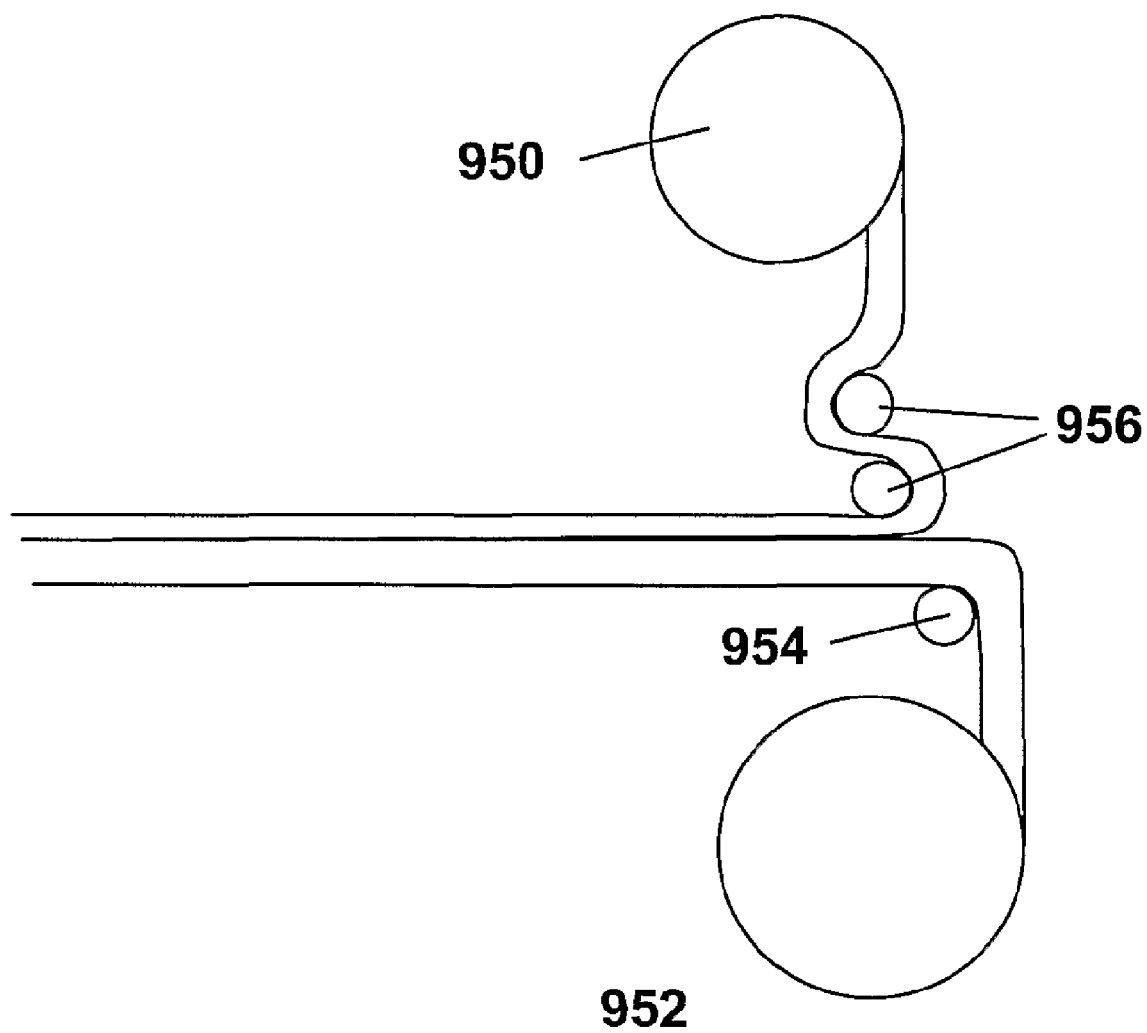
FIG. 53 shows schematically roller apparatus for peeling off a masking film.

A further example of equipment suitable for peeling off the peelable mask in a roller-to-roller system is shown in FIG. 53. The apparatus comprises a collection roller 950 for the mask a treated subject roller 952 for the treated substrate, a tensioned roller 954 to tension the substrate as it is wound onto the treated substrate roller and a plurality of rollers 956 which together comprises a tension and force peel of angle control roller. These rollers may be varied in position to control the take up angle of the peelable film and may be varied in relation to each other to determine the force of peelability.

The roller shown can operate in a forward or reverse direction.

Flat Bed Process

Figure 54:
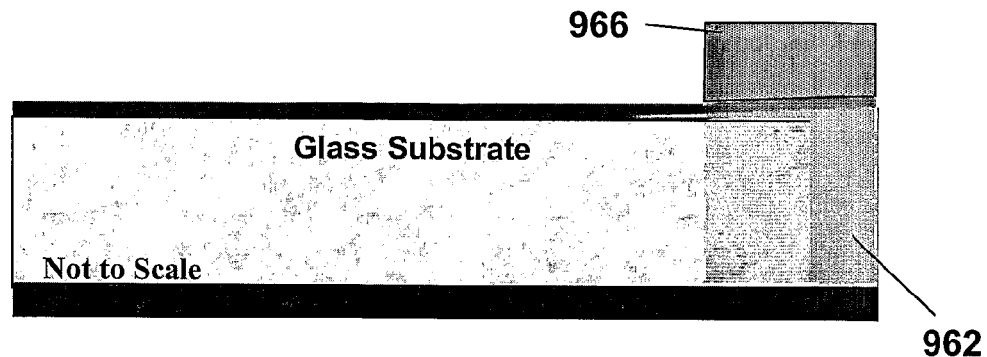
FIG. 54 shows schematically flatbed apparatus for peeling off a thin film.
Figure 55:
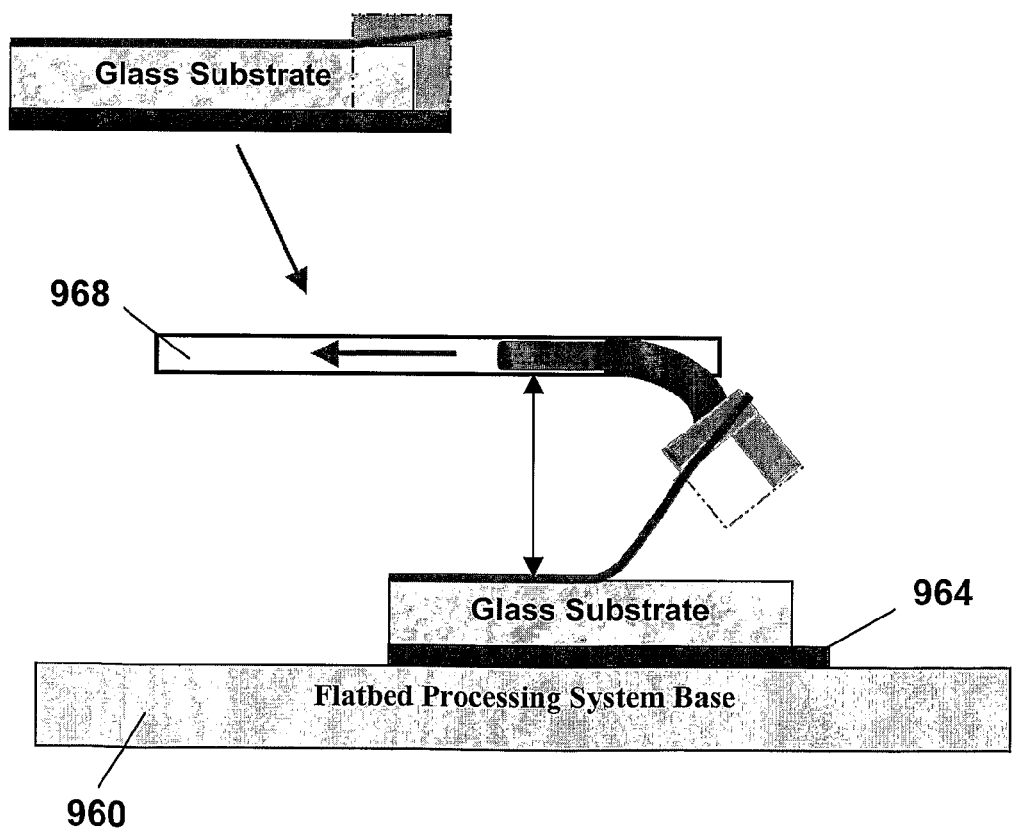
FIG. 55 shows schematically flatbed apparatus for peeling off a thin film.

FIGS. 54 and 55 show schematically apparatus suitable for manufacturing the peelable mask technology on a flatbed process. The apparatus comprises a flatbed processing system base 960 and a mask edge support frame 962. This frame can be integrated onto a demountable substrate holder plate. The apparatus further comprises a peelable masking film edge-supporting frame 966 disposed on top of the mask edge support frame 962.

The rigid substrate is placed into a frame work that includes a lifting bar with a supporting clamp 962 to ensure that the peelable edge of the masking film is included in the masking film lamination process.

A securing edge is supplied over the peelable film lift off edge after the solid film has been laminated or the liquid film has dried to ensure that the peelable edge is removed uniformly and cleanly from the substrate after processing.

The securing edge and a peelable edge locator can be moved with the demount or substrate holder for use on other processing equipment such as whole area spay or digital ink jet printing press.

FIG. 55 shows apparatus for control of a peel off process. An integrated peel off frame 968 is attached to the peelable masking film edge supporting frame 966 and a lateral force causes the peelable mask film etch supporting frame to lift, lifting the peelable film with it, as the peelable film is clamped between the peelable mask frame 966 and the masking edge support frame 962 as hereinbefore described.

The height of the peel off frame 968 in relation to the position of the peelable mask may be altered and appropriate angle height and force or peel off rate set as part of the apparatus control system.

Liquid Mask Manufacturing—Cassette Manufacturing Approach

Given the possibility of only requiring a very thin film for the peelable masking and that such a film could be produced using a precision sprayable or jettable (i.e., digital drop-on-demand ink jet printing) liquid source a method of roll-to-roll manufacture of a wide range of devices and circuits comes to mind based on the use of a transportable universal cassette. This cassette is used with a range of equipment such as the masking film laser etching patterning system and the subsequent thin film deposition multiple target sputter deposition system used to deposit the barrier and transparent conducting oxide bilayer of the transparent thin film transistor that forms one of the inventions of this patent application. This means that the retained roll of material housed in the cassette can be precision aligned with any number of processes that are compatible with the cassette attachment mechanism/system, with such system attachment being used time and time again and having easy transfer/swapping of the contained roller/film assembly.

The concept is based on the fact that upon connection of the cassette to a processing system, such as the masking film laser etching patterning tool, a mechanism located within this system (masking film laser etching patterning tool) exposes the roll of film that is protected by an environment plate/flap/cover and attaches to the roll of polymer film contained in the cassette and begins to pull, it out to prepare it for expose to the laser. As it does so the embedded digital drop-on-demand ink jet printhead array, housed in the cassette assembly, dispenses a thin continuous film of the peelable masking material that dries (air dried or via exposure to integrated IR lamp/LED assembly) as the sheet polymer is pulled further from the roll and prior to being exposed to the laser patterning system. This process continues until the processable area of the roll of material has been coated and laser pattern treated whereupon the digital ink jet printing and IR heating system is switched off and the processed roll including the laser etch patterned masking film are reverse transferred back on to the roller contained within the cassette ready for transfer to another processing station. Once the complete length of processed material is return to the cassette roller a sealing plate/flap/cover is introduced to protect the processed roll of material as it is transported between processing sites.

Liquid Mask Manufacturing—Batch Processing Approach

The liquid precision spray or droplet jetting process can also be used to provide a peelable masking film on to a batch processing substrate surface such as a glass substrate. Even for very large sheets of glass such as 2 meter by 1.5 meter the digital precision droplet dispensing method provides a highly efficient means of producing the masking film. This batch process also opens up the ability to integrate a re-useable peel-off initiation (start) mechanism into the substrate holding frame/base that allows the liquid coating process to include this peel-off feature during the mask deposition thereby ensuring that the masking film peel-off process can be easily, quickly, and accurately achieved during the masking film manufacture.

It is envisaged that for this manufacturing sub-system/system the masking film deposition process, such as digital drop-on-demand ink jet printing, will be integrated directly into the flat-bed laser etching patterning system.

It will be understood that the present invention has been described above purely by way of example, and modifications of detail can be made within the scope of the invention.

Each feature disclosed in the description, and (where appropriate) the claims and drawings may be provided independently or in any appropriate combination.

What is claimed is:

1. A method of manufacturing microstructures comprising:
applying a peelable mask directly onto a substrate;
forming a pattern in the mask;
processing the substrate according to the pattern; and
peeling the mask from the substrate.

2. A method according to claim 1 further comprising applying a further mask or masks to the substrate.

3. A method according to claim 2, in which at least one of the masks is removed by applying a force along a plane substantially parallel to the surface of the substrate.

4. A method according to claim 2 comprising removing portions of at least one of the masks successively from the substrate.

5. A method according to claim 4 comprising starting removal at one side of the substrate, proceeding in a direction generally parallel to a surface of the substrate, and finishing at a far side of the substrate.

6. A method according to claim 1 in which at least one of the mask and the substrate comprises a thin flexible film.

7. A method according to claim 1 comprising laminating the mask to the substrate.

8. A method according to claim 7 in which the mask is in solid, or liquid, form before lamination.

9. A method according to claim 1 comprising unwinding at least one of the substrate and the mask from a roll.

10. A method according to claim 1 in which the pattern formed is such that the mask remains essentially continuously connected after its formation.

11. A method according to claim 10 in which the pattern comprises an array.

12. A method according to claim 1 comprising laser etching the pattern into the mask, wherein the laser wavelength is between infra-red and deep ultra-violet, and the laser is one of an Excimer, a diode pumped YAG, a diode pumped solid state Nd:YVO$_4$ or a Ti:sapphire laser.

13. A method according to claim 12 comprising removing debris from the pattern formation process.

14. A method according to claim 1 comprising etching the substrate.

15. A method according to claim 1 in which processing the substrate comprises depositing material on the substrate or on a feature on the substrate to form a feature or a further feature.

16. A method according to claim 1 in which the mask has a thickness of between 0.1 to 200 μm, conveniently 0.5 to 25 μm preferably substantially less than 10 μm.

17. A method according to claim 1 in which the mask comprises a plurality of layers.

18. A method according to claim 1 in which the mask is made of a polymer, for example a polyethylene terephthalate, a polypropylene, a polyethylene napthalate, a polyethersulphone, or a polyimide.

19. A method according to claim 1 comprising coating an outer surface of the mask with a substance to alter the wettability of the mask.

20. A method according to claim 1 comprising coating the inner surface of the mask with a substance to alter the adhesive bond energy between the mask and the substrate.

21. A method according to claim 1 comprising coating the mask and the substrate with a material by a process comprising one of closed-field magnetron sputtering, closed field unbalanced magnetron sputter ion plating, laser ablation, ion beam sputtering, ion beam assisted deposition, vacuum arc, multiple arc, electron beam evaporation, atomic layer epitaxy, molecular beam epitaxy, chemical vapour deposition, electron cyclotron resonance chemical vapour deposition, plasma enhanced chemical vapour deposition, laser dry transfer printing pulsed magnetron sputtering, pulsed biased magnetron sputtering, electrostatic spraying, electrostatically assisted spray jetting, or electrostatic spray assisted vapour deposition.

22. A method according to claim 1, further comprising forming on a common substrate an array of isolated semiconductor devices.

23. A method according to claim 1, wherein the pattern is formed in the mask after the mask is applied to the substrate.

* * * * *